(12) United States Patent
Takaya et al.

(10) Patent No.: US 7,060,350 B2
(45) Date of Patent: Jun. 13, 2006

(54) COMPOSITE MAGNETIC MATERIAL AND MAGNETIC MOLDING MATERIAL, MAGNETIC POWDER COMPRESSION MOLDING MATERIAL, AND MAGNETIC PAINT USING THE COMPOSITE MAGNETIC MATERIAL, COMPOSITE DIELECTRIC MATERIAL AND MOLDING MATERIAL, POWDER COMPRESSION MOLDING MATERIAL, PAINT, PREPREG, AND SUBSTRATE USING THE COMPOSITE DIELECTRIC MATERIAL, AND ELECTRONIC PART

(75) Inventors: Minoru Takaya, Tokyo (JP); Yoshiaki Akachi, Tokyo (JP); Hisashi Kobuke, Tokyo (JP); Toshikazu Endo, Tokyo (JP)

(73) Assignee: TDK Corporation, Tokyo (JP)

( * ) Notice: Subject to any disclaimer, the term of this patent is extended or adjusted under 35 U.S.C. 154(b) by 701 days.

(21) Appl. No.: 09/749,800

(22) Filed: Dec. 28, 2000

(65) Prior Publication Data
US 2002/0039667 A1 Apr. 4, 2002

(30) Foreign Application Priority Data
Apr. 27, 2000 (JP) ........................ 2000-128283
Apr. 27, 2000 (JP) ........................ 2000-128291
May 29, 2000 (JP) ........................ 2000-158062

(51) Int. Cl.
*B32B 5/16* (2006.01)

(52) U.S. Cl. ................ 428/323; 428/325; 428/328; 428/329; 428/331; 428/403; 428/404; 428/407; 428/654 BA

(58) Field of Classification Search ............ 428/323, 428/325, 328, 329, 331, 403, 404, 407, 694 BA, 428/402
See application file for complete search history.

(56) References Cited

U.S. PATENT DOCUMENTS

| 3,855,016 | A | * | 12/1974 | Ehreich et al. ............. 148/311 |
| 3,993,626 | A | | 11/1976 | Laurito |
| 4,226,843 | A | * | 10/1980 | Watanabe et al. ........ 423/594.2 |
| 4,390,361 | A | * | 6/1983 | Sueyoshi et al. ........... 428/570 |
| 4,464,196 | A | * | 8/1984 | French ........................ 420/87 |
| 4,927,456 | A | * | 5/1990 | Kopatz et al. ................ 75/346 |
| 4,972,233 | A | * | 11/1990 | Yamazaki et al. ......... 399/347 |
| 5,078,085 | A | * | 1/1992 | Fuji et al. ................... 399/236 |
| 5,240,803 | A | * | 8/1993 | Ota ........................ 430/108.3 |
| 5,470,374 | A | * | 11/1995 | Nakamura et al. ............ 75/348 |
| 5,470,400 | A | | 11/1995 | Bogatin et al. |

FOREIGN PATENT DOCUMENTS

| DE | 25 01 843 | | 6/1976 |
| EP | 0 383 035 | | 8/1990 |
| EP | 08078798 | * | 9/1994 |
| EP | 0 878 984 | | 11/1998 |
| GB | 1 246 829 | | 9/1971 |
| JP | 6-14600 | | 2/1994 |
| JP | 6-204021 | | 7/1994 |
| JP | 8-36712 | | 3/1996 |
| JP | 8-69712 | | 3/1996 |
| JP | 8-78798 | | 3/1996 |
| JP | 10-270255 | | 10/1998 |
| JP | 11-192620 | | 7/1999 |

OTHER PUBLICATIONS

G. Viau, et al., Journal of Applied Physics, vol. 76, No. 10, Part 2, XP-000508787, pp. 6570–6572, "Preparation And Microwave Characterization of Spherical And Monodisperse $Co_{20}Nl_{80}$ Particles", Nov. 15, 1994.

* cited by examiner

*Primary Examiner*—Ieszek B Kiliman
(74) *Attorney, Agent, or Firm*—Oblon, Spivak, McClelland, Maier & Neustadt, P.C.

(57) ABSTRACT

A composite magnetic material including a resin and generally spherical magnetic metal particles of at least one type dispersed in the resin and consisting essentially of single crystal grains, the metal particles having a mean particle size of 0.1 to 10 μm and each having an insulating coating layer at least partially coated thereon.

31 Claims, 61 Drawing Sheets

FIG. 6

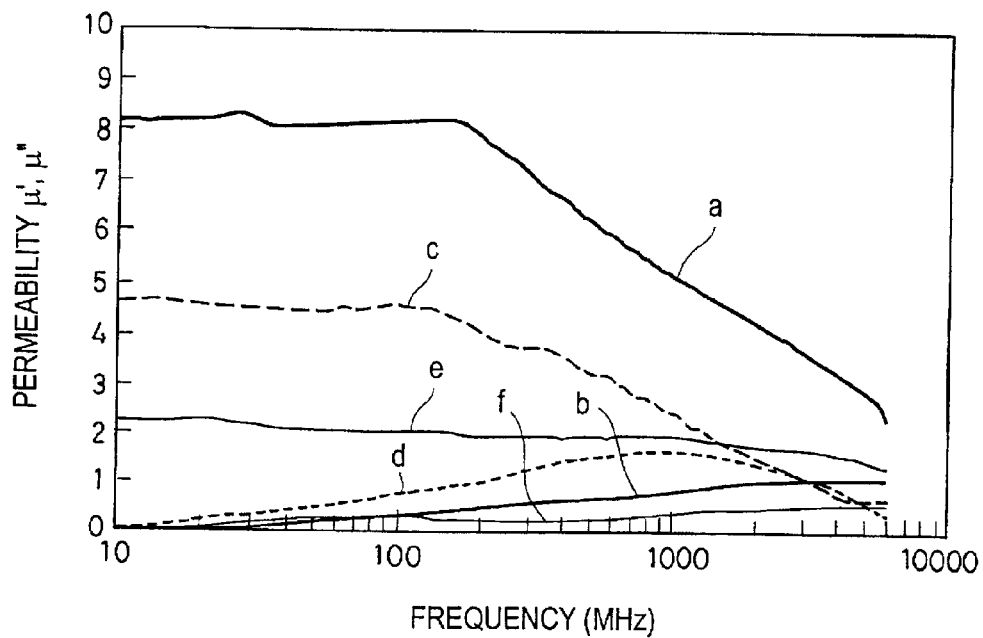

a: INVENTION, $\mu'$
BARIUM TITANATE-COATED IRON POWDER COMPOSITE MATERIAL b: INVENTION, $\mu''$
BARIUM TITANATE-COATED IRON POWDER COMPOSITE MATERIAL c: COMPARISON 1, $\mu'$
HIGH-PERMEABILITY FERRITE COMPOSITE MATERIAL d: COMPARISON 1, $\mu''$
HIGH-PERMEABILITY FERRITE COMPOSITE MATERIAL e: COMPARISON 2, $\mu'$
LOW-PERMEABILITY FERRITE COMPOSITE MATERIAL f: COMPARISON 2, $\mu''$
LOW-PERMEABILITY FERRITE COMPOSITE MATERIAL a: INVENTION, $\mu'$
   GLASS-COATED IRON POWDER COMPOSITE MATERIAL b: INVENTION, $\mu''$
   GLASS-COATED IRON POWDER COMPOSITE MATERIAL c: COMPARISON 1, $\mu'$
   HIGH-PERMEABILITY FERRITE COMPOSITE MATERIAL d: COMPARISON 1, $\mu''$
   HIGH-PERMEABILITY FERRITE COMPOSITE MATERIAL

FIG. 47
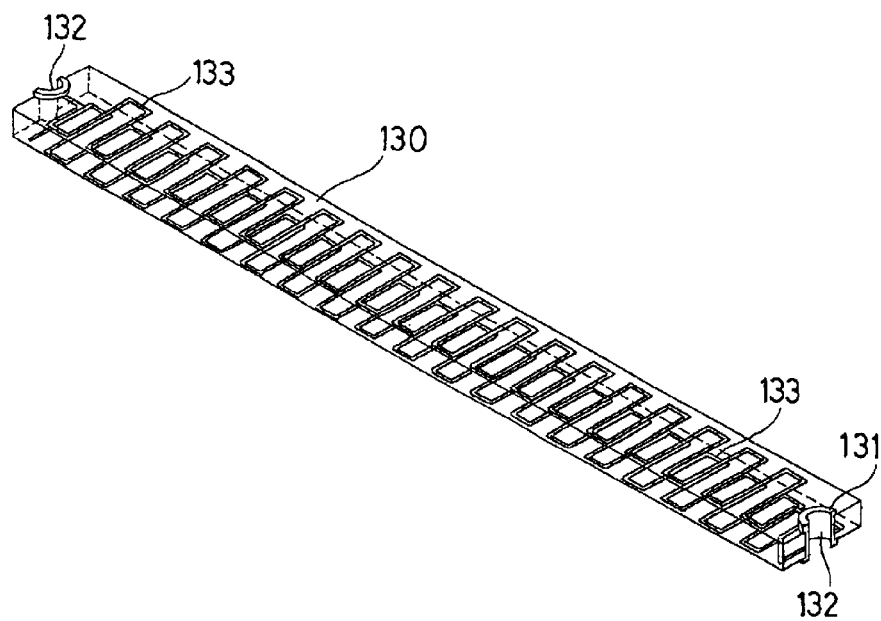
FIG. 48A
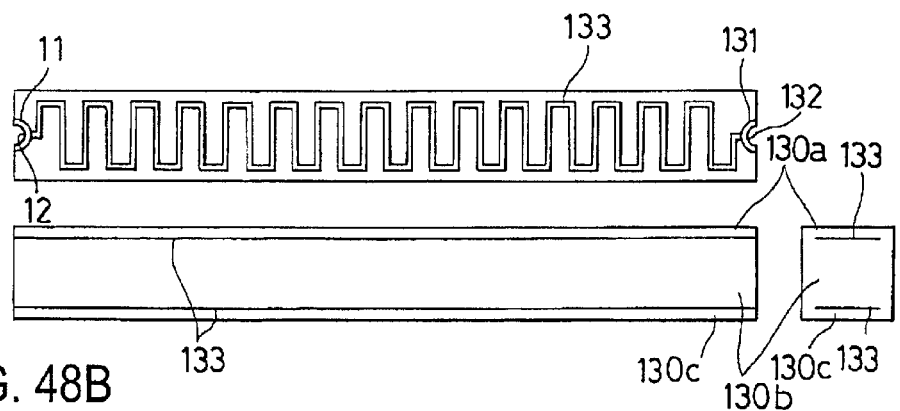
FIG. 48B
FIG. 48C

FIG. 81A
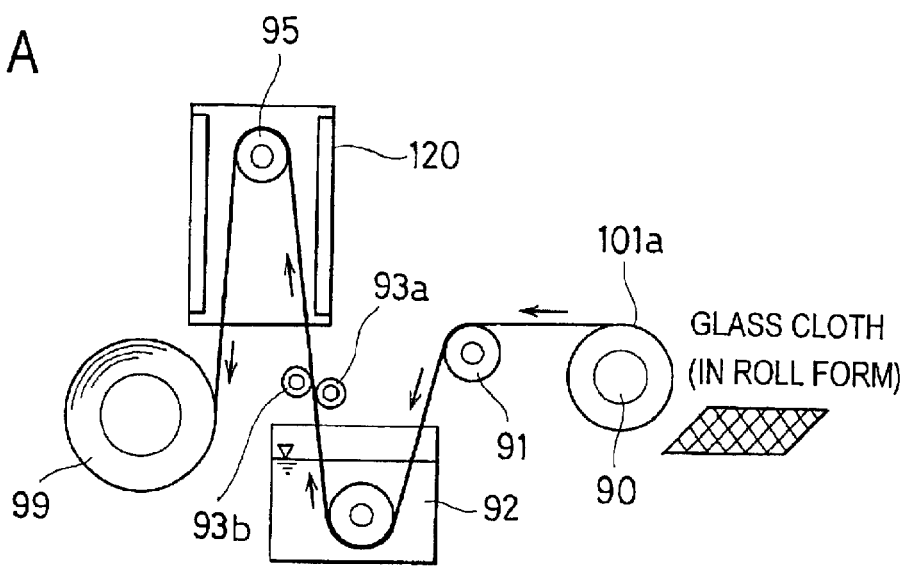
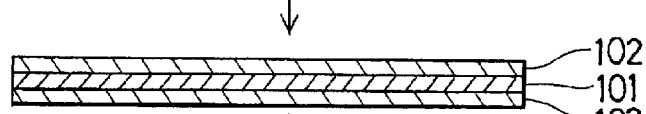
FIG. 81B
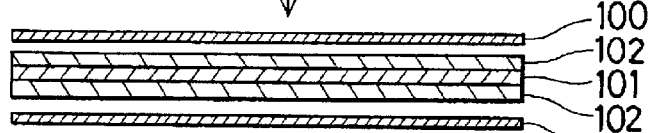
FIG. 81C
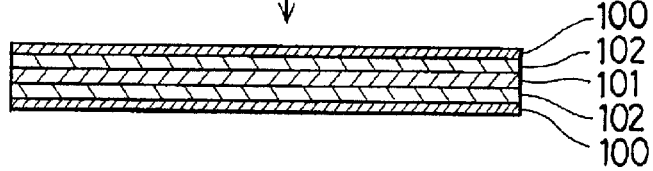
FIG. 81D

COMPOSITE MAGNETIC MATERIAL AND MAGNETIC MOLDING MATERIAL, MAGNETIC POWDER COMPRESSION MOLDING MATERIAL, AND MAGNETIC PAINT USING THE COMPOSITE MAGNETIC MATERIAL, COMPOSITE DIELECTRIC MATERIAL AND MOLDING MATERIAL, POWDER COMPRESSION MOLDING MATERIAL, PAINT, PREPREG, AND SUBSTRATE USING THE COMPOSITE DIELECTRIC MATERIAL, AND ELECTRONIC PART

This invention relates to a composite magnetic material comprising metal particles coated with an insulating layer and a matrix or resin, and a magnetic molding material, magnetic powder compression molding material, magnetic paint, prepreg, and magnetic substrate using the same. It also relates to a composite dielectric material, and a molding material and powder compression molding material using the same for molding capacitors, piezoelectric devices, thermistors, and varistors, a paint using the same for use as a printing paste or casting material, a prepreg and substrate using the same. It further relates to a multilayer electronic part using the prepreg or substrate or an electronic part to be fabricated by a casting, molding or other technique, and more particularly, to an electronic part for use in an application utilizing dielectric or magnetic properties or as a magnetic shield.

BACKGROUND OF THE INVENTION

One prior art composite magnetic material used as the magnetic material for multilayer electronic parts is ferrite powder having a mean particle size of several hundreds of nanometers to several tens of micrometers mixed and dispersed in an organic material (see Japanese Patent Application No. 9-76341). The composite magnetic material is applied to glass cloth to form a prepreg, and a copper foil is clad to the prepreg to yield a copper-clad laminate. By forming a desired pattern on this laminate, an inductance device having improved high-frequency characteristics is obtained.

Known materials for multilayer substrates or magnetic substrates using prepreg include magnetic metal particles mixed and dispersed in resins (see JP-A 8-78798 and JP-A 10-79593). Also JP-A 8-204486 discloses a composite magnetic material having spherical iron carbonyl dispersed in a resin.

A molding material using a composite magnetic material is disclosed in JP-A 7-235410 as comprising spherical iron particles having a mean particle size of about 50 µm which are surface insulated and bound in a resin, the material being used as the core of motors and transformers.

An electromagnetic shield material is described in Journal of Applied Magnetic Society, Vol. 22, No. 4-2, 1998, pp. 885–888, as comprising magnetic metal particles of a small size. The material keeps a higher complex permeability even to higher frequencies than cubic ferrite and is expected to have a shielding effect even at higher frequencies.

However, composite magnetic materials comprising magnetic metal particles except for ferrite and resins are low in insulation and have a greater imaginary part of complex permeability (the imaginary part becomes greater with higher electroconductivity) which impedes attenuation. An attempt was made to treat magnetic metal particles with a coupling agent for enhancing insulation.

Of prior art materials for use as molding materials for high-frequency electronic parts (molding materials adapted for transfer molding and injection molding), casting materials (liquid materials adapted for casting by potting), paints such as printing paste, powder compression molding materials (material to be molded by compression), prepreg and substrates, one example is illustrated in FIG. 87A as a composite dielectric material 232 comprising a powder of dielectric particles 230 adjusted to a particle size of several hundreds of nanometers to several tens of micrometers dispersed in a resin 231. When this composite dielectric material 232 is used in a laminate substrate, for example, as shown in FIG. 87B, the composite dielectric material 232 is applied to a glass cloth 233 for impregnation, forming a prepreg 234 as an intermediate product to the laminate substrate. Copper foils are clad to the prepreg to form a laminate, on which a desired conductor pattern is formed by a printed circuit board manufacturing process. The dielectric powder used in this composite dielectric material is obtained by firing a powder or grinding a sintered dielectric material. The properties of the sintered dielectric used herein are selected by taking into account a dielectric constant and tan $\delta$ since they are closely correlated to the properties of the finally finished composite dielectric material.

An electronic part such as a capacitor or piezoelectric device is constructed as shown in FIG. 87C by bonding external electrodes 235 to opposite surfaces of the composite dielectric material 232.

Regarding Glass Cloth-loaded Prepreg and Copper-clad Magnetic Substrate (a) When an inductance device is fabricated using a composite magnetic copper-clad substrate comprising a ferrite powder mixed and dispersed in an organic material, the use of a high permeability ferrite powder tends to exacerbate high-frequency characteristics, and inversely, the use of a low permeability ferrite powder ensures good high-frequency characteristics, but fails, of course, to provide a sufficient permeability. Satisfactory characteristics are not available in either case.

(b) When a metal magnetic material, for example, iron carbonyl is used instead of the ferrite powder, there is obtained a composite magnetic substrate having a relatively high permeability and good high-frequency characteristics, but poor insulation. The poor insulation of a fired body (composite magnetic material) gives rise to the inconvenient problem in the copper foil patterning step that a plating metal can deposit on areas outside patterned sections, causing short-circuits between patterned sections. When silicon iron is used instead, there is obtained a composite magnetic substrate which has a high permeability and saturation magnetic flux density, but suffers from problems including prohibited use in the high-frequency region and poor insulation.

Regarding Magnetic Molding Material (1) Sheet Forming Material (a) A shield member, which is obtained by mixing and dispersing a soft magnetic metal powder such as iron carbonyl or silicon iron in a resin and molding the mixture into a sheet, can have a volume resistivity of $10^7$ Ω-cm if the metal powder is subjected to coupling treatment or oxidation on the surface. However, the withstanding voltage is only about 150 V at a thickness of 1.0 mm. Then the member is not regarded as electrically insulating upon application of a voltage, with a potential of electrical short-circuiting.

(b) A shield member having ferrite powder dispersed therein instead of the soft magnetic metal powder such as iron carbonyl or silicon iron has a high volume resistivity and substantially eliminates the potential of electrical short-circuiting. However, it is not only ineffective for electric field shielding, but also less effective for magnetic shielding on the low-frequency side.

(2) Molding Material

As a countermeasure for radiant noise of a printed circuit board having parts mounted thereon, it is customary to mold a molding material over the part-mounting surface so that the composite magnetic material having ferrite mixed with a resin may cover the parts entirely.

The molding material having ferrite powder dispersed therein is not only ineffective for electric field shielding, but also less effective for magnetic shielding on the low-frequency side. The molding material having a soft magnetic metal powder such as iron carbonyl or silicon iron dispersed therein has an increased shielding effect, but is less insulating, inviting performance defects due to the poor insulation between patterns on the circuit board.

(3) Composite Magnetic Core Material

Composite magnetic materials for use as the core of choke coils and transformers include ferrite particles having a mean particle size of several hundreds of nanometers to several tens of micrometers or magnetic metal particles surface treated for insulation dispersed in resinous materials such as liquid crystal polymers, PPS resins and epoxy resins. The materials are molded into the desired shape to serve as a magnetic core. The core having ferrite dispersed therein is difficult to use in a high current, high power application because its saturation magnetic flux density is low. The core using magnetic metal material provides insufficient insulation, leaving a reliability problem.

Regarding Magnetic Paint

For the application to form a magnetic circuit in a reactance device or to paint to form a magnetic shield, it is customary to form a composite magnetic film by mixing and dispersing ferrite in a resin and solvent to form a printing paste and applying the paste by screen printing. The composite magnetic material using ferrite fails to provide a sufficient permeability and saturation magnetic flux density and encounters difficulty on practical use. The use of magnetic metal powder instead of ferrite is also customary, but provides insufficient insulation, resulting in reactance devices having poor properties and a failure by electrical short-circuit with the surrounding metal at the shield surface.

Regarding Magnetic Powder Compression Molding Material

For preparing a composite magnetic material with high loading of magnetic metal powder, it is customary to mix the magnetic powder with several weight percents of a resin such as an epoxy resin and mold the mixture under heat and pressure. However, since sufficient insulation is not insured, the metal surface is oxidized or otherwise treated. Nevertheless, such treatment is not satisfactory. The withstanding voltage is below the practical level. Additionally, the oxide film is so weak that if the molding method entails application of a high pressure upon molding, it can be broken under the applied pressure. It is thus difficult to derive the full advantages of the oxide film.

Regarding Prior Art Composite Dielectric Material

In the case of the electronic part constructed of a prior art composite dielectric material as illustrated in FIG. 87C, dielectric particles 230 of a distinct material exist dispersed in the resin 231 between the external electrodes 235 and 235. Here the resultant dielectric constant is determined by a volume ratio of these two materials.

FIG. 88A illustrates measurements of resultant dielectric constant ($\epsilon$) of materials in which a dielectric powder having a dielectric constant ($\epsilon$) of 9,000 or a dielectric powder having a dielectric constant ($\epsilon$) of 90 is dispersed in an epoxy resin in varying amounts.

As seen from FIG. 88A, the material having 60 vol % of the dielectric powder having a dielectric constant of 9,000 dispersed in the epoxy resin has a resultant dielectric constant of about 40, which is reduced to about $\frac{1}{200}$ of the dielectric powder's dielectric constant, indicating that mixing a dielectric material having a high dielectric constant does not provide a so high dielectric constant. In this regard, for the material having the powder with a dielectric constant of 90 dispersed in the epoxy resin, the resultant dielectric constant at a power content of 60 vol % is about 20, which is reduced to about $\frac{1}{5}$. Also, the material having 40 vol % of the powder having a dielectric constant of 9,000 dispersed in the epoxy resin has a resultant dielectric constant of about 15, and the material having 40 vol % of the dielectric powder having a dielectric constant of 90 dispersed in the epoxy resin has a resultant dielectric constant of about 12, with no significant difference being ascertained therebetween.

By diluting the composite dielectric materials with a solvent, and impregnating glass cloths therewith, double sided copper-clad substrates were prepared for examining the relationship of dielectric constant to the powder content, with the results shown in FIG. 88B. As seen from FIG. 88B, when the glass cloth is impregnated with the composite dielectric material, the difference in dielectric constant of the dispersed powder does not manifest in the composite dielectric material as in the absence of glass cloth. This is because the volume fraction for which glass cloth accounts in the substrate becomes non-negligible so that the glass cloth having a dielectric constant of 7.0 has an influence on the resultant dielectric constant which is otherwise determined by the volume fraction.

As seen from the above, at least 60 vol % of the powder having a dielectric constant of 9,000 must be dispersed in order to provide conventional composite dielectric materials with a high dielectric constant. However, in order to form a thin substrate, the content of the composite dielectric material must be 50 vol % or less when adhesion with copper foil and delamination are taken into account. Then, even though an expensive dielectric powder is mixed, a significant improvement in dielectric constant is not achievable. Since the dielectric powder is previously obtained by grinding sintered dielectrics, such particles have bosses and recesses and a large particle size and are thus less dispersible, rendering it difficult to stabilize the properties of electronic parts (e.g., thin gage capacitors and piezoelectric devices) and substrates.

Regarding Electronic Part Using Dielectric Material

In the case of electronic parts constructed using conventional composite dielectric materials, dielectric particles of a distinct material exist dispersed in the resin between the external electrodes. Here the resultant dielectric constant is determined by a volume ratio of these two materials.

Mixing a dielectric material having a high dielectric constant does not provide a so high dielectric constant. For instance, for the material having a powder with a dielectric constant of 90 dispersed in an epoxy resin, the resultant dielectric constant at a power content of 60 vol % is about 20, which is reduced to about $\frac{1}{5}$ of the original. Also, the material having 40 vol % of a powder having a dielectric constant of 9,000 dispersed in an epoxy resin has a resultant dielectric constant of about 15, and the material having 40 vol % of a powder having a dielectric constant of 90 dispersed in an epoxy resin has a resultant dielectric constant of about 12, with no significant difference being ascertained therebetween.

When glass cloth is impregnated with a composite dielectric material, the difference in dielectric constant of the dispersed powder does not manifest in the composite dielectric material as in the absence of glass cloth. This is because the volume fraction for which glass cloth accounts in the substrate becomes non-negligible so that the glass cloth having a dielectric constant of 7.0 has an influence on the resultant dielectric constant which is otherwise determined by the volume fraction.

As seen from the above, at least 60 vol % of the powder having a dielectric constant of 9,000 must be dispersed in order to provide conventional composite dielectric materials with a high dielectric constant. However, in order to form a thin substrate, the content of the composite dielectric material must be 50 vol % or less when adhesion with copper foil and delamination are taken into account. Then, even though an expensive dielectric powder is mixed, a significant improvement in dielectric constant is not achievable. Since the dielectric powder is previously obtained by grinding sintered dielectrics, such particles have bosses and recesses and a large particle size and are thus less dispersible, rendering it difficult to stabilize the properties of electronic parts (e.g., thin gage capacitors and piezoelectric devices) and substrates.

Regarding Electronic Part Using Glass Cloth-loaded Prepreg and Copper-clad Magnetic Substrate (a) When an inductance device is fabricated using a composite magnetic copper-clad substrate comprising a ferrite powder mixed and dispersed in an organic material, the use of a high permeability ferrite powder tends to exacerbate high-frequency characteristics, and inversely, the use of a low permeability ferrite powder ensures good high-frequency characteristics, but fails, of course, to provide a sufficient permeability. Satisfactory characteristics are not available in either case.

(b) When a metal magnetic material, for example, iron carbonyl is used instead of the ferrite powder, there is obtained a composite magnetic substrate having a relatively high permeability and good high-frequency characteristics, but poor insulation. The poor insulation of a fired body (composite magnetic material) gives rise to the inconvenient problem in the copper foil patterning step that a plating metal can deposit on areas outside patterned sections, causing short-circuits between patterned sections. When silicon iron is used instead, there is obtained a composite magnetic substrate which has a high permeability and saturation magnetic flux density, but suffers from problems including prohibited use in the high-frequency region and poor insulation.

Regarding Electronic Part Using Magnetic Molding Material (1) Sheet Forming Material (a) A shield member, which is obtained by mixing and dispersing a soft magnetic metal powder such as iron carbonyl or silicon iron in a resin and molding the mixture into a sheet, can have a volume resistivity of $10^7$ Ω-cm if the metal powder is subjected to coupling treatment or oxidation on the surface. However, the withstanding voltage is only about 150 V at a thickness of 1.0 mm. Then the member is not regarded as electrically insulating upon application of a voltage, with a potential of electrical short-circuiting.

(b) A shield member having ferrite powder dispersed therein instead of the soft magnetic metal powder such as iron carbonyl or silicon iron has a high volume resistivity and substantially eliminates the potential of electrical short-circuiting. However, it is not only ineffective for electric field shielding, but also less effective for magnetic shielding on the low-frequency side.

(2) Molding Material

As a countermeasure for radiant noise of a printed circuit board having parts mounted thereon, it is customary to mold a molding material over the part-mounting surface so that the composite magnetic material having ferrite mixed with a resin may cover the parts entirely. The molding material having ferrite powder dispersed therein is not only ineffective for electric field shielding, but also less effective for magnetic shielding on the low-frequency side. The molding material having a soft magnetic metal powder such as iron carbonyl or silicon iron dispersed therein has an increased shielding effect, but is less insulating, inviting performance defects due to the poor insulation between patterns on the circuit board.

(3) Composite Magnetic Core Material

Composite magnetic materials for use as the core of choke coils and transformers include ferrite particles having a mean particle size of several hundreds of nanometers to several tens of micrometers or magnetic metal particles surface treated for insulation dispersed in resinous materials such as liquid crystal polymers, PPS resins and epoxy resins. The materials are molded into the desired shape to serve as a magnetic core. The core having ferrite dispersed therein is difficult to use in a high current, high power application because its saturation magnetic flux density is low. The core using magnetic metal material provides insufficient insulation, leaving a reliability problem.

An object of the invention is to provide a composite magnetic material which is highly electrically insulating, easy to work in preparing a molding material having a high saturated magnetic flux density, free of a corrosion problem, and has improved high-frequency characteristics and withstanding voltage as well as a magnetic molding material, magnetic powder compression molding material, magnetic paint, prepreg, and magnetic substrate using the same.

Another object of the invention is to provide a composite dielectric material comprising effectively dispersible particles, which is readily formulated to provide desired characteristics and suitable for the fabrication of thin gage electronic parts as well as a molding material, powder compression molding material, paint such as a printing paste or casting material, prepreg and substrate using the same.

A further object of the invention is to provide a composite dielectric material which exhibits a high dielectric constant even at a low content of dielectric and requires a low material cost as well as a molding material, powder compression molding material, paint such as a printing paste or casting material, prepreg and substrate using the same.

A yet further object of the invention is to provide an electronic part which is constructed by a material comprising effectively dispersible particles so that desired characteristics and a size reduction are achievable.

A yet further object of the invention is to provide an electronic part which is highly insulating, pressure resistant and free of a corrosion problem, and has improved high-frequency characteristics.

SUMMARY OF THE INVENTION

In a first aspect, the invention provides a composite magnetic material comprising generally spherical magnetic metal particles of at least one type consisting essentially of single crystal grains, having a mean particle size of 0.1 to 10 μm and coated over at least a part of their surface with an insulating layer. The coated metal particles are dispersed in a resin.

Such generally spherical metal particles consisting essentially of single crystal grains, having a small particle size and surface coated with an insulating layer can be prepared by a spray pyrolysis process as described in JP-B 3-68484. The spray pyrolysis process involves spraying a solution of a metal salt into droplets, and heating the droplets in air at a temperature higher than the decomposition temperature of the metal salt and the melting point of the metal, thereby forming a metal powder. When it is desired to form an insulating layer on surfaces of metal particles, a solution in which an insulator-forming compound such as a salt is dissolved along with the metal salt is sprayed and heated, the heating being at a higher temperature than the decomposition temperature of the insulator-forming compound. In this way, generally spherical metal particles consisting essentially of single crystal grains are formed while an insulating layer is formed on their surface at the same time.

The ground accounting for the metal particles consisting essentially of single crystal grains is their diffraction image of electron diffraction analysis using a transmission electron microscope where high crystallinity is ascertained.

The insulator-coated metal particles are effectively mixed and dispersed in a resin because they are spherical and small sized as compared with prior art ferrite particles in the form of fragments or blocks having bosses and recesses which are obtained by grinding ferrite. When such coated metal particles are dispersed in a resin, the insulating layer even at a low coating weight of 1% by weight based on the metal particles contributes to an improvement in insulation resistance and withstanding voltage.

Even in the composite magnetic material, the coated metal particles maintain their original shape prior to mixing into the composite magnetic material, and the overlying insulating layer is kept coated without rupture. This is one factor contributing to an improvement in withstanding voltage. Also, since metal particles are coated on their surface with the insulating layer, the problem of corrosion or rust generation is eliminated.

When the particles are formed by the spray pyrolysis process, their size has a lower limit of about 0.05 μm and an upper limit of about 20 μm. Most often, the powder is a grouping of particles having a mean particle size of about 0.1 to 10 μm in which particles having a size of 0.05 to 20 μm account for about 95% by weight.

Since the particles are reduced in size and surface coated with an insulator as mentioned above, the composite magnetic material, though the metal particles are incorporated therein, has a reduced eddy current loss, which is one of losses associated with magnetic materials, and improved high-frequency characteristics. Because of the reduced size, the fabrication of thin gage electronic parts is enabled.

Since the metal is an essentially single crystal magnetic metal, the composite magnetic material is suited for magnetic substrates, electromagnetic shield members, magnetic cores in choke coils or the like, molding materials, and plastic magnets where magnetism is requisite.

In one preferred embodiment of the composite magnetic material of the first aspect, the insulating layer has a thickness of 0.005 to 5 μm. The insulating layer of at least 0.005 μm thick can contribute to improvements in dielectric constant, insulation and withstanding voltage. Beyond 5 μm, it would become difficult to form the insulating layer as a uniform film.

The term "thickness" used herein designates the maximum thickness of the coating. The coating need not necessarily cover the entire surface of a metal particle and it suffices that the coating covers about 50% of the surface of a metal particle.

In a further preferred embodiment of the composite magnetic material of the first aspect, 30 to 98% by weight of the coated metal particles are dispersed in the resin. If the content of the coated metal particles is less than 30 wt %, the magnetic properties would become short as a magnetic body, shield or molding material. If the content of the coated metal particles is more than 98 wt %, the composite magnetic material would become difficult to mold and practically unacceptable.

Also provided herein is a magnetic molding material comprising the composite magnetic material of the first aspect including its preferred embodiments. By virtue of the coating of microscopic magnetic metal particles with the insulating layer, the material has a high insulation resistance and withstanding voltage. Since the need for insulating treatment is eliminated, the magnetic molding material, when used in the shield and mold material applications, can be combined with another member without a need for insulating treatment, with the advantage that the structure is simplified. In the case of magnetic cores in choke coils as well, a wire can be wound thereon without a need for insulating treatment, with the advantage of a simplified structure.

Also provided herein is a magnetic powder compression molding material comprising the composite magnetic material of the first aspect including its preferred embodiments in which 90 to 98% by weight of the coated metal particles are dispersed in the resin.

The method of molding under heat and pressure permits the amount of the coated metal particles added to the resin to be increased, which leads to a higher magnetic permeability. Since the insulator-coated metal particles are used, the molding material is highly insulating and reliable. Also, the composite magnetic material is best suited for compression molding since the insulating layer is firmly attached to the metal particles so that the insulating layer scarcely fails even when the coated metal particles are deformed under the applied pressure.

Also provided herein is a magnetic paint comprising the composite magnetic material of the first aspect including its preferred embodiments. By virtue of the microscopic insulator-coated metal particles used, a high magnetic permeability is obtainable to the high frequency region. The coating of the insulating layer ensures a high insulation resistance and withstanding voltage. The paint form enables printing such as screen printing and casting and accommodates for the fabrication to a thin gage and complex shape. The paint can also be molded as by casting.

Also provided herein are a prepreg and a magnetic substrate comprising the composite magnetic material of the first aspect including its preferred embodiments. By virtue of the microscopic insulator-coated metal particles used, a high magnetic permeability is obtainable to the high frequency region. The coating of the insulating layer ensures a high insulation resistance and withstanding voltage.

Where molding techniques such as injection molding, transfer molding, and extrusion molding are employed, the composite magnetic material of the invention can be used as a molding material on printed circuit boards having parts mounted thereon, semiconductor packaging material, molding material for coils and cores of transformers and choke coils, material for toroidal and clamp filter cores, material for connector housings and covers, coating material for cables, and housing material for electronic instruments. In any of these applications, the material is adequate because of its improved insulating and magnetic characteristics.

To take advantage of the fact that magnetic metal particles increase their coercivity as they are more finely divided, the material is very useful as a plastic magnet-forming material. In this application, the metal material is selected from hard magnetic materials such as Nd—Fe—B base alloys and Sm—Co base alloys. A rust resistant composite magnetic material can be provided because the metal particle surface is surface coated with an insulator.

In the practice of the invention, it is, of course, possible to replace the resin material by a vitreous material, and to mold and fire the composite material to a shape appropriate for a particular application while binding the particles thereby. A molded material with a focus on heat resistance can be realized.

It is also possible to add a glass component to the resin along with the coated metal particles. Alternatively, a glass component can be used as the coating insulating layer and in this case, molding is followed by firing to yield a composite magnetic material having improved heat resistance.

In a second aspect, the invention provides a composite dielectric material comprising generally spherical metal particles of at least one type having a mean particle size of 0.1 to 10 μm and coated over at least a part of their surface with a dielectric layer. The coated particles are dispersed in a resin.

The dielectric layer designates a layer of a material having a higher dielectric constant than the resin, and preferably a dielectric constant of at least 20. Such generally spherical metal particles having a small particle size and entirely or partially surface coated with a dielectric layer can be prepared by a spray pyrolysis process as described in the above-referred JP-B 3-68484. When it is desired to form a dielectric layer such as a barium titanate layer on surfaces of metal particles, a solution in which compounds such as barium and titanyl salts are dissolved along with the nickel salt is sprayed and heated, the heating being at a higher temperature than the decomposition temperature of the dielectric-forming salt. In this way, a dielectric layer is formed on surfaces of generally spherical metal particles consisting essentially of single crystal grains.

The ground accounting for the metal particles consisting essentially of single crystal grains is the same as above.

When the particles are formed by the spray pyrolysis process, their size has a lower limit of about 0.05 μm and an upper limit of about 20 μm. Most often, the powder is a grouping of particles having a mean particle size of about 0.1 to 10 μm in which particles having a size of 0.05 to 20 μm account for about 95% by weight.

The dielectric-coated metal particles are effectively mixed and dispersed in a resin because they are spherical and small sized as compared with prior art particles in the form of fragments or blocks having bosses and recesses which are obtained by grinding a sintered dielectric. When such coated metal particles are dispersed in a resin, the dielectric layer at a coating weight of 1% by weight based on the metal particles does not contribute to an improvement in dielectric constant, but can improve the insulation resistance and withstanding voltage of the composite dielectric material. If the coating weight of the dielectric layer is more than 1% by weight based on the metal particles, the dielectric layer contributes to an improvement in dielectric constant.

Since the dielectric-coated metal particles can be prepared by the spray pyrolysis process as mentioned above, they are available at a low cost as compared with the prior art involving a number of steps including sintering and grinding of dielectrics.

The composite dielectric material may further include dielectric oxide particles of at least one type in the resin in addition to the dielectric-coated metal particles.

In one preferred embodiment of the composite dielectric material of the second aspect, the dielectric layer has a thickness of 0.005 to 5 μm.

The dielectric layer of at least 0.005 μm thick can contribute to improvements in dielectric constant and withstanding voltage. Beyond 5 μm, it would become difficult to form particles. The term "thickness" used herein designates the maximum thickness of the coating. The coating need not necessarily cover the entire surface of a metal particle and it suffices that the coating covers about 50% of the surface of a metal particle.

In a further preferred embodiment of the composite dielectric material of the second aspect, 30 to 98% by weight of the coated metal particles are dispersed in the resin.

If the content of the coated metal particles is less than 30 wt %, substrates, electronic parts and shield members constructed by the composite dielectric material may fail to provide desired characteristics. If the content of the coated metal particles is more than 98 wt %, it would become difficult to mold such articles.

In a further preferred embodiment of the composite dielectric material of the second aspect, the metal particles are formed of at least one metal selected from the group consisting of silver, gold, platinum, palladium, copper, nickel, iron, aluminum, molybdenum, and tungsten. Alloys of these metals and alloys of these metals with other metals are also useful herein.

In a further preferred embodiment of the composite dielectric material of the second aspect including preferred embodiments, the dielectric layer may be constructed, for example, of titanium-barium-neodymium, titanium-barium-tin, titanium-barium-strontium, titanium-barium-lead, titanium-barium-zirconium, lead-calcium, titanium dioxide, barium titanate, lead titanate, strontium titanate, calcium titanate, bismuth titanate, magnesium titanate, alumina, $BaTiO_3$—$SiO_2$, $BaO$—$SiO_2$, $CaWO_4$, $Ba(Mg,Nb)O_3$, $Ba(Mg,Ta)O_3$, $Ba(Co,Mg,Nb)O_3$, $Ba(Co,Mg,Ta)O_3$ base ceramics.

The composite dielectric material of the invention can be used as a molding material, a powder compression molding material, a paint, a prepreg, and a substrate. The composite dielectric material is useful as a piezoelectric material when the dielectric layer is constructed of a piezoelectric material. The composite dielectric material is also useful as a semiconductor material by adjusting the thickness of the dielectric layer and the content of particles. Further the composite dielectric material is useful as a material to form electronic parts such as capacitors, surface acoustic wave devices, piezoelectric devices, varistors, and thermistors, and shield members.

Using the composite dielectric material of the invention, electronic parts having satisfactory characteristics even at a thin gage can be manufactured, because particles are effectively dispersible due to the spherical shape and small size attributable to the spray pyrolysis process. When a dielectric layer for a particular purpose is formed on the particle surface, the dielectric layer performs well and the amount of expensive dielectric can be reduced.

When the dielectric-coated metal particles are used as a capacitor-forming material, any desired dielectric constant is obtainable by changing the thickness of the dielectric layer and the content of particles in the resin. Since particles are effectively dispersible due to their small size and spherical shape, the composite dielectric material can be constructed into an article having stable characteristics despite a thin gage.

When a multilayer substrate is constructed using the composite dielectric material, a capacitor can be formed within the multilayer substrate. Also, a dielectric layer having any desired dielectric constant can be formed by changing the thickness of the dielectric layer or the content of particles in the resin, which permits various passive elements having different characteristics to be formed within the multilayer substrate. Since particles are effectively dispersible due to their small size and spherical shape, the composite dielectric material can be constructed into an article having stable characteristics despite a thin gage.

When the composite dielectric material is used as a shielding material, it can be used to mold a shield member requiring electrical insulation. This enables mounting without placing an intermediate insulator, resulting in ease of packaging.

In a third aspect, the invention provides an electronic part comprising a composite dielectric material comprising generally spherical metal particles of at least one type having a mean particle size of 0.1 to 10 µm and coated over a portion or the entirety of their surface with a dielectric layer, the coated particles being dispersed in a resin.

The dielectric-coated metal particles are effectively mixed and dispersed in a resin because they are spherical and small sized as compared with prior art particles in the form of fragments or blocks having bosses and recesses which are obtained by grinding a sintered dielectric. This ensures ease of working and easy achievement of desired characteristics. Also, since metal particles are covered with the coating layer, the particles are resistant to corrosion.

It is noted that the composite dielectric material may further include dielectric oxide particles of at least one type in the resin in addition to the dielectric-coated metal particles.

In one preferred embodiment, the dielectric layer on the surface of metal particles has a thickness of 0.005 to 2 µm.

The dielectric layer of at least 0.005 µm thick can contribute to improvements in dielectric constant and withstanding voltage. Beyond 2 µm, it would become difficult to form particles.

The term "thickness" used herein designates the maximum thickness of the coating. The coating need not necessarily cover the entire surface of a metal particle and it suffices that the coating covers about 50% of the surface of a metal particle.

In a further preferred embodiment, 30 to 98% by weight of the coated metal particles are dispersed in the resin. If the content of the coated metal particles is less than 30 wt %, substrates, electronic parts and shield members constructed by the composite dielectric material may fail to provide desired characteristics. If the content of the coated metal particles is more than 98 wt %, it would become difficult to mold such articles.

The metal particles and the dielectric layer on the surface thereof may be formed of materials as exemplified above.

In the manufacture of the electronic part according to the invention, the composite dielectric material in which metal particles coated on their surface with a dielectric layer are dispersed in a resin can be used as a molding material, a powder compression molding material, a paint, a prepreg, and a substrate. The composite dielectric material is useful as a piezoelectric material when the dielectric layer is constructed of a piezoelectric material. The composite dielectric material is also useful as a semiconductor material by adjusting the thickness of the dielectric layer and the content of particles.

Using the composite dielectric material, electronic parts having satisfactory characteristics even at a small size can be manufactured, because particles are effectively dispersible due to the spherical shape and small size attributable to the above-mentioned spray pyrolysis process. When a dielectric layer for a particular purpose is formed on the particle surface, the dielectric layer performs well and the amount of expensive dielectric can be reduced.

When the dielectric-coated metal particles are used to form a capacitor, any desired dielectric constant is obtainable by changing the thickness of the dielectric layer and the content of particles in the resin. Since particles are effectively dispersible due to their small size and spherical shape, the composite dielectric material can be constructed into an article having stable characteristics despite a small size.

When a multilayer substrate is constructed using the composite dielectric material, a capacitor can be formed within the multilayer substrate. Also, a dielectric layer having any desired dielectric constant can be formed by changing the thickness of the dielectric layer or the content of particles in the resin, which permits various passive elements having different characteristics to be formed within the multilayer substrate.

When the composite dielectric material is used as a shielding material, it can be used to mold a shield member requiring electrical insulation. This enables mounting without placing an intermediate insulator, resulting in ease of packaging.

The electronic parts constructed using the composite dielectric material in which generally spherical metal particles surface coated with a dielectric layer are mixed and dispersed in a resin according to the invention include ordinary capacitors, multilayer capacitors, disc capacitors and feed-through capacitors.

The electronic parts in which a semiconductor ceramic is used as the dielectric layer according to the invention include ring varistors, chip varistors, NTC thermistors, PTC thermistors, temperature fuses, angle sensors, rotation sensors, and thermal heads.

When a piezoelectric material is used as the dielectric layer, the electronic part of the invention can be constructed as piezoelectric devices, surface acoustic wave devices, and the like. Additionally, there are obtainable applied devices thereof, such as piezoelectric actuators, sounders, microphones, receivers, pyroelectric sensors, ultrasonic sensors, shock sensors, acceleration sensors, piezoelectric vibration gyroscopes, surface acoustic wave filters, piezoelectric transformers, resonators, and ceramic filters.

In a further aspect, the invention provides an electronic part comprising a composite material comprising generally spherical metal or magnetic metal particles of at least one type consisting essentially of single crystal grains, having a mean particle size of 0.1 to 10 µm and coated a portion or the entirety of their surface with an insulating layer. The coated metal particles are dispersed in a resin.

Such generally spherical metal particles consisting essentially of single crystal grains, having a small particle size and surface coated with an insulating layer can be prepared by the spray pyrolysis process as described in the above-referred JP-B 3-68484.

The insulator-coated metal particles are effectively mixed and dispersed in a resin because they are spherical and small sized as compared with prior art ferrite particles in the form of fragments or blocks having bosses and recesses which are obtained by grinding ferrite. When such coated metal particles are dispersed in a resin, the insulating layer even at a low coating weight of 1% by weight based on the metal particles contributes to an improvement in insulation resistance and withstanding voltage.

Even in the composite magnetic material, the coated metal particles maintain their original shape prior to mixing into the composite magnetic material, and the overlying insulating layer is kept coated without rupture. This is one factor contributing to an improvement in withstanding voltage as previously described. Also, since metal particles are coated on their surface with the insulating layer, the problem of corrosion or rust generation is eliminated.

When the particles are formed by the spray pyrolysis process, their size has a lower limit of about 0.05 µm and an upper limit of about 20 µm. Most often, the powder is a grouping of particles having a mean particle size of about 0.1 to 10 µm in which particles having a size of 0.05 to 20 µm account for about 95% by weight.

Since the particles are reduced in size and surface coated with an insulator as mentioned above, the composite magnetic material, in which the metal particles are incorporated, has a reduced eddy current loss, which is one of losses associated with magnetic materials, and improved high-frequency characteristics. Because of the reduced size, the fabrication of thin gage electronic parts is enabled.

When the metal is an essentially single crystal ferromagnetic metal, the composite magnetic material can be used as electronic parts using magnetic substrates requiring magnetism, electromagnetic shield members, and cores in coils such as ordinary coils, choke coils, deflecting coils and high-frequency coils. Also, it can be used as cores in ordinary transformers, pulse transformers, data communication transformers, wide-band SMD transformers, directional couplers, power synthesizers, and power distributors. Further it can be used in magnetic discriminating sensors, potential sensors, toner sensors, current sensors, magnetic panels, electromagnetic wave absorbing sheets, thin-gage electromagnetic wave absorbers, electromagnetic shields, and magnetic heads. Also a molding material to form a mold and a plastic magnet are provided.

In the electronic part comprising the composite magnetic material in which metal particles or magnetic metal particles are covered with an insulating layer, the insulating layer preferably has a thickness of 0.005 to 2 µm. The insulating layer of at least 0.005 µm thick can contribute to improvements in dielectric constant, insulation and withstanding voltage. Beyond 2 µm, it would become difficult to form the insulating layer as a uniform film.

The term "thickness" used herein designates the maximum thickness of the coating. The coating need not necessarily cover the entire surface of a metal particle and it suffices that the coating covers about 50% of the surface of a metal particle. The content of coated metal particles is preferably 30 to 98% by weight as previously mentioned.

By virtue of the coating of microscopic magnetic metal particles with the insulating layer, the material has a high insulation resistance and withstanding voltage. Since the need for insulating treatment is eliminated, the magnetic molding material, when used in the shield and mold material applications, can be combined with another member without a need for insulating treatment, with the advantage that the structure is simplified. In the case of magnetic cores in choke coils as well, a wire can be wound thereon without a need for insulating treatment, with the advantage of a simplified structure.

Also when the electronic part of the invention is to be molded under heat and pressure, the preferred content of the coated metal particles in the resin is 90 to 98% by weight. The method of molding under heat and pressure permits the amount of the coated metal particles added to the resin to be increased, which leads to a higher magnetic permeability. Since the insulator-coated metal particles are used, the molding material is highly insulating and reliable. Also, the composite material is best suited for compression molding since the insulating layer is firmly attached to the metal particles so that the insulating layer scarcely fails even when the coated metal particles are deformed under the applied pressure.

The electronic part of the invention can be constructed as an electronic part within which or on the surface of which a composite magnetic material containing magnetic metal particles covered on the periphery with an insulating layer is formed as by printing. By virtue of the insulator-coated metal particles used, a high magnetic permeability is obtainable to the high frequency region. The coating of the insulating layer ensures a high insulation resistance and withstanding voltage.

When the electronic part is constructed using the prepreg or magnetic substrate according to the invention, the use of the microscopic insulator-coated metal particles permits a high magnetic permeability to manifest up to the high frequency region. The coating of the insulating layer ensures a high insulation resistance and withstanding voltage.

Where electronic parts are constructed by molding the composite magnetic material by molding techniques such as injection molding, transfer molding, and extrusion molding, there can be provided a molding material on printed circuit boards having parts mounted thereon, semiconductor packaging material, molding material for coils and cores of transformers and choke coils, material for toroidal and clamp filter cores, material for connector housings and covers, coating material for cables, and housing material for electronic instruments. In any of these applications, very useful electronic parts are available because of their improved insulating and magnetic characteristics.

By taking advantage of the fact that magnetic metal particles increase their coercivity as they are more finely divided, a plastic magnet is provided. In this application, the metal material may be selected from the above-exemplified materials.

In the practice of the invention, it is, of course, possible to replace the resin material by a vitreous material, and to mold and fire the composite material to a shape appropriate for a particular application while binding the particles thereby. An electronic part having a molding material with a focus on heat resistance can be realized.

It is also possible to add a glass component to the resin along with the coated metal particles. Alternatively, a glass component can be used as the coating insulating layer and in this case, molding is followed by firing to yield a composite magnetic material having improved heat resistance.

For the resin used in the composite materials of the invention, either thermosetting or thermoplastic resins may be used. A choice may be made, for example, among epoxy resins, phenolic resins, polyolefin resins, polyimide resins, polyester resins, polyphenylene oxide resins, melamine resins, cyanate ester resins, diallyl phthalate resins, polyvinyl benzyl ether resins, liquid crystal polymers, fluoro-resins, polyphenylene sulfide resins, polyacetal resins, polycarbonate resins, ABS resins, polyamide resins, silicone resins, polyurethane resins, polyvinyl butyral resins, polyvinyl alcohol resins, ethyl cellulose resins, nitrocellulose resins and acrylic resins, and mixtures thereof. These resins may be used alone or in admixture of two or more.

The electronic part of the invention can also be constructed as comprising the composite dielectric materials and/or the composite materials in combination. Such electronic parts include clamp filters, common mode filters, EMC filters, power supply filters, power supply units, DC-DC converters, DC-AC converters, inverters, delay lines, and diplexers. They can also be used as duplexers, antenna switch modules, PLL modules, front end modules, tuner units and double balanced mixers in communication tools such as mobile phones.

In the electronic parts of the invention, the composite dielectric material or the composite material can be constructed as comprising at least one layer having a glass cloth embedded in a resin. The embedment of glass cloth increases part strength.

BRIEF DESCRIPTION OF THE DRAWINGS

FIG. 6 graphically illustrates the magnetic permeability versus frequency of inventive and comparative composite magnetic materials.

FIGS. 47 to 49 illustrate an antenna as one exemplary multilayer electronic part of the invention.

FIGS. 81A to 81D illustrate steps of a process for forming a copper foil-clad substrate.

DESCRIPTION OF THE PREFERRED EMBODIMENTS

Figure 1A:
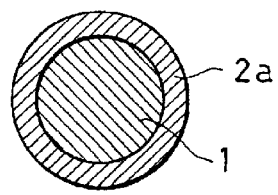
FIG. 1A is a cross-sectional view of a particle used herein.
Figure 2:
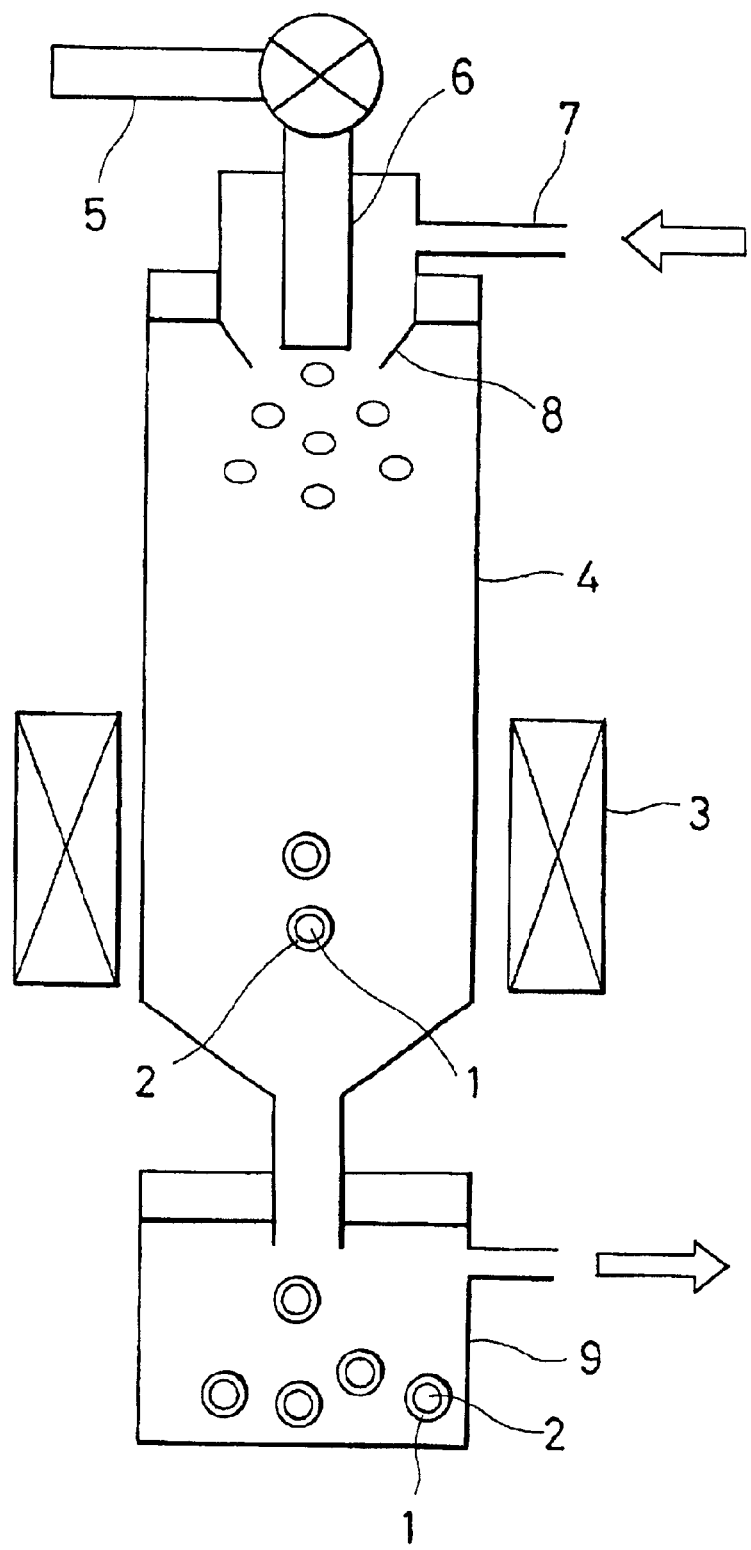
FIG. 2 is a schematic view of an apparatus used for forming particles by the spray pyrolysis process.

Referring to FIG. 1A, there is illustrated in cross section an insulator-coated metal particle used in the invention. The insulator-coated metal particle has an insulating layer $2a$ formed on the surface of a metal particle 1. Such insulator-coated metal particles are prepared by a spray pyrolysis process. The spray pyrolysis process is implemented using an apparatus as shown in FIG. 2. More particularly, the apparatus includes a furnace core tube 4 surrounded by a heater 3, and a spray nozzle 6 disposed at the top of the core tube 4. An inlet tube 5 is connected to the spray nozzle 6 for supplying a solution to be sprayed. Disposed concentrically about the nozzle 6 is a guide 8 connected to a carrier gas inlet tube 7. A reservoir 9 is disposed below the bottom of the core tube 4 for receiving particles.

In the operation of the apparatus, a solution containing a metal salt and a salt for forming an insulating layer is sprayed from the nozzle 6 while an oxidizing or reducing carrier gas for a particular purpose is supplied from the guide 8 at the same time. In this way, insulator-coated metal particles are formed within the core tube 4.

The metal particles 1 may be of any material as long as it is magnetic. Use may be made of nickel, iron, or an alloy of iron with another metal at least one selected among nickel, molybdenum, silicon, aluminum, cobalt, neodymium, platinum, samarium, zinc, boron, copper, bismuth, chromium, and titanium. Iron-free metal materials such as Mn—Al, Co—Pt, and Cu—Ni—Co base alloys are also useful.

The material of which the insulating layer $2a$ is formed may be any oxide composition having electrically insulating properties. Use may be made of at least one of oxides of silicon, boron, phosphorus, tin, zinc, bismuth, alkali metal, alkaline earth metal, germanium, copper, aluminum, titanium, zirconium, vanadium, niobium, tantalum, chromium, manganese, tungsten, iron, chromium, cobalt, rare earth metals, and molybdenum which can form a vitreous material.

Also, the coating layer may be formed of an oxide exhibiting dielectric properties as shown below. Examples include titanium-barium-neodymium, titanium-barium-tin, titanium-barium-strontium, titanium-barium-lead, titanium-barium-zirconium, lead-calcium, titanium dioxide, barium titanate, lead titanate, strontium titanate, calcium titanate, bismuth titanate, and magnesium titanate base ceramics. Additionally, $CaWO_4$, $Ba(Mg,Nb)O_3$, $Ba(Mg,Ta)O_3$, $Ba(Co,Mg,Nb)O_3$, $Ba(Co,Mg,Ta)O_3$, $BaTiO_3$—$SiO_2$, and $BaO$—$SiO_2$ base ceramics are included as well as alumina.

Moreover, magnetic oxides as shown below are included. Useful compositions include Mn—Zn base ferrite, Ni—Zn base ferrite, Mn—Mg—Zn base ferrite, Ni—Cu—Zn base ferrite, Cu—Zn base ferrite, Mn ferrite, Co ferrite, Li ferrite, Mg ferrite, and Ni ferrite. Hexagonal ferrite such as barium ferrite is also useful. Additionally, iron oxides such as $Fe_2O_3$ and $Fe_3O_4$ are acceptable.

The above-mentioned salt is dissolved in water or an organic solvent such as alcohol, acetone or ether or a mixture thereof. The heating temperature set by the heater 3 is higher than the melting temperature of metal particles 1.

Figure 1B:
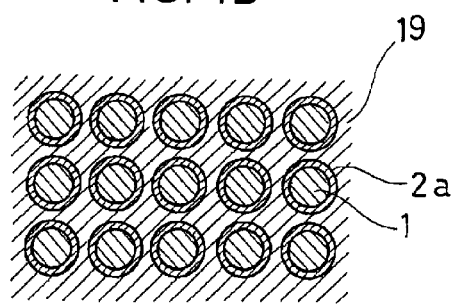
FIG. 1B is a cross-sectional view of one exemplary composite magnetic material.

As shown in FIG. 1B, the insulating layer-coated metal particles (1, $2a$) prepared by the spray pyrolysis process are mixed and dispersed in a resin 19 using a ball mill or the like, obtaining a composite magnetic material. Either thermosetting or thermoplastic resins may be used as the resin 19. A choice may be made, for example, among epoxy resins, phenolic resins, polyolefin resins, polyimide resins, polyester resins, polyphenylene oxide resins, melamine resins, cyanate ester resins, diallyl phthalate resins, polyvinyl benzyl ether resins, liquid crystal polymers, fluororesins, polyphenylene sulfide resins, polyacetal resins, polycarbonate resins, ABS resins, polyamide resins, silicone resins, polyurethane resins, polyvinyl butyral resins, polyvinyl alcohol resins, ethyl cellulose resins, nitrocellulose resins and acrylic resins, and mixtures thereof. These resins may be used alone or in admixture of two or more.

The composite magnetic material thus obtained is formed by various molding techniques into any form selected from among a glass cloth-loaded prepreg, copper-clad magnetic substrate, magnetic molding material, magnetic paint, and magnetic powder compression molding material.

Figure 1C:
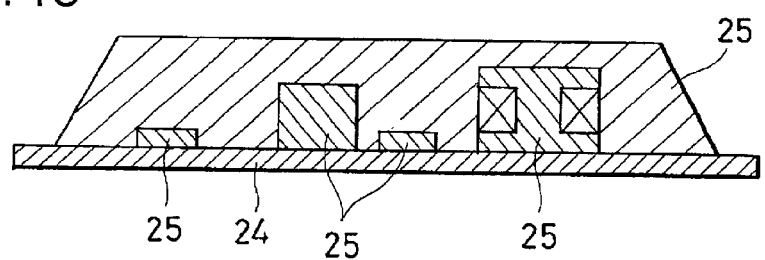
FIG. 1C is a cross-sectional view of one exemplary molding material using the composite magnetic material.
Figure 1D:
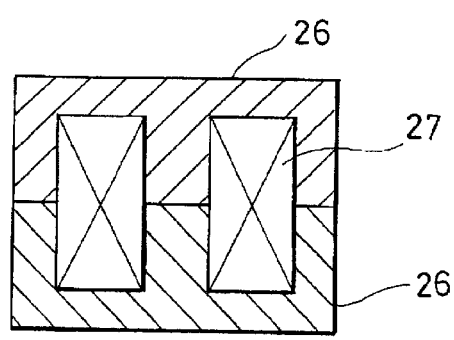
FIG. 1D is a cross-sectional view of another exemplary molding material using the composite magnetic material according to the invention.

To the composite magnetic material obtained by the invention, any of uncovered metal particles, flattened metal particles, magnetic oxide particles, and dielectric oxide particles may be added so as to meet the desired characteristics.

Where molding techniques such as injection molding, transfer molding, and extrusion molding are employed, the composite magnetic material of the invention can be used as a molding material 25 on a printed circuit board 24 having parts 25 mounted thereon as shown in FIG. 1C, semiconductor packaging material, molding material for coils and a core 26 (having a winding 27) in a transformer or choke coil as shown in FIG. 1D, material for toroidal and clamp filter cores, material for connector housings and covers, coating material for cables, and housing material for electronic instruments. In any of these applications, the material is adequate because of its improved insulating and magnetic characteristics.

Figure 3A:
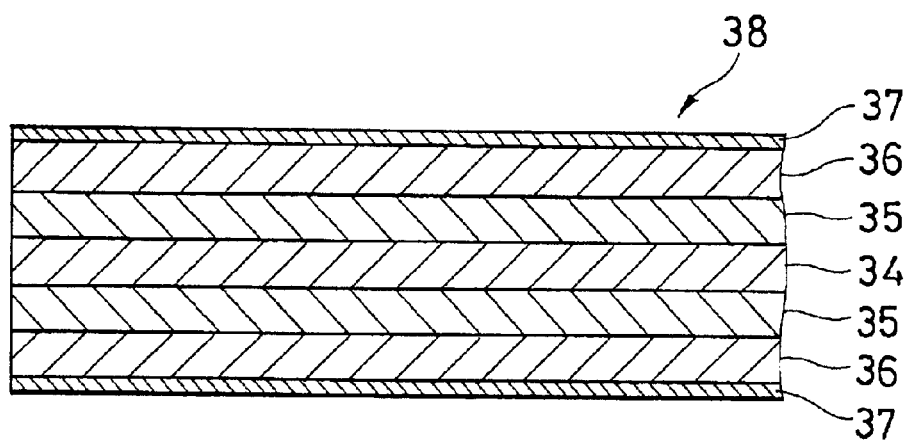
FIGS. 3A and 3B are cross-sectional views of a magnetic substrate and a shield member according to the invention.

Also, the composite magnetic material of the invention can be used to construct a multilayer substrate 38 as shown in FIG. 3A, by placing dielectric layers 35 having a relatively low dielectric constant on opposite surfaces of a magnetic material layer 34 having the coated metal particles mixed and dispersed in a resin, placing dielectric layers 36 having a relatively low dielectric constant on the dielectric layers 35, thereby forming a plate-shaped body, and forming a conductor pattern 37 in the form of a ground pattern or wiring pattern on at least one of front and rear surfaces of the plate-shaped body. In these dielectric layers 35, 36, internal conductors (not shown) are formed. The composite magnetic material of the invention can also be used as a substrate material using a prepreg. It can be further used as a material for forming chip-shaped inductor devices and multilayer electronic parts such as filters.

Figure 3B:

The composite magnetic material of the invention, that is, material in which the metal particles 1 coated with the insulating layer 2a are dispersed in the resin 19, can be used as a sheet- or case-shaped shield member 39 as shown in FIG. 3B.

To take advantage of the fact that magnetic metal particles increase their coercivity as they are more finely divided, the material is very useful as a plastic magnet-forming material. In this application, the metal material is selected from hard magnetic materials such as Nd—Fe—B base alloys and Sm—Co base alloys. A rust resistant composite magnetic material can be provided because the metal particle surface is coated with an insulator.

It is, of course, possible to replace the resin material by a vitreous material, and to mold and fire the composite material to a shape appropriate for a particular application while binding the particles thereby. A molded material with a focus on heat resistance can be realized.

Figure 4A:
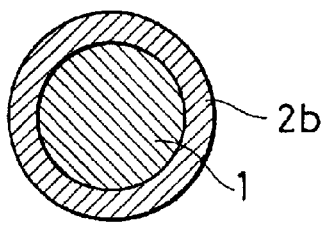
FIG. 4A is a cross-sectional view of a particle used herein.

Referring to FIG. 4A, there is illustrated in cross section a dielectric-coated metal particle used in the invention. The dielectric-coated metal particle has a dielectric layer 2b formed on the surface of a metal particle 1. Such dielectric-coated metal particles are prepared by a spray pyrolysis process. The spray pyrolysis process is implemented using an apparatus as shown in FIG. 2 as in the case of the insulator-coated metal particles described above.

In the operation of the apparatus, a solution containing a metal salt and a dielectric-forming salt is sprayed from the nozzle 6 while an oxidizing or reducing carrier gas for a particular purpose is supplied from the guide 8 at the same time. In this way, dielectric-coated metal particles are formed within the core tube 4.

The metal particles may be of the same material as described above for the insulator-coated metal particles.

The materials of which the dielectric layer 2b is formed include titanium-barium-neodymium, titanium-barium-tin, titanium-barium-strontium, titanium-barium-lead, titanium-barium-zirconium, lead-calcium, titanium dioxide, barium titanate, lead titanate, strontium titanate, calcium titanate, bismuth titanate, and magnesium titanate base ceramics. Additionally, $CaWO_4$, $Ba(Mg,Nb)O_3$, $Ba(Mg,Ta)O_3$, $Ba(Co,Mg,Nb)O_3$, $Ba(Co,Mg,Ta)O_3$, $BaTiO_3$—$SiO_2$, and $BaO$—$SiO_2$ base ceramics are included as well as alumina.

Examples of the salt from which the metal particles 1 and dielectric layer 2b are formed include pyrolyzable compounds such as nitrates, sulfates, oxynitrates, oxysulfates, chlorides, ammonium complexes, phosphates, carboxylates, metal alcoholates, resinates, boric acid, and silicic acid and mixtures thereof. These compounds may be used alone or in admixture of two or more.

The compound, typically a salt as mentioned just above is dissolved in water or an organic solvent such as alcohol, acetone or ether or a mixture thereof. The heating temperature set by the heater 3 is higher than the melting temperature of metal particles 1.

Figure 4B:
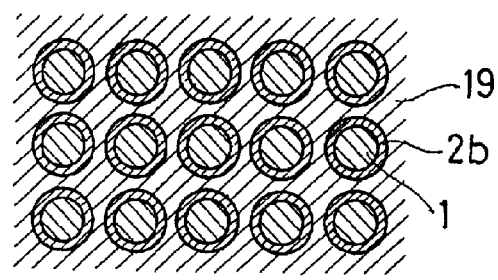
FIG. 4B is a cross-sectional view of one exemplary composite dielectric material.

As shown in FIG. 4B, the dielectric-coated metal particles (1, 2b) prepared by the spray pyrolysis process are mixed and dispersed in a resin 19 using a ball mill or the like, obtaining a composite dielectric material. The resin 19 used herein is the same as described above for the composite magnetic material.

Figure 4C:
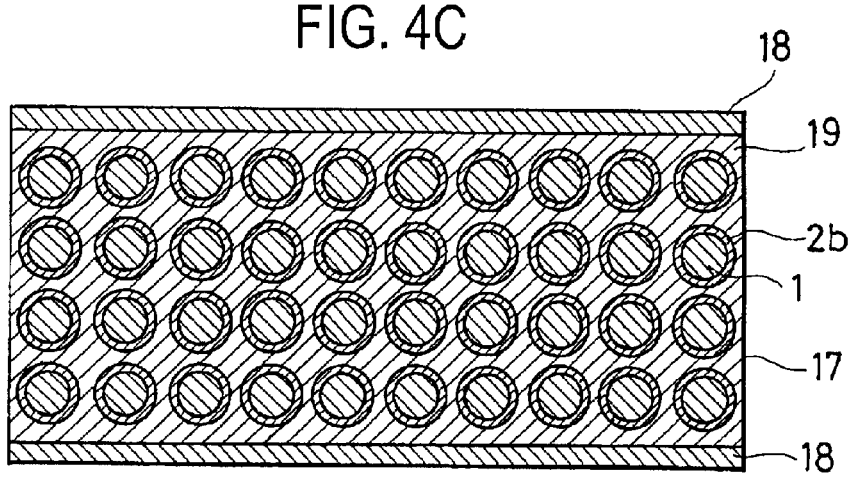
FIG. 4C is a cross-sectional view of an exemplary capacitor.
Figure 4D:
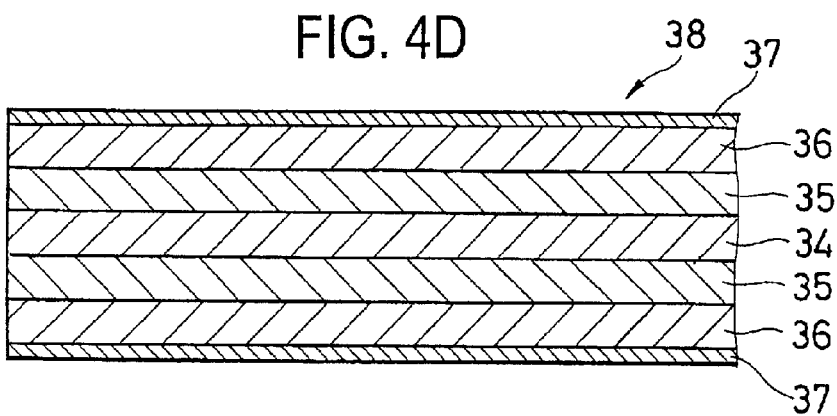
FIG. 4D is a cross-sectional view of an exemplary multilayer substrate according to the invention.

The composite dielectric material of the invention may be used to construct a capacitor, as shown in FIG. 4C, by mixing and dispersing the dielectric-coated metal particles in the resin 19, heating and forming the mixture into a thin plate-shaped body 17, and bonding electrodes 18 to opposite surfaces of the body. Also, the composite dielectric material of the invention can be used to construct a multilayer substrate 38 as shown in FIG. 4D, by placing dielectric layers 35 having a relatively low dielectric constant on opposite surfaces of a magnetic material layer 34 having magnetic metal particles mixed and dispersed in a resin, placing dielectric layers 36 having a relatively high dielectric constant on the dielectric layers 35, thereby forming a plate-shaped body, and forming a conductor pattern 37 in the form of a ground pattern or wiring pattern on at least one of front and rear surfaces of the plate-shaped body. These dielectric layers 35, 36 have internal conductors (not shown) therein, and an inductance device-forming conductor (not shown) is on or outside the magnetic material layer 34. The structure of the capacitor may be modified, for example, so as to have the internal electrode of multilayer structure, to build in a plurality of capacitors, or to laminate inductors. The structure of the multilayer substrate may also be modified in various ways.

To obtain moldings for various electronic parts, the composite dielectric material of the dielectric-coated metal particles in the resin can be used as a molding material if it is in the powder or flowing state. Also the composite dielectric material is further mixed with a resin to give a powder compression molding material which can be molded under pressure or under heat and pressure. By adding the resin as a binder and a plasticizer to the metal particles 1 coated with the dielectric layer 2b, followed by mixing, the composite dielectric material can be used as a printing paste. The composite dielectric material can also be used as a casting material for casting or potting after it is dispersed in a solvent.

It is, of course, possible to replace the resin in the composite dielectric material by a vitreous component or add a vitreous component to the composite dielectric material and to mold and fire the composite material to a shape appropriate for a particular application while binding the particles thereby. This improves heat resistance and dielectric constant.

The composite dielectric material can be used as a piezoelectric material when the dielectric layer 2b is formed of a piezoelectric ceramic. The composite dielectric material can also be used as a semiconductor material when the dielectric layer 2b is formed of a material having a relatively low electric resistance, or when the thickness of the dielectric layer 2b is reduced and the amount of the resin 19 is reduced. Further the composite dielectric material can also be used as a varistor or thermistor-forming material when the dielectric layer 2b is formed of a material whose resistance changes non-linearly with voltage or temperature.

Figure 5A:
FIGS. 5A to 5D illustrate various products obtained using the composite dielectric material of the invention.
Figure 5B:
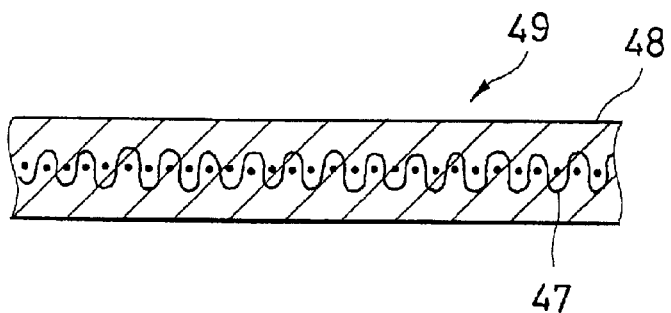

Specifically, the composite dielectric material can be used as a material for forming a shield member 46 in the form of a layer by applying as a coating as shown in FIG. 5A, or in the form of a sheet, case or cover. Also, by applying the composite dielectric material 48 to a glass cloth 47, as shown in FIG. 5B, there is obtained a prepreg 49 (one of substrate materials). By stacking one or more plies of the prepreg, curing and forming conductor patterns on the surface or in the interior, a substrate or capacitor can be constructed. It is noted that a certain prepreg is free of glass cloth, and the composite dielectric material of the invention can be used for such prepreg as well.

Figure 5C:
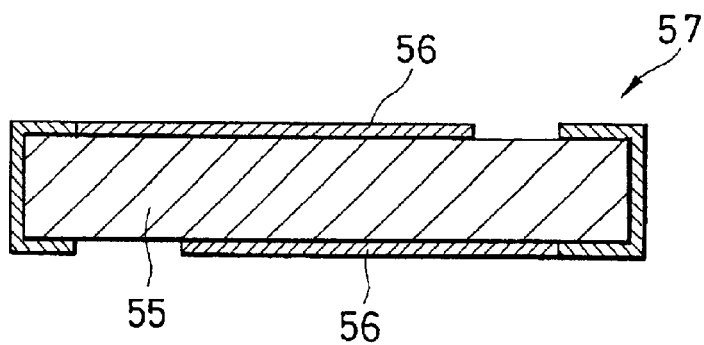

Also a piezoelectric device 57 can be constructed, as shown in FIG. 5C, by using a piezoelectric material (inclusive of lead-free materials) in the dielectric layer 2b, molding the composite dielectric material into a body 55, and forming a pair of opposed electrodes 56 on opposite surfaces of the body 55. A surface acoustic wave device can also be constructed by interdigital electrodes on a surface of the body 55.

Figure 5D:
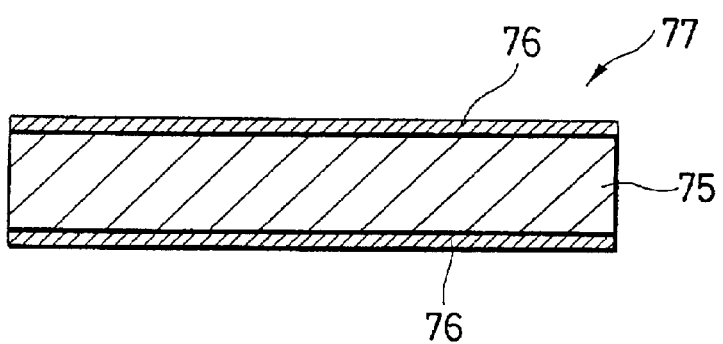

Further, a thermistor 77 can be constructed, as shown in FIG. 5D, by using a semiconductor material having NTC or PTC characteristics in the dielectric layer 2b, molding the composite dielectric material to form a thermistor body 75, and forming electrodes 76 on opposite surfaces of the body. A varistor can be constructed by using a material having varistor resistance characteristics as the material of the body 75 or dielectric layer 2b. In either case, particles having a small size and good dispersibility are used so that a thin gage article having good dispersibility and satisfactory characteristics is readily obtainable.

By taking advantage of its magnetic characteristics, the composite magnetic material is used in fabricating a variety of electronic parts to be described later. In such fabrication, the composite magnetic material is formed by various molding techniques into a glass cloth-loaded prepreg, copper-clad magnetic substrate, magnetic molding material, magnetic paint, and magnetic powder compression molding material.

To the composite magnetic material obtained by the invention, any of uncovered metal particles, flattened metal particles, magnetic oxide particles, and dielectric oxide particles may be added so as to meet the desired characteristics.

The prepreg for use in the fabrication of the electronic part according to the invention can be fabricated by the method shown in FIGS. 81A to 81D or FIGS. 82A to 82D. The method of FIGS. 81A to 81D is rather suitable for mass manufacture whereas the method of FIGS. 82A to 82D is easy to control the film thickness and relatively easy to adjust the characteristics. In the method of FIGS. 81A to 81D, as shown in FIG. 81A, a glass cloth 101a wound in roll form is unraveled from the roll 90 and carried into a coating tank 92 via a guide roller 91. The coating tank 92 contains a slurry of the composite dielectric material or composite magnetic material. As the glass cloth passes through the coating tank 92, it is immersed in the slurry so that it is coated with the slurry while interstices are filled therewith.

Past the coating tank 92, the glass cloth is carried into a drying furnace 120 via guide rollers 93a and 93b. In the drying furnace 120, the glass cloth impregnated with composite dielectric material or composite magnetic material is dried at a predetermined temperature for a predetermined time whereby it is B-staged. After turning around a guide roller 95, the glass cloth is wound on a take-up roll 99.

The glass cloth is then cut into sections of a predetermined size. As shown in FIG. 81B, there is obtained a prepreg sheet having the glass cloth 101 sandwiched between the layers 102 of the composite dielectric material or composite magnetic material.

Then as shown in FIG. 81C, metal foils 100 such as copper foils are placed on opposite surfaces of the prepreg sheet. Laminating press yields a double side metal foil-clad substrate as shown in FIG. 81D. The laminating press conditions include a temperature of 100 to 200° C. and a pressure of $9.8 \times 10^5$ to $7.84 \times 10^6$ Pa (10 to 80 kgf/cm$^2$). Laminating press is done for about 0.5 to 20 hours under such conditions. Laminating press may be effected in plural stages under different conditions. Where the metal foils are not attached, the sandwich structure of prepreg sheet may be compressed under heat and pressure without placing metal foils thereon.

Figure 82A:
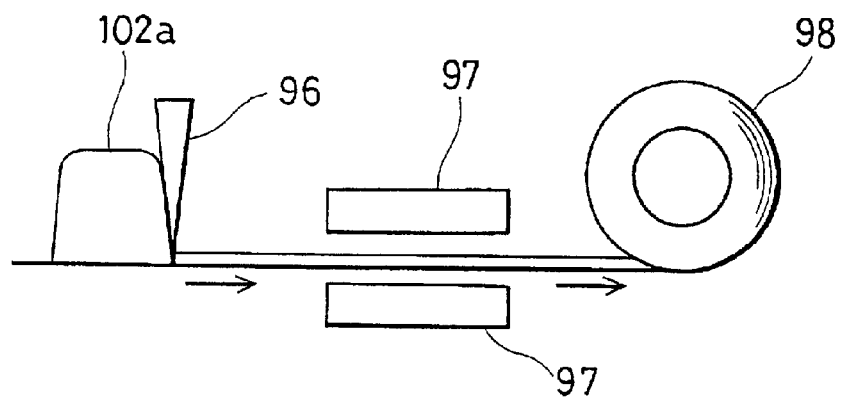
FIGS. 82A and 82D illustrate steps of another process for forming a copper foil-clad substrate.

Next, the method of FIGS. 82A to 82D is described. As shown in FIG. 82A, a slurry 102a of the composite dielectric material or composite magnetic material is coated onto a metal foil such as a copper foil by means of a doctor blade 96 which can maintain a constant clearance. The coated foil is then dried in a drying furnace 151 and wound on a take-up roller 98.

Figure 82B:
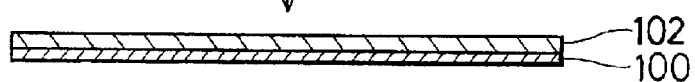

The coated foil is then cut into sections of a predetermined size. As shown in FIG. 82B, there is obtained a prepreg sheet in which the layer 102 of the composite dielectric material or composite magnetic material is disposed on one surface of the metal foil 100.

Figure 82C:
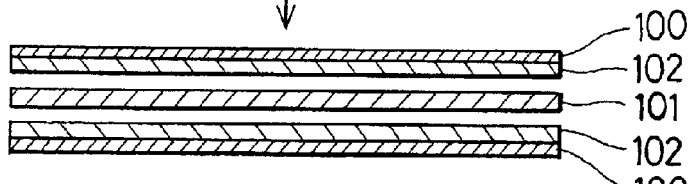
Figure 82D:
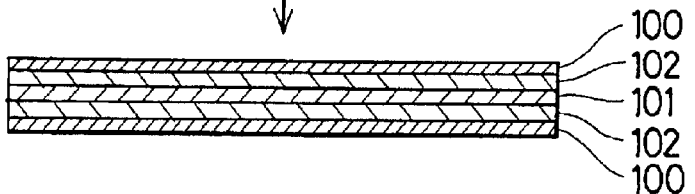

As shown in FIG. 82C, two such prepreg sheets (100, 102) are placed on opposite surfaces of a glass cloth 101 such that the composite dielectric material or composite magnetic material layers 102 face inside. Laminating press yields a double side metal foil-clad substrate as shown in FIG. 82D. The laminating press conditions may be the same as above.

Besides the above-mentioned coating methods, the substrate or prepreg by which the multilayer electronic part is constructed may be prepared by another method, for example, by milling the ingredients and lamination pressing the solid mixture. This method using the solid mixture is easy to provide a thickness and suitable for forming relatively thick substrates or prepregs.

Milling may be effected by well-known techniques using ball mills, agitators and kneaders. A solvent may be used during the milling, if necessary. The mixture may be pelletized or powdered, if necessary.

The pelletized or powdered mixture is molded in a lamination pressed. The laminating press conditions include a temperature of 100 to 200° C., a time of 0.5 to 3 hours, and a pressure of $4.9 \times 10^5$ to $7.84 \times 10^6$ Pa (5 to 80 kgf/cm$^2$).

The prepreg sheet thus obtained generally has a thickness of about 0.05 to 5 mm. The thickness of the prepreg sheet may be determined as appropriate depending on the desired plate thickness and the contents of dielectric powder and magnetic powder.

As in the preceding methods, metal foils such as copper foils are placed on opposite surfaces of the resulting prepreg sheet, followed by laminating press. This yields a double side metal foil-clad substrate. The laminating press conditions include a temperature of 100 to 200° C. and a pressure of $9.8 \times 10^5$ to $7.84 \times 10^6$ Pa (10 to 80 kgf/cm$^2$). Laminating press is done for about 0.5 to 20 hours under such conditions. Compression molding may be effected in plural stages under different conditions. Where the metal foils are not attached, the prepreg sheet may be lamination pressed without placing metal foils thereon.

A copper foil-clad substrate can be formed by placing copper foils over the prepreg of the invention, followed by laminating press. The copper foils used herein typically have a thickness of about 12 to 35 µm. Such copper foil-clad substrates include double side patterned substrates and multilayer substrates.

Figure 83:
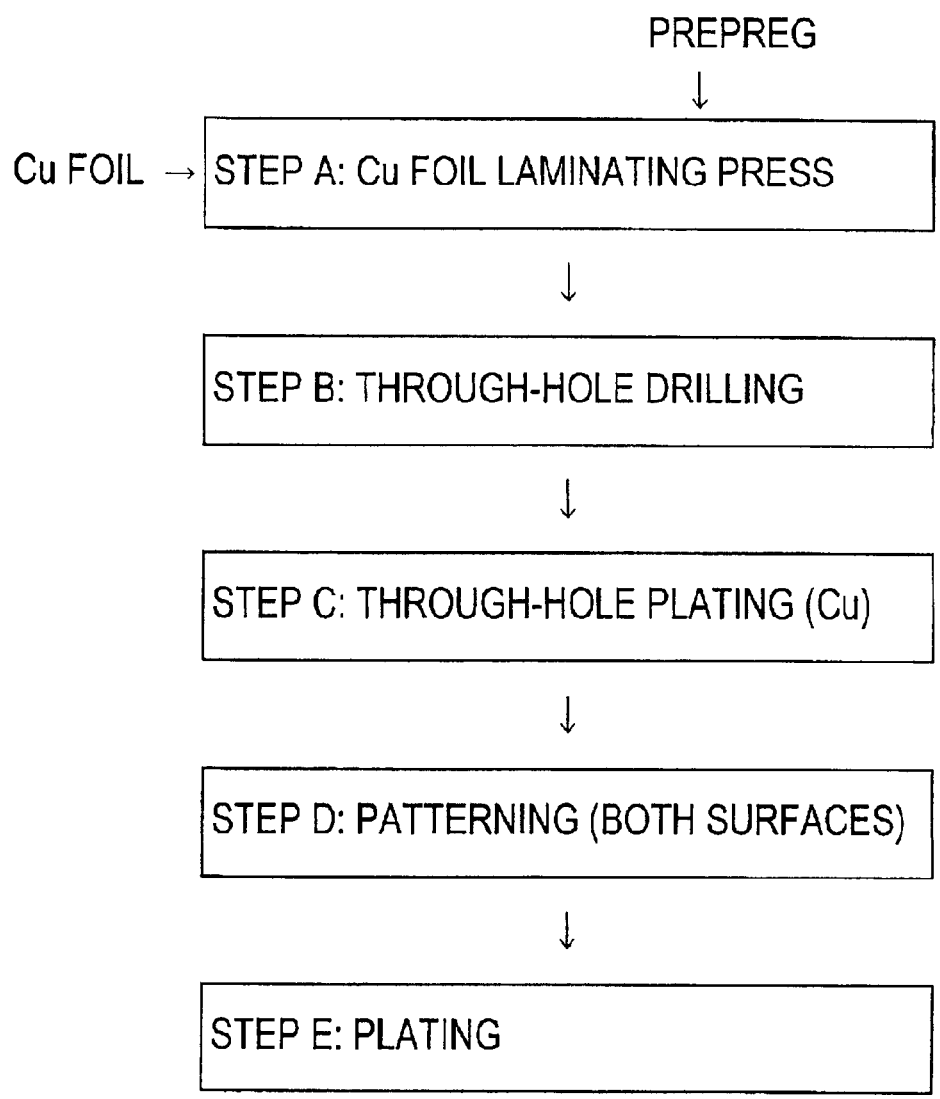
FIGS. 83 and 84 illustrate steps of a process for forming a copper foil-clad substrate.
Figure 84:
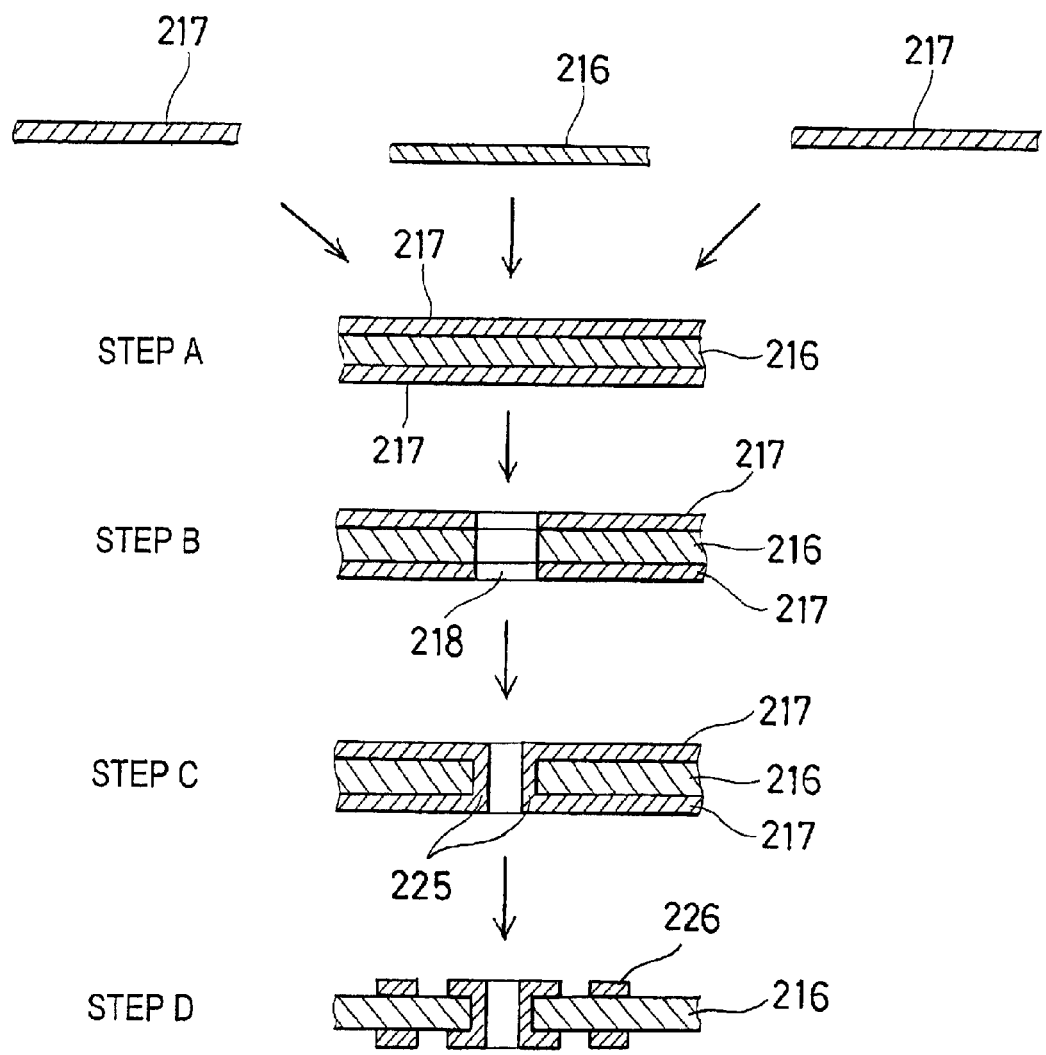

FIGS. 83 and 84 illustrate steps of an exemplary process of preparing a double side patterned substrate. As shown in FIGS. 83 and 84, in step A, a prepreg sheet 216 of a predetermined thickness is sandwiched between a pair of copper (Cu) foils 217 of a predetermined thickness and lamination press. In step B, through holes are drilled in the structure (only one through hole 218 shown in FIG. 83). In step C, copper (Cu) is plated to the through hole 218 to form a plating film 225. Then in step D, both the copper foils 217 are patterned to form conductor patterns 226. Thereafter, in step E, plating is effected for connection to external terminals as shown in FIG. 83. The last-mentioned plating may be Ni plating followed by Pd plating, or Ni plating followed by Au plating (plating may be either electrolytic or electroless plating), or carried out using a solder leveler.

Figure 85:
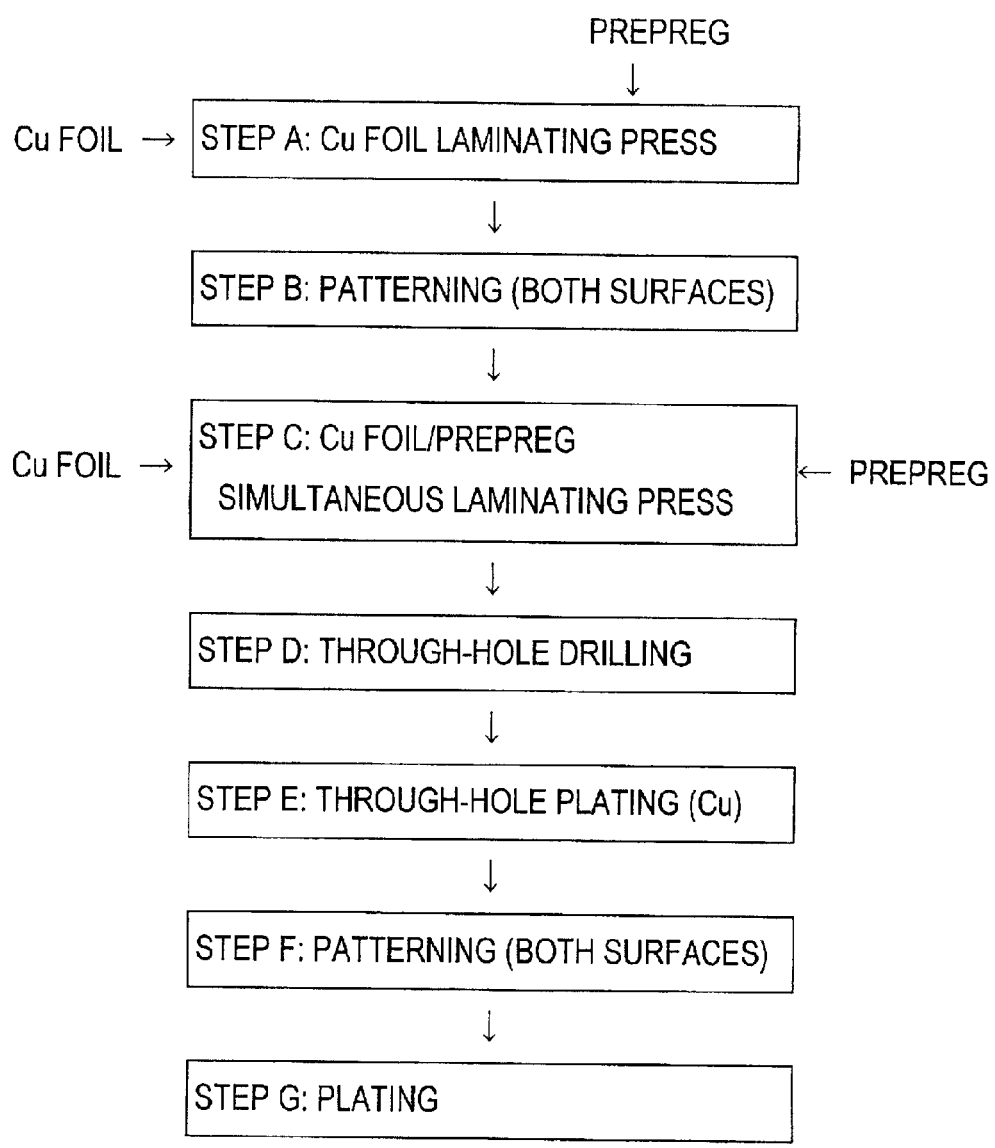
FIGS. 85 and 86 illustrate steps of a process for forming a multilayer substrate.
Figure 86:
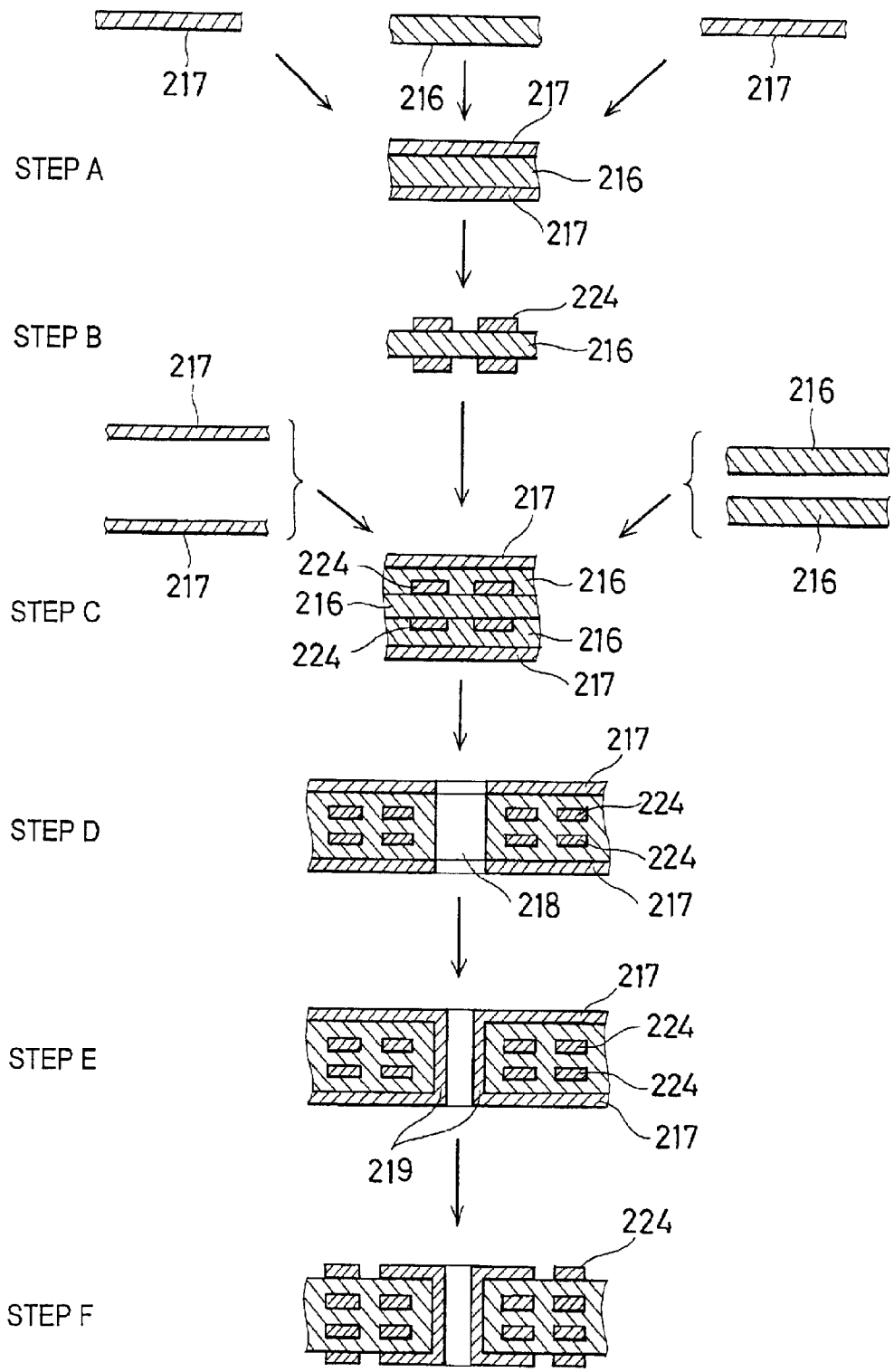
Figure 87A:
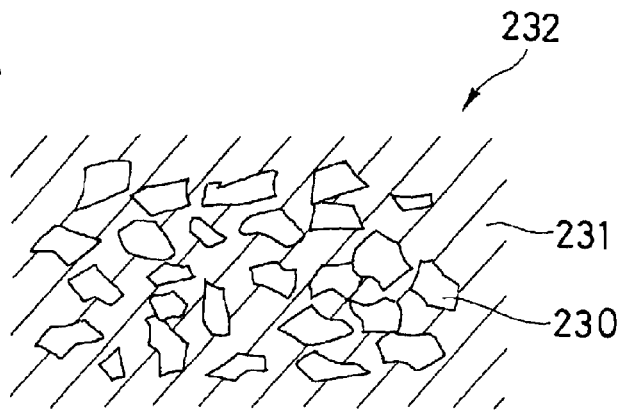
FIG. 87A is a fragmentary cross section of a composite dielectric material, 87B is a fragmentary cross section of a laminate substrate, and 87C is a fragmentary cross section of an electronic part.
Figure 87B:
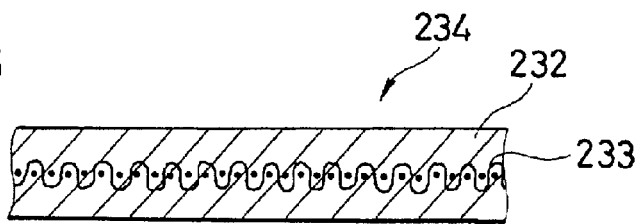
Figure 87C:
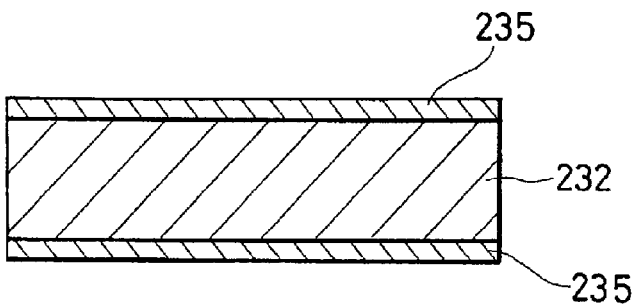
Figure 88A:
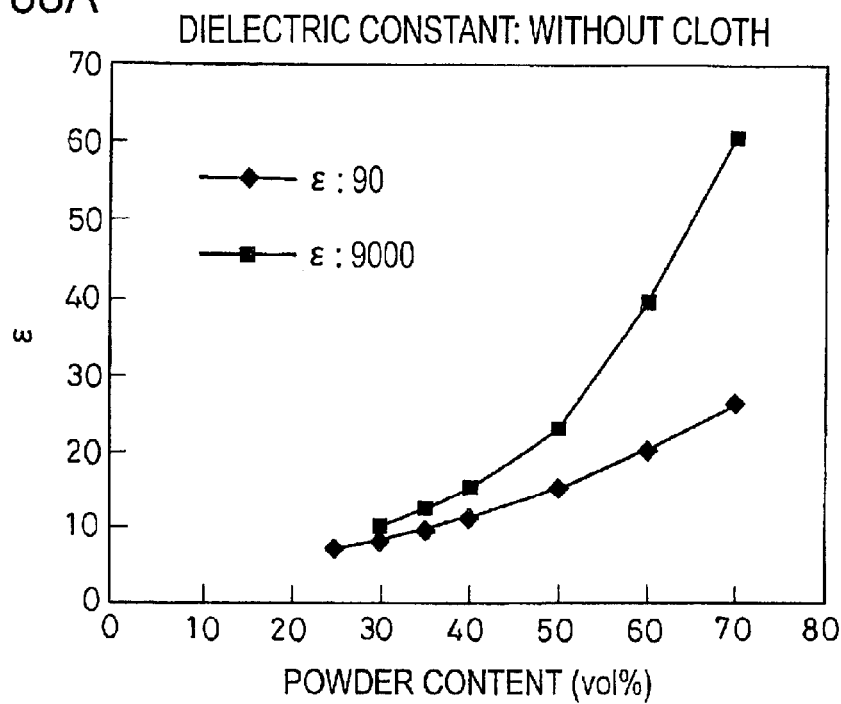
FIG. 88A is a graph showing the dielectric constant versus powder content of glass cloth-free composite material, and 88B is a graph showing the dielectric constant versus powder content of glass cloth-embedded composite material.
Figure 88B:
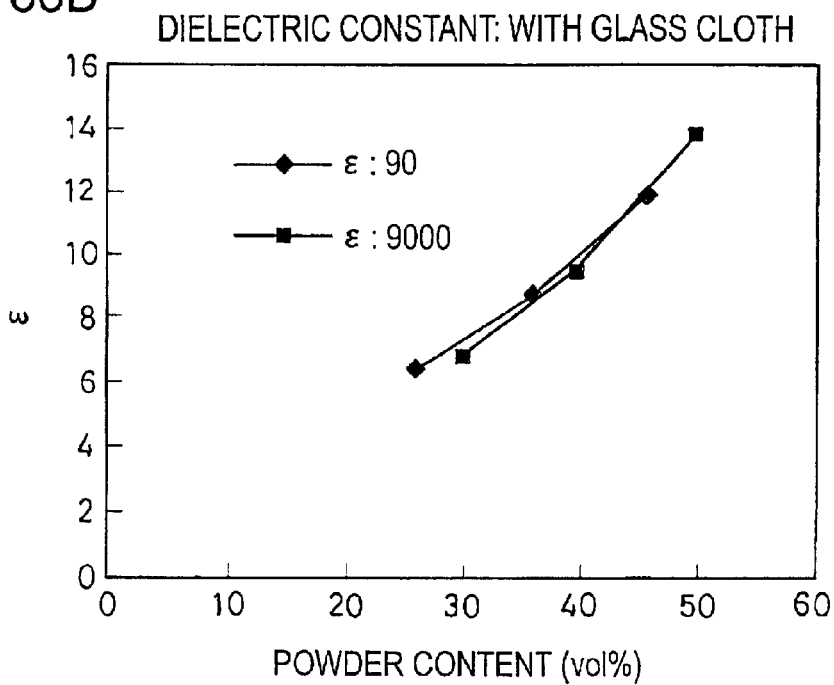

FIGS. 85 and 86 illustrate steps of an exemplary process of preparing a multilayer substrate in which four layers are stacked. As shown in FIGS. 85 and 86, in step A, a prepreg sheet 216 of a predetermined thickness is sandwiched between a pair of copper (Cu) foils 217 of a predetermined thickness and lamination press. Then in step B, both the copper foils 217 are patterned to form conductor patterns 224. In step C, on each of opposite surfaces of the double side patterned substrate thus obtained, a prepreg sheet 216 of a predetermined thickness and a copper foil 217 are placed, followed by simultaneous lamination press. In step D, through holes are drilled in the structure (only one through hole 218 shown in FIG. 86). In step E, copper (Cu) is plated to the through hole 218 to form a plating film 219. Then in step F, both the outside copper foils 217 are patterned to form conductor patterns 224. Thereafter, in step G, plating is effected for connection to external terminals as shown in FIG. 85. The last-mentioned plating may be Ni plating followed by Pd plating, or Ni plating followed by Au plating (plating may be either electrolytic or electroless plating), or carried out using a solder leveler.

The heat compression molding conditions include a temperature of 100 to 200° C., a pressure of $9.8 \times 10^5$ to $7.84 \times 10^6$ Pa (10 to 80 kgf/cm$^2$), and a time of 0.5 to 20 hours.

The invention is not limited to the above-illustrated substrates, and a substrate of any desired structure can be formed. For example, using a substrate serving as a molding material, a copper foil-clad substrate and a prepreg, a multilayer structure can be formed while the prepreg serves as a bonding layer.

In the embodiment wherein a prepreg or a substrate serving as a laminating press is bonded to a copper foil, a paste of composite dielectric material or composite magnetic material obtained by milling the composite dielectric material or composite magnetic material, optional flame retardant and resin in a high-boiling solvent such as butylcarbitol acetate may be applied onto a patterned substrate by a screen printing or similar technique. This procedure is effective for improving characteristics.

Multilayer electronic parts to be described later can be fabricated by combining the prepreg, copper foil-clad substrate and multilayer substrate with a device design pattern and other constituent materials.

Examples of the invention are given below by way of illustration and not by way of limitation.

EXAMPLE

Example 1-1

Glass Cloth-loaded Prepreg and Copper-clad Magnetic Substrate

FIG. 6 is a graph showing the magnetic permeability ($\mu'$ or $\mu''$) versus frequency of composite magnetic materials obtained by mixing barium titanate-coated iron particles prepared by the spray pyrolysis process using an apparatus as shown in FIG. 2 with an epoxy resin according to the invention, in comparison with those of comparative materials. The samples within the scope of the invention were prepared by dissolving titanyl, barium and iron salts in water in such amounts that barium titanate was 10 wt % based on iron and heat spraying the resulting aqueous solution into barium titanate-coated iron particles having a mean particle size of 0.6 µm. The iron powder was mixed with an epoxy resin in such amounts to give an iron powder content of 40 vol %, followed by molding. The epoxy resin used contained each 26.99 wt % of epi-bis type epoxy resins (Epikote 1001 and Epikote 1007 by Yuka Shell Epoxy K.K.) as a polyfunctional epoxy resin, 23.1 wt % of a bisphenol A type high molecular weight epoxy resin (Epikote 1225 by Yuka Shell Epoxy K.K.), and 23.1 wt % of a tetraphenylol-ethane type epoxy resin (Epikote 1031S by Yuka Shell Epoxy K.K.) as an epoxy resin having a special skeleton. To the epoxy resin were added a bisphenol A type novolac resin (YLH129B65 by Yuka Shell Epoxy K.K.) as a curing agent and an imidazole compound (2E4MZ by Shikoku Chemicals K.K.) as a curing accelerator.

In a ball mill loaded with an appropriate amount of steel balls, 10 wt % of the resin component and 90 wt % of the magnetic metal particles prepared by the foregoing procedure were milled and dispersed along with a mixture of toluene and methyl ethyl ketone, yielding a magnetic metal powder mixed solution.

The solution resulting from the above step was formed into a sheet by a doctor blade technique, and dried into a prepreg. A predetermined number of prepreg sheets and glass cloths were alternately stacked, followed by heat compression molding into a composite magnetic substrate (prepreg) having a thickness of about 0.4 mm.

Comparative Example 1—1 was a mixture of 40 vol % of ferrite having an initial magnetic permeability of 700 and an epoxy resin.

Comparative Example 1-2 was a mixture of 40 vol % of ferrite having an initial magnetic permeability of 10 and an epoxy resin.

As seen from FIG. 6, the inventive samples exhibit higher values of $\mu'$ over the range from 10 MHz to 1 GHz than the comparative samples, indicating that the inventive samples had improved high-frequency characteristics.

Figure 7:
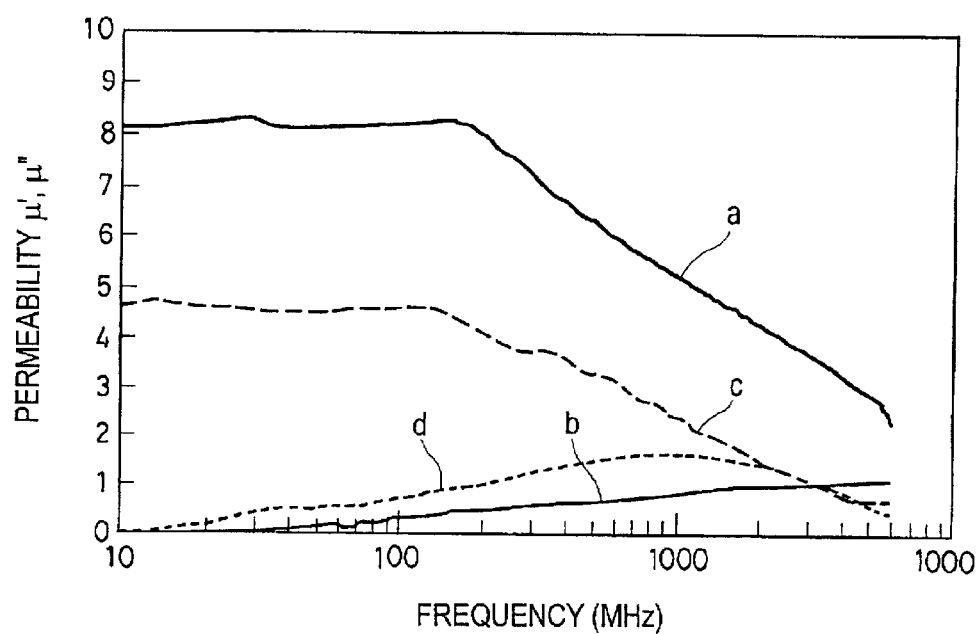
FIG. 7 graphically illustrates the magnetic permeability versus frequency of inventive and comparative composite magnetic materials used in bead devices.

FIG. 7 is a graph showing the magnetic permeability ($\mu'$ or $\mu''$) versus frequency of composite magnetic materials in which iron was used as the metal particles and sodium-boron-zinc base glass was used as the dielectric layer 2a. The glass was coated in a coating weight of 20 wt % based on iron. The content of the particles in an epoxy resin was 40 vol % as in the above example.

Figure 8:
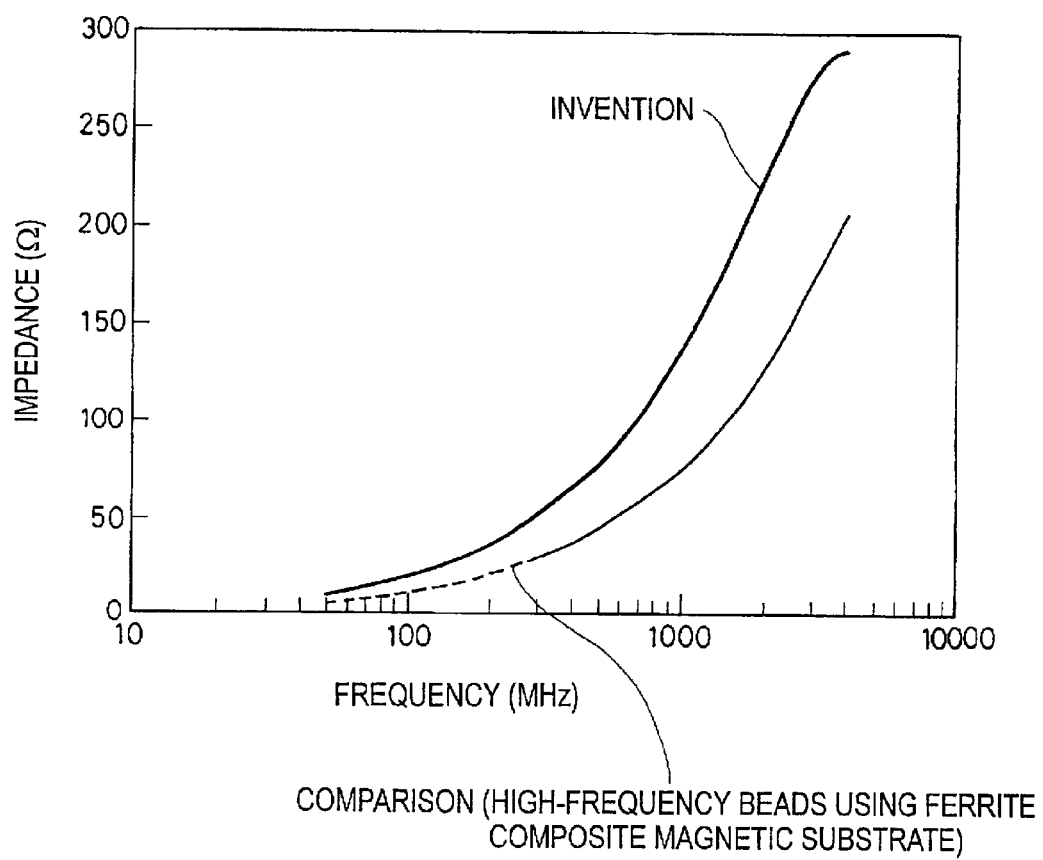
FIG. 8 graphically illustrates the impedance versus frequency of bead devices based on inventive and comparative composite dielectric materials.

As seen from FIG. 7, the composite magnetic materials have satisfactory high-frequency characteristics as compared with composite magnetic materials using ferrite. FIG. 8 is a graph showing the impedance versus frequency of high-frequency bead devices in which a copper foil was used to form a coil on a substrate, with an inventive device using glass-coated magnetic metal particles and a prior art chip bead device using ferrite as magnetic particles. As also seen from FIG. 8, the inventive device has a higher impedance in the high-frequency region and a better noise-removing effect.

Although a glass cloth-loaded composite magnetic substrate is illustrated as an example of the invention, the invention is also applicable to a composite magnetic substrate free of glass cloth.

Example 1-2

Magnetic Molding Material (Shield Member)

For use in an exemplary shield member as shown in FIG. 3B, metal particles were prepared by the spray pyrolysis process so that a $BaTiO_3$ layer might deposit on the surface of nickel cores. The $BaTiO_3$ layer was deposited such that $BaTiO_3$ was 1 wt % or 10 wt % based on nickel. On x-ray diffraction analysis, the coated metal particles were found to consist of nickel and $BaTiO_3$. The particles had a particle size distribution of 0.1 to 1.3 μm and a mean particle size of 0.6 μm.

Figure 9:
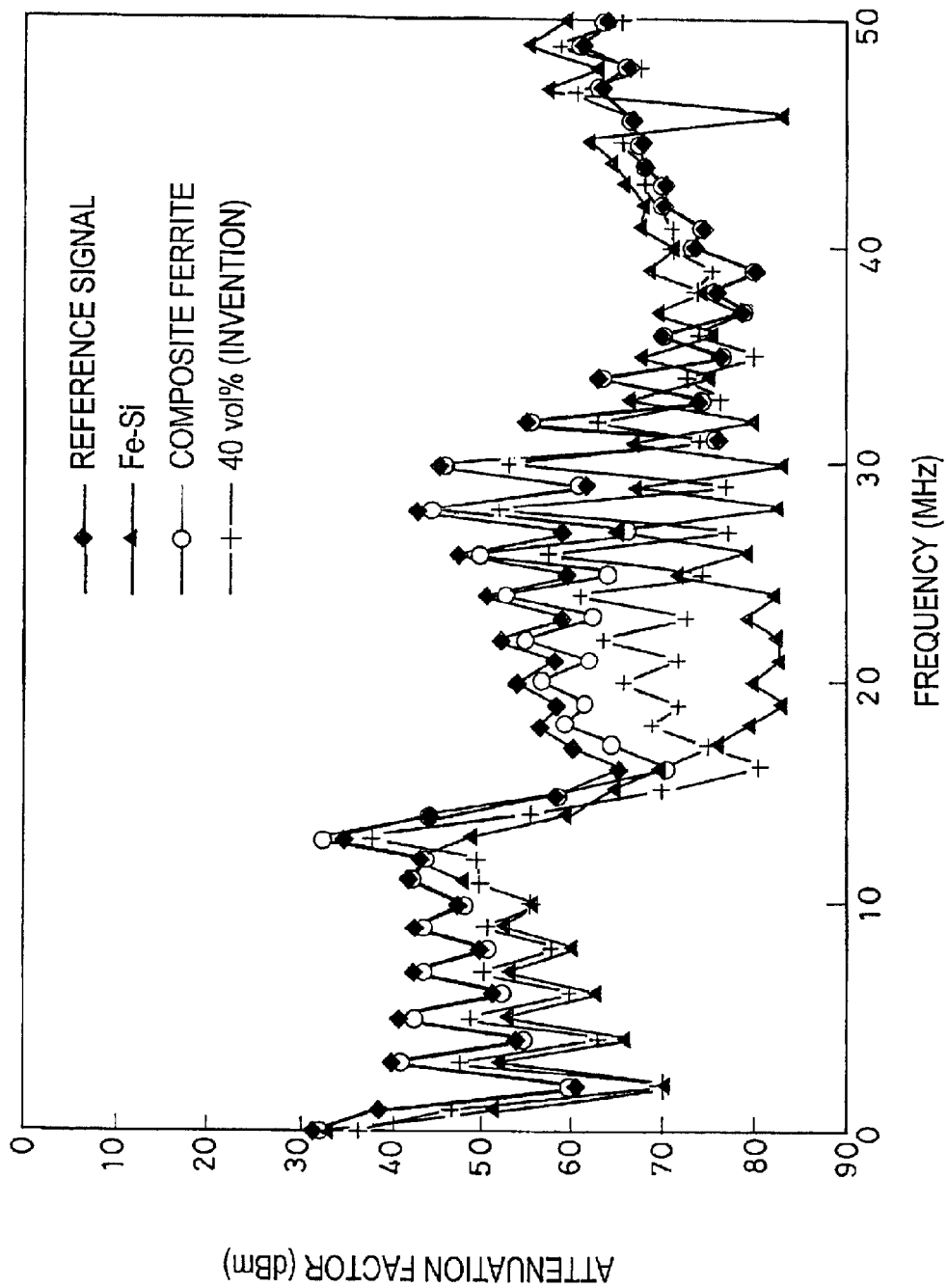
FIG. 9 graphically illustrates the attenuation versus frequency of shield members based on inventive and comparative composite dielectric materials.

In a ball mill, the thus prepared metal particles were mixed and dispersed in a liquid epoxy resin in such amounts as to give a metal particle content of 40 vol %. The dispersion was formed into a sheet of 200 μm thick by a doctor blade technique, and dried into a magnetic shield sample. From an observation under FE-SEM and measurements of insulation resistance and withstanding voltage (Table 1—1), it was found that $BaTiO_3$ existed on the surface of nickel particles and served as an insulating film. With respect to the shielding effect, as seen from FIG. 9, the inventive sample is comparable to prior art shielding materials. For the evaluation of the shielding effect, a shield member was disposed between a noise source and a detector, the radio signals transmitted into the air by the noise source were detected by the detector through the shield member, and the attenuation of radio signal was plotted relative to frequency. In the graph of FIG. 9, the reference signal is a signal level obtained in the absence of the shield member, and Fe—Si and composite ferrite are comparative examples in the form of composite magnetic materials using Fe—Si and ferrite as powder, respectively.

Example 1-3

Magnetic Paint

The composite magnetic material of the invention enables supply of a variety of magnetic paints such as printing paint adapted for screen printing. A magnetic paint was prepared by dissolving titanyl, barium and iron salts in water in such amounts that barium titanate was 10 wt % based on iron and heat spraying the resulting aqueous solution into barium titanate-coated iron particles having a mean particle size of 0.6 μm as in Example 1-1. The iron powder was mixed with an ethyl cellulose resin along with a mixture of butyl carbitol and terpineol. Specifically, the ingredients were mixed and dispersed in a ball mill using steel balls. The composition was such that the coated metal particles were 40 vol % in the ethyl cellulose resin.

By a screen printing technique, the paint was repeatedly applied to a thickness of 0.1 mm. The magnetic permeability (μ' and μ") versus frequency of the laminate was examined, obtaining substantially the same response as the magnetic substrate of Example 1—1. Like Example 1—1, the inventive magnetic paint has higher values of μ' over the range of 10 MHz to 1 GHz, indicating satisfactory high-frequency characteristics. The results are shown in Table 1-2.

Separately, the paint could be molded by a casting or similar technique.

Example 1-4

Magnetic Powder Compression Molding Material

When a heat compression molding technique is employed, the composition magnetic material of the invention enables to increase the amount of coated metal particles added to a resinous material and to provide a magnetic molded article having a high magnetic permeability and improved insulation.

Barium titanate-coated iron particles having a mean particle size of 0.6 μm were prepared by dissolving titanyl, barium and iron salts in water in such amounts that barium titanate was 10 wt % based on iron and heat spraying the resulting aqueous solution as in Example 1—1. The powder, 3 wt %, was mixed with an epoxy resin. Using a mold having an outer diameter of 7 mm and an inner diameter of 3 mm, the mixture was press molded at 180° C. and 500 kPa into a toroidal magnetic compact, which was examined for magnetic characteristics. Because of high loading, there was obtained a composite magnetic material having a high magnetic permeability and practically acceptable insulation. The results are shown in Table 1-2.

By further adding a glass component or using a glass component having a low melting point as the coating insulating layer, and effecting firing after molding, there can be obtained a composite magnetic material having improved heat resistance.

TABLE 1-1

| Sample No. | Core metal | Dielectric layer | Insulation resistance (Ω-cm) | Breakdown voltage (V) |
|---|---|---|---|---|
| 1 | Ni | 10% $BaTiO_3$ | >$10^{12}$ | 2200 |
| 2 | Ni | 1% $BaTiO_3$ | >$10^{12}$ | 1500 |

TABLE 1-2

| Core metal | Dielectric layer | Permeability μ' @ 100 MHz | Insulation resistance (Ω-cm) | Breakdown voltage (V/mm) |
|---|---|---|---|---|
| E1 | Fe | 10% $BaTiO_3$ | 8.2 | >$10^{12}$ | 2200 |
| E2 | Fe | 10% $BaTiO_3$ | 8.6 | >$10^{12}$ | 2100 |
| E3 | Fe | 10% $BaTiO_3$ | 13.7 | >$10^{12}$ | 800 |

Example 2-1

Nickel nitrate hexahydrate was dissolved in water so as to give a Ni concentration of 50 g/l. Then barium nitrate and titanyl nitrate were added to the solution so as to give a concentration of 1 wt %, 10 wt %, 20 wt % and 40 wt % based on nickel of $BaTiO_3$, forming starting solutions. Using an apparatus as shown in FIG. 2, each of the aqueous solutions was sprayed into fine droplets and introduced along with a weakly reducing carrier gas into the furnace core tube 4 heated at 1500° C. The droplets were pyrolyzed whereby metal particles of nickel cores having $BaTiO_3$ deposited on the surface thereof are formed. On x-ray diffraction analysis, the thus coated metal particles were found to consist of nickel and $BaTiO_3$. The particles had a particle size distribution of 0.1 to 1.3 μm and a mean particle size of 0.6 μm.

The dielectric-coated nickel particles were blended with an epoxy resin so as to give a nickel particle content of 30 vol %, 40 vol % and 50 vol %, and dispersed along with a solvent in a ball mill. The dispersion was formed into sheets of 0.2 mm thick by a doctor blade technique, and dried at 70 to 80° C. for one hour. A plurality of the sheets are stacked. Electrolytic copper foils were placed on opposite surfaces of the stack, which was press molded and cured under a pressure of 2,000 to 3,000 kPa and a temperature of 180° C.

for 30 minutes, obtaining a sheet of 0.6 mm thick. Using a die, the sheet was punched into a disc having a diameter of about 5 mm.

As comparative examples, sheets were similarly prepared using a dispersion in an epoxy resin of uncovered nickel particles prepared by the spray pyrolysis process, a dispersion in an epoxy resin of a dielectric powder having a dielectric constant $\epsilon$ of 9,000 or 90, and only an epoxy resin. They were similarly tested.

Figure 10:
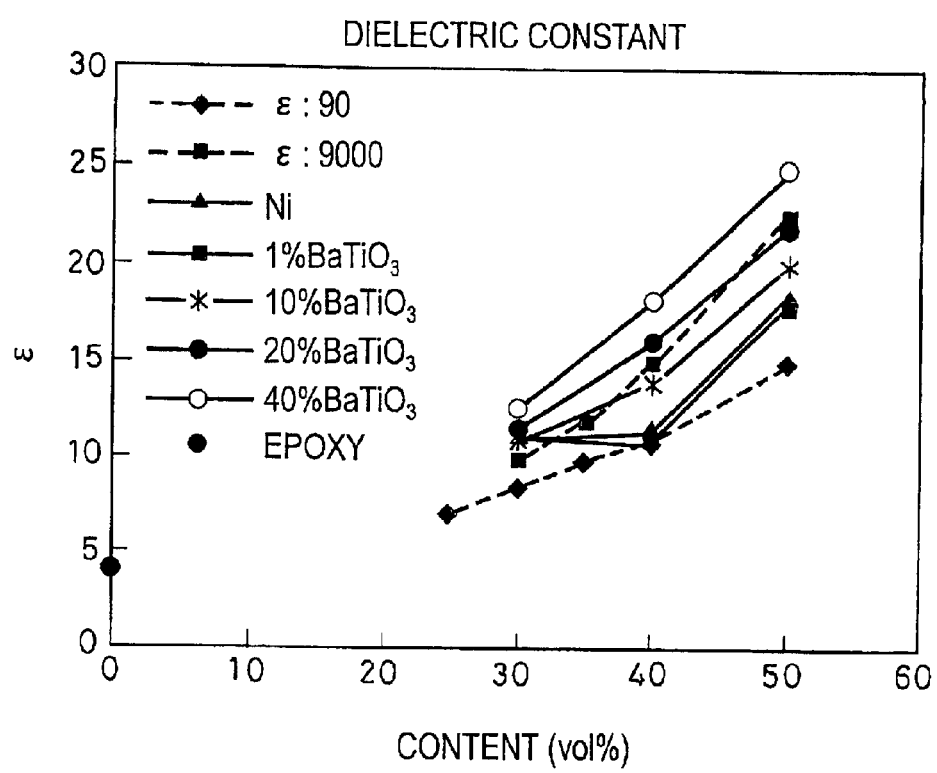
FIG. 10 graphically illustrates the relationship of dielectric constant to the coated particle content and the ratio of metal particle to dielectric in the inventive composite dielectric materials.

The above-prepared discs were measured for capacitance by an impedance material analyzer (HP4921A by Hewlett Packard) and a dielectric constant was computed from the capacitance, with the results plotted in the graph of FIG. 10. As seen from FIG. 10, the dielectric constant is increased by mixing and dispersing nickel particles or dielectric-coated nickel particles in a resin.

In addition to the samples shown in FIG. 10, there were prepared sample No. 21 using coated particles consisting of 10 wt % $BaTiO_3$—$SiO_2$ and 90 wt % Ni and sample No. 24 using coated particles consisting of 1 wt % $Al_2O_3$ and 99 wt % Ni in which the content of particles added to the epoxy resin was 40 vol %. Table 2 shows the resultant dielectric constant, insulation resistance and withstanding voltage of these samples.

As seen from Table 2, sample No. 22 using coated particles consisting of 10 wt % $BaTiO_3$ and 90 wt % Ni exhibits a dielectric constant approximately equal to a composite material having dispersed a dielectric powder with a dielectric constant $\epsilon$ of 9,000 and greater than a composite material having dispersed a dielectric powder with a dielectric constant $\epsilon$ of 90. It exhibits a substantially equal dielectric constant although the substantial volume of the dielectric on the surface of metal particles is reduced by about 90% as compared with a prior art dispersion of dielectric powder. Based on this fact, it is presumed that electrodes resulting from metal particles are formed in the interior and combined in such an arrangement as to increase their capacitance.

It is seen from sample Nos. 22 and 23 in Table 2 that when the thickness of the dielectric layer 2b deposited on the surface of metal particles 1 is changed by changing the weight thereof upon blending, the dielectric constant and withstanding voltage increase with the increasing weight or thickness of the dielectric layer.

Figure 11:
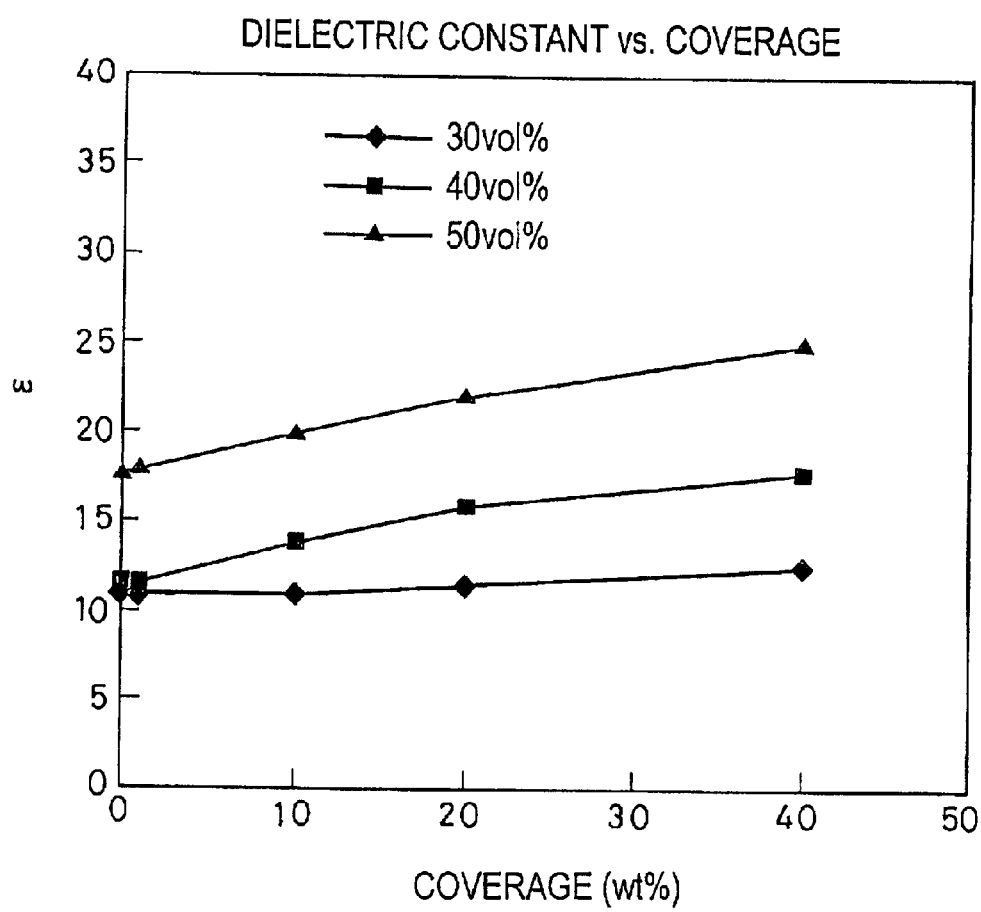
FIG. 11 graphically illustrates the dielectric constant versus coating weight of composite dielectric materials.

Table 3 shows the dielectric constant, insulation resistance and withstanding voltage of composite materials in which the amount of dielectric ($BaTiO_3$) added to nickel particles is changed and the content of coated particles is changed. FIG. 11 is a graph showing the dielectric constants in Table 3. As seen from Table 3 and FIG. 11, as the coating weight of dielectric on nickel particles increases, the composite materials increase their dielectric constant except for those composite materials in which the content of particles coated with 1 wt % and 10 wt % of dielectric is 30 vol %. The insulation resistance of composite material to be taken into account for use as a multilayer substrate is insufficient when the content of nickel particles which are not covered with dielectric is 50 vol % based on the resin.

However, as long as a dielectric is added to metal particles even in an amount of 1 wt %, the resulting composite material has an insulation resistance on a practically acceptable level ($10^{11}$ Ω-cm) even when the content of dielectric-coated nickel particles in the resin is 50 vol %. The withstanding voltage which is important for use as a multilayer substrate increases as the coating weight of dielectric increases. This tendency is outstanding except for a powder content of 50 vol %. The composite materials of the invention exhibit a sufficient dielectric constant, high insulation and withstanding voltage even when the powder content is 50 vol %.

TABLE 2

| Sample No. | Core metal | Dielectric layer | Resultant dielectric constant | Insulation resistance (Ω-cm) | Withstanding voltage (V) |
|---|---|---|---|---|---|
| 21 | Ni | 10% $BaTiO_3$ + $SiO_2$ | 12 | >$10^{12}$ | 2200 |
| 22 | Ni | 10% $BaTiO_3$ | 14 | >$10^{12}$ | 1500 |
| 23 | Ni | 1% $BaTiO_3$ | 11 | >$10^{12}$ | 1100 |
| 24 | Ni | 1% $Al_2O_3$ | 11 | >$10^{12}$ | 1400 |
| 25 | Ni | — | 11 | >$10^{12}$ | 500 |
| Ref 21 | — | epoxy resin | 4 | >$10^{12}$ | 3200 |
| Ref 22 | — | $\epsilon s$ = 9000 | 15 | >$10^{12}$ | — |
| Ref 23 | — | $\epsilon s$ = 90 | 12 | >$10^{12}$ | — |

TABLE 3

| Powder shape | Assessment Item | Powder content | | |
|---|---|---|---|---|
| | | 30 vol % | 40 vol % | 50 vol % |
| Ni | Properties Dielectric constant | 11 | 11 | 11 |
| | Insulation resistance (Ω-cm) | >$10^{12}$ | >$10^{12}$ | $10^5$ |
| | Withstanding voltage (V/mm) | 1100 | 500 | 0 |
| 1 wt %-$BaTiO_3$ | Properties Dielectric constant | 11 | 11 | 18 |
| | Insulation resistance (Ω-cm) | >$10^{12}$ | >$10^{12}$ | $10^{11}$ |
| | Withstanding voltage (V/mm) | 1100 | 1100 | 150 |
| 10 wt %-$BaTiO_3$ | Properties Dielectric constant | 11 | 14 | 20 |
| | Insulation resistance (Ω-cm) | >$10^{12}$ | >$10^{12}$ | $10^{11}$ |
| | Withstanding voltage (V/mm) | 1800 | 1500 | 150 |
| 20 wt %-$BaTiO_3$ | Properties Dielectric constant | 11.5 | 16 | 22 |
| | Insulation resistance (Ω-cm) | >$10^{12}$ | >$10^{12}$ | >$10^{12}$ |
| | Withstanding voltage (V/mm) | 1800 | 1500 | 500 |
| 40 wt %-$BaTiO_3$ | Properties Dielectric constant | 12.5 | 18 | 25 |
| | Insulation resistance (Ω-cm) | >$10^{12}$ | >$10^{12}$ | >$10^{12}$ |
| | Withstanding voltage (V/mm) | 1800 | 1500 | 500 |

Example 3-1

Figure 12:
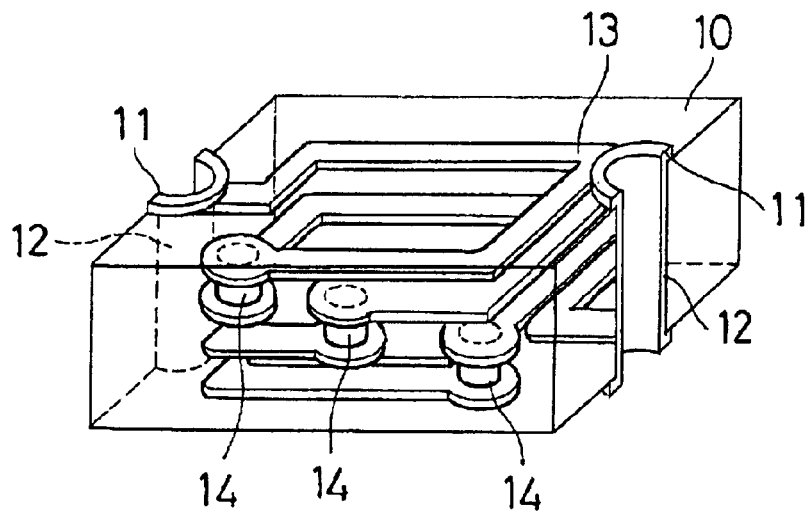
FIGS. 12 and 13 illustrate an inductor as one exemplary multilayer electronic part of the invention.
Figure 13:
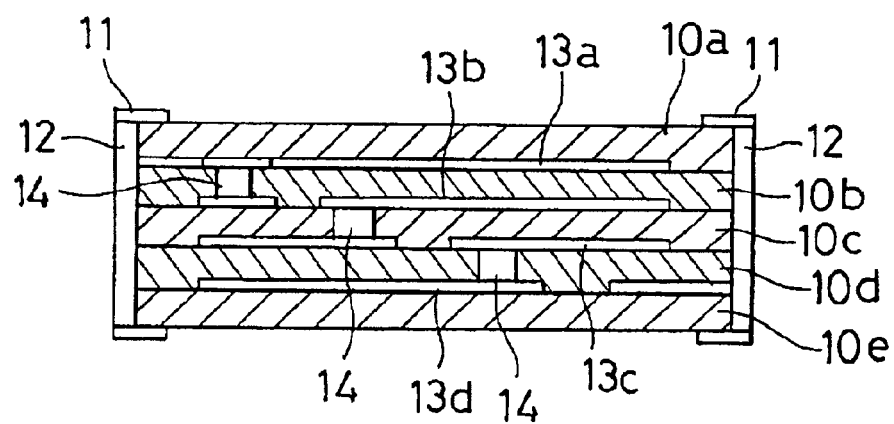

FIGS. 12 and 13 illustrate an inductor according to one embodiment of the invention. FIG. 12 is a see-through perspective view and FIG. 13 is a cross-sectional view.

In FIGS. 12 and 13, the inductor 10 includes constituent layers 10a to 10e of the above-mentioned composite magnetic material. That is, the constituent layers 10a to 10e are constructed by the composite magnetic material in which generally spherical magnetic metal particles of at least one type consisting essentially of single crystal grains having a mean particle size of 0.1 to 10 μm which are coated on the surface with an insulating layer are dispersed in a resin.

The constituent layers 10a to 10e have internal conductors (coil patterns) 13 and via holes 14 for providing electrical connection to the internal conductors 13. The internal conductors 13 are formed by applying copper, gold, silver, palladium, platinum, aluminum or a laminate thereof or an alloy thereof on the surface of each layer 10a to 10e by etching, printing, sputtering, evaporation or plating. The internal conductors 13 are interconnected by the via holes 14 and as a whole, wound upward in a lamination direction to form a helical inductor. Via holes 14 can be formed by drilling, laser machining, etching or the like. The ends of each coil formed are connected to terminal electrodes 12 formed along end surfaces of the inductor 10 and land patterns 11 formed slightly above or below the terminal electrodes 12. The terminal electrode 12 has a half-cut structure by dicing or V-cutting. This is because a plurality of devices are formed in a collective substrate which is eventually cut into discrete chips along lines at the centers of through-vias 12.

Figure 21A:
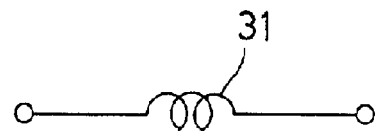
FIGS. 21A and 21B are equivalent circuit diagrams of the inductors.

An equivalent circuit is shown in FIG. 21A. As seen from FIG. 21A, an electronic part (inductor) having a coil 31 is illustrated in the equivalent circuit.

Example 3-2

Figure 14:
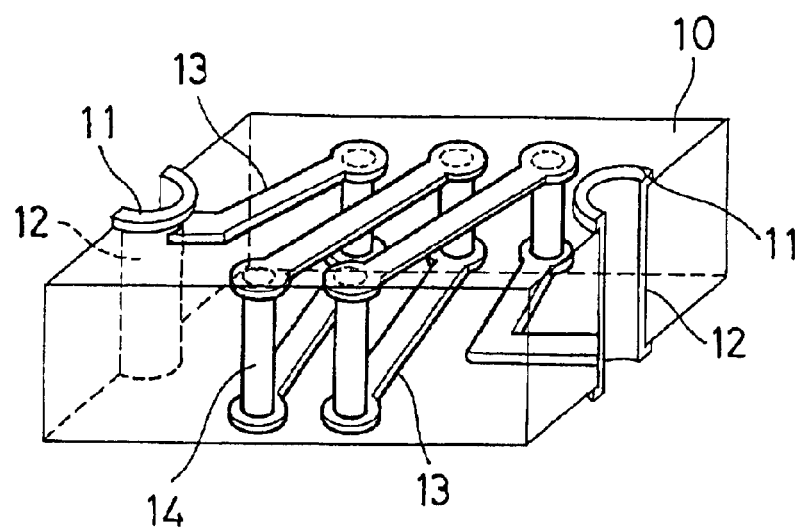
FIGS. 14 and 15 illustrate an inductor as another exemplary multilayer electronic part of the invention.
Figure 15:
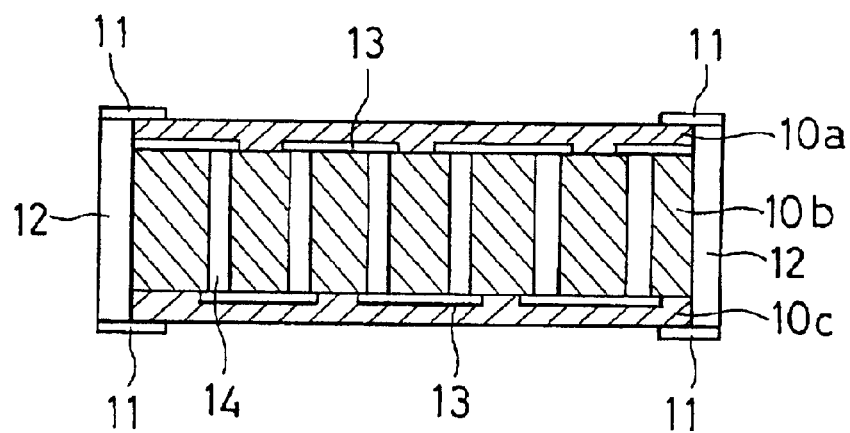

FIGS. 14 and 15 illustrate an inductor according to a further embodiment of the invention. FIG. 14 is a see-through perspective view and FIG. 15 is a cross-sectional view.

In this example, the coil pattern which is wound and stacked in a vertical direction in Example 3-1 is changed to a helical coil which is wound in a lateral direction. The remaining components are the same as in Example 3-1. The same components are designated by like numerals and their description is omitted. The base substrate material, electrode forming method, layer forming method, via forming method and terminal forming method in Example 3-2 are the same as in Example 3-1.

Example 3-3

Figure 16:
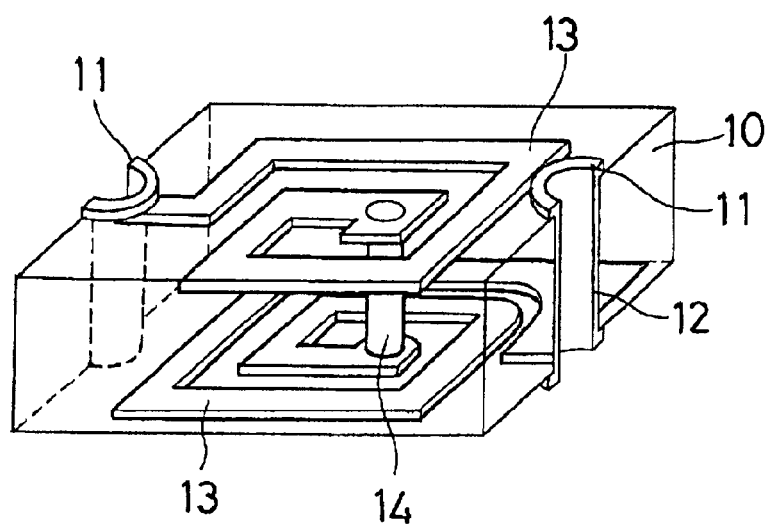
FIGS. 16 and 17 illustrate an inductor as a further exemplary multilayer electronic part of the invention.
Figure 17:
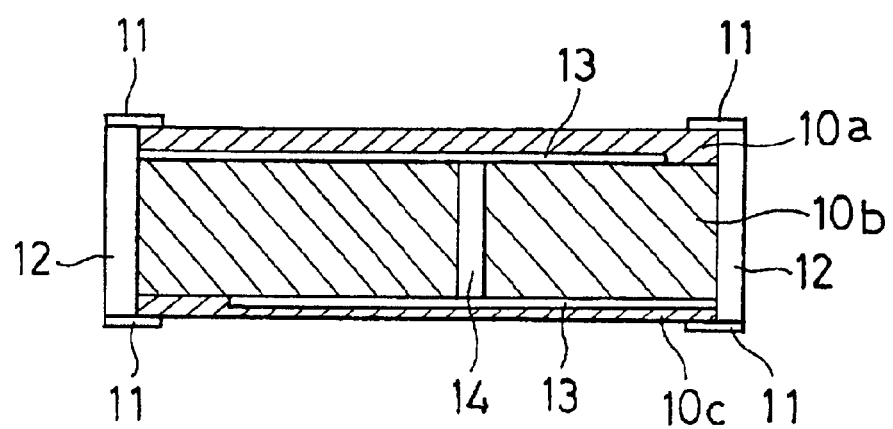

FIGS. 16 and 17 illustrate an inductor according to a further embodiment of the invention. FIG. 16 is a see-through perspective view and FIG. 17 is a cross-sectional view. In this example, the coil pattern which is wound and stacked in a vertical direction in Example 3-1 is changed such that upper and lower spiral coils are connected. The remaining components are the same as in Example 3-1. The same components are designated by like numerals and their description is omitted. The chip inductor of Example 3-3 has an increased inductance value because the internal conductors 13 are constructed in a spiral form and connected by the via hole 14. The base substrate material, electrode forming method, layer forming method, via forming method and terminal forming method in Example 3-3 are the same as in Example 3-1.

Example 3-4

Figure 18:
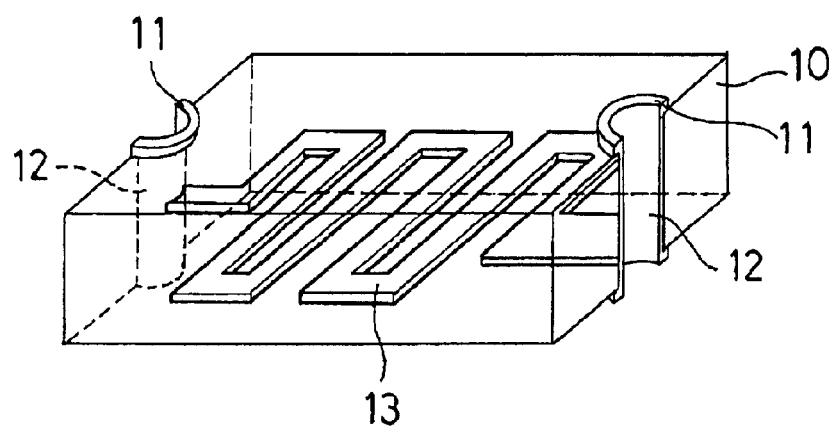
FIGS. 18 and 19 illustrate an inductor as a still further exemplary multilayer electronic part of the invention.
Figure 19:
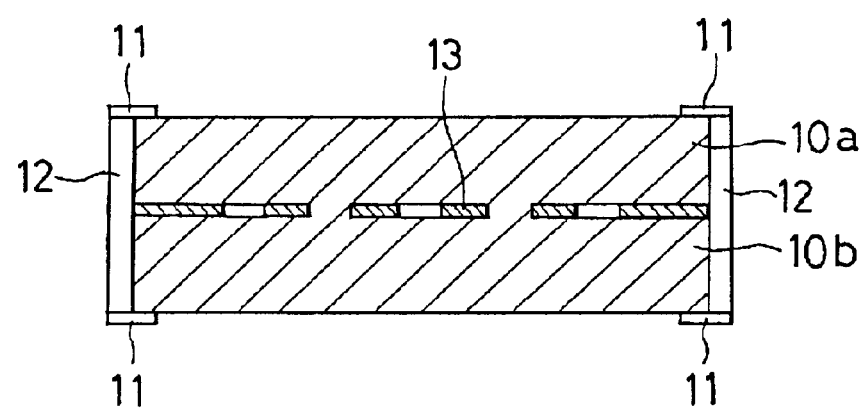

FIGS. 18 and 19 illustrate an inductor according to a further embodiment of the invention. FIG. 18 is a see-through perspective view and FIG. 19 is a cross-sectional view. In this example, the coil pattern which is wound and stacked in a vertical direction in Example 3-1 is changed to an internal meander coil. The remaining components are the same as in Example 3-1. The same components are designated by like numerals and their description is omitted. The base substrate material, electrode forming method, layer forming method, via forming method and terminal forming method in Example 3-4 are the same as in Example 3-1.

Example 3-5

Figure 20:
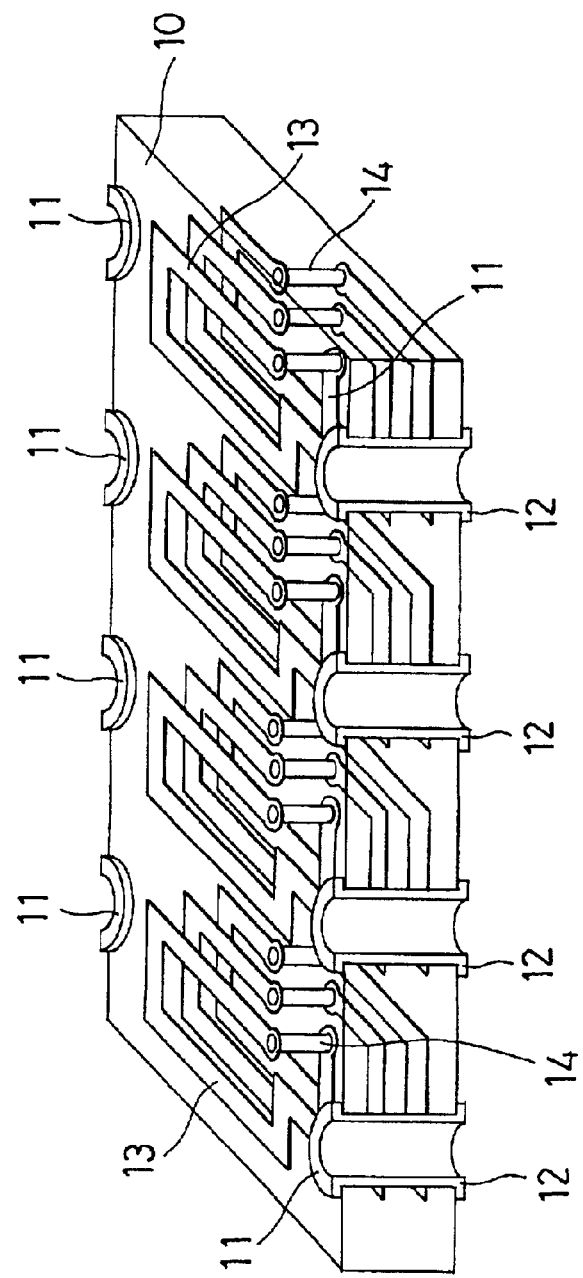
FIG. 20 illustrates an inductor as a yet further exemplary multilayer electronic part of the invention.
Figure 21B:
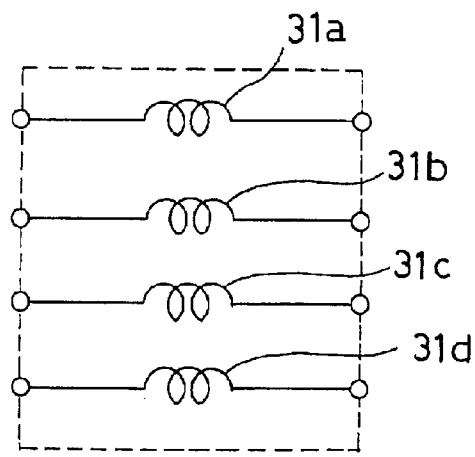

FIG. 20 is a see-through perspective view of an inductor according to a further embodiment of the invention. In this example, the single coil in Example 3-1 is changed to an array of four juxtaposed coils. This array achieves a space saving, reduces the size of a set, and reduces the number of parts. The remaining components are the same as in Example 3-1. The same components are designated by like numerals and their description is omitted. The equivalent circuit is shown in FIG. 21B. As shown in FIG. 21B, an electronic part (inductor array) having four coils 31a to 31d is illustrated in the equivalent circuit.

Since the inductors shown in Examples 3-1 to 3-5 use the magnetic material in which generally spherical magnetic metal particles consisting essentially of single crystal grains which are coated on the surface with an insulating layer are mixed and dispersed in a resin, there is obtained a chip inductor having high insulation, a higher magnetic permeability than ferrite, and a high inductance or impedance value even at high frequencies. Since the particles dispersed in a resin are generally spherical metal particles, there are obtained advantages including good dispersion, easy working and desired characteristics. The use of a resin leads to a light weight and flexibility. A structure of multiple layers of different materials is more flexible than ceramics and unsusceptible to crack, peel and warp problems, ensuring fabrication of a high-performance inductor.

Example 3-6

Figure 22:
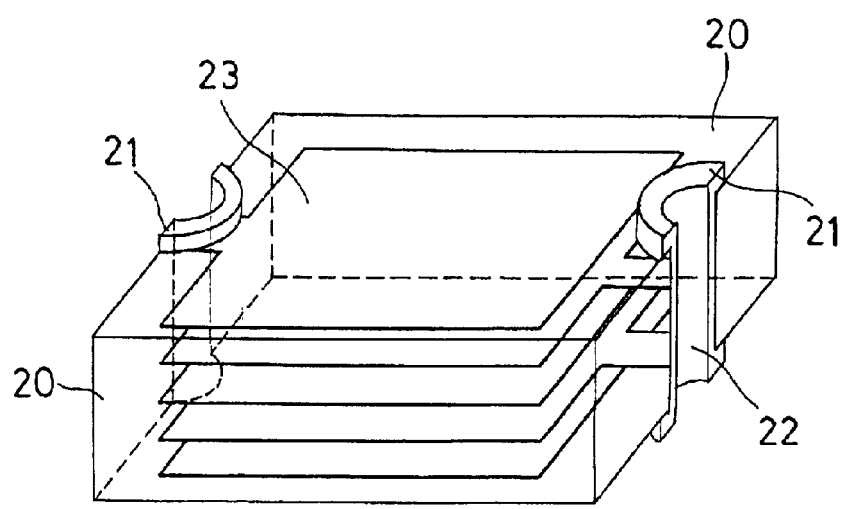
FIGS. 22 and 23 illustrate a capacitor as one exemplary multilayer electronic part of the invention.
Figure 23:
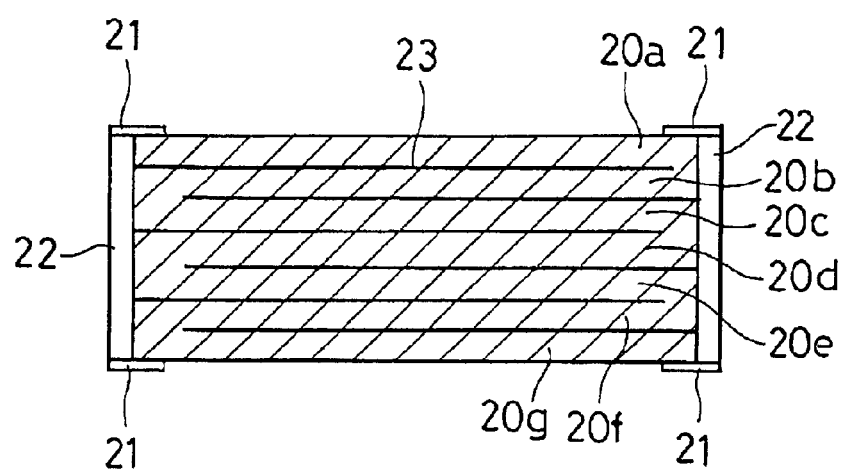

FIGS. 22 and 23 illustrate a capacitor according to a further embodiment of the invention. FIG. 22 is a see-through perspective view and FIG. 23 is a cross-sectional view. In FIGS. 22 and 23, the capacitor 20 includes constituent layers 20a to 20g of the composite dielectric material of the invention, internal conductors (internal electrode patterns) 23 formed on the constituent layers 20b to 20g, terminal electrodes 22 formed along end surfaces of the capacitor 20 and alternately connected to the internal conductors 23, and conductor patterns 21 formed slightly above or below the terminal electrodes 22.

The constituent layers 20a to 20g of the capacitor 20 are constructed by the composite dielectric material in which generally spherical metal particles of at least one type consisting essentially of single crystal grains having a mean particle size of 0.1 to 10 µm which are coated on the surface with a dielectric layer are mixed and dispersed in a resin. The electrode forming method, layer forming method and terminal forming method in Example 3-6 are the same as in Example 3-1.

Figure 25A:
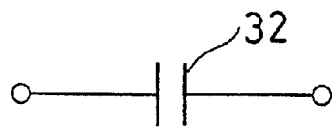
FIGS. 25A and 25B are equivalent circuit diagrams of the capacitors.

The equivalent circuit of the capacitor of FIG. 22 is shown in FIG. 25A. As shown in FIG. 25A, an electronic part (capacitor) having a capacitance 32 is illustrated in the equivalent circuit.

Example 3-7

Figure 24:
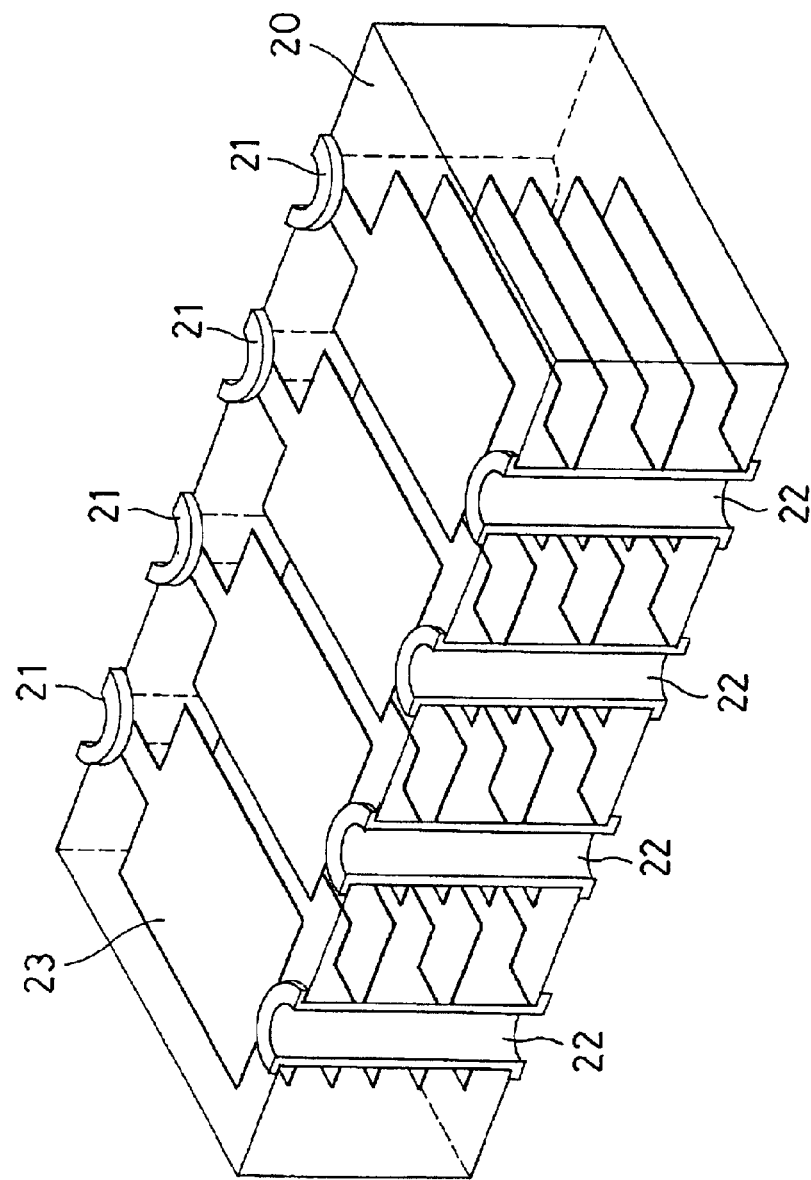
FIG. 24 illustrates a capacitor as another exemplary multilayer electronic part of the invention.
Figure 25B:
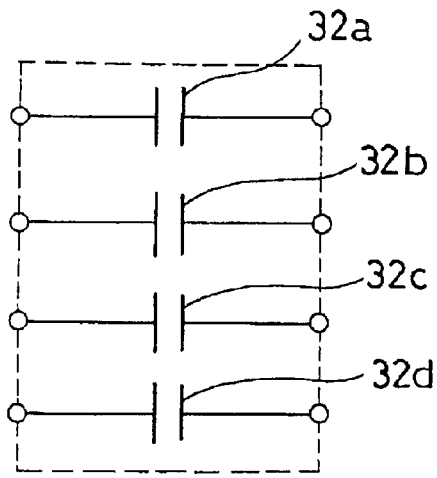

FIG. 24 is a see-through perspective view of a capacitor according to a further embodiment of the invention. In this example, the single capacitor in Example 3-6 is changed to an array of four juxtaposed capacitors. The layer forming method, used material and terminal forming method in Example 3-7 are the same as in Example 3-6. In FIG. 24, the same components as in FIG. 22 are designated by like numerals and their description is omitted. The equivalent circuit is shown in FIG. 25B. As shown in FIG. 25B, an electronic part (capacitor array) having four capacitors 32a to 32d is illustrated in the equivalent circuit. A structure having a plurality of such capacitors built therein contributes to a reduction in the size of a set and the number of parts.

Since Examples 3-6 and 3-7 use in their constituent layers the composite dielectric material in which generally spherical metal particles coated with a dielectric layer are mixed and dispersed in a resin, there is obtained a small sized chip capacitor having a high capacitance as compared with the use of a dispersion of ground ceramic particles in a resin. Since the particles dispersed in a resin are generally spherical metal particles, there are obtained advantages including good dispersion and easy working. Because of the coating of metal particles with a dielectric layer, insulation and withstanding voltage are improved. The use of a resin leads to a light weight and flexibility.

Example 3-8

Figure 26:
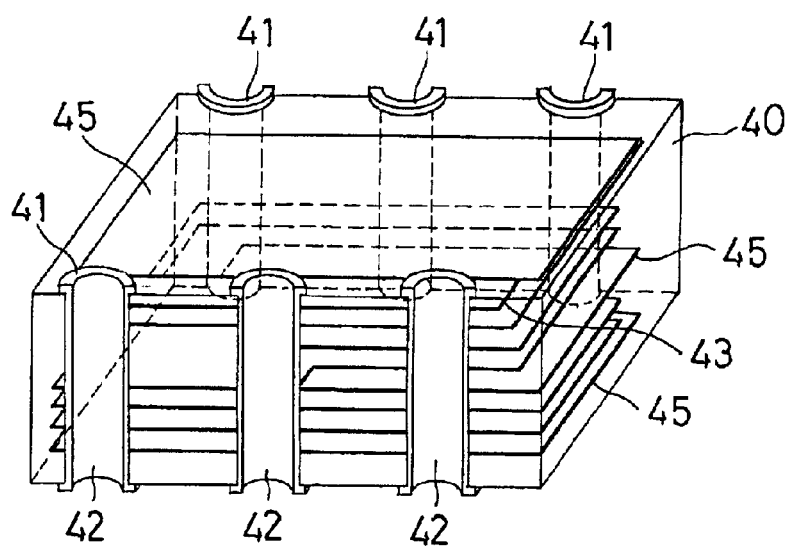
FIGS. 26 to 28 illustrate a balun transformer as one exemplary multilayer electronic part of the invention.
Figure 27:
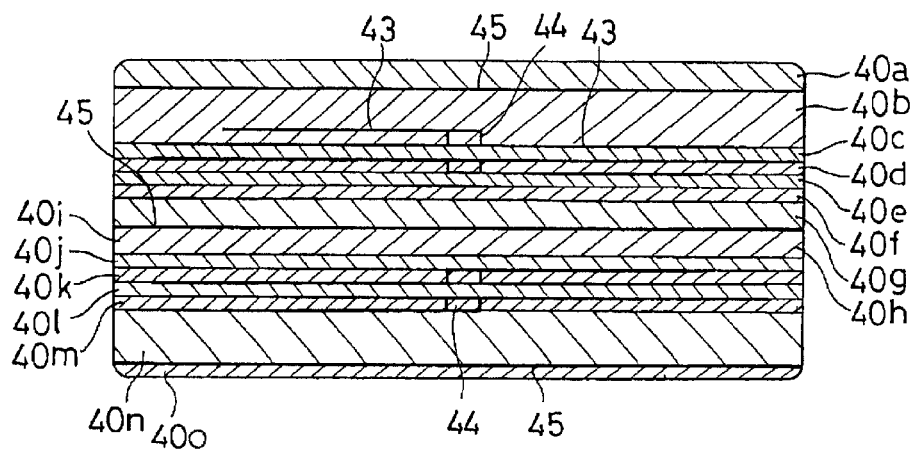
Figure 28:
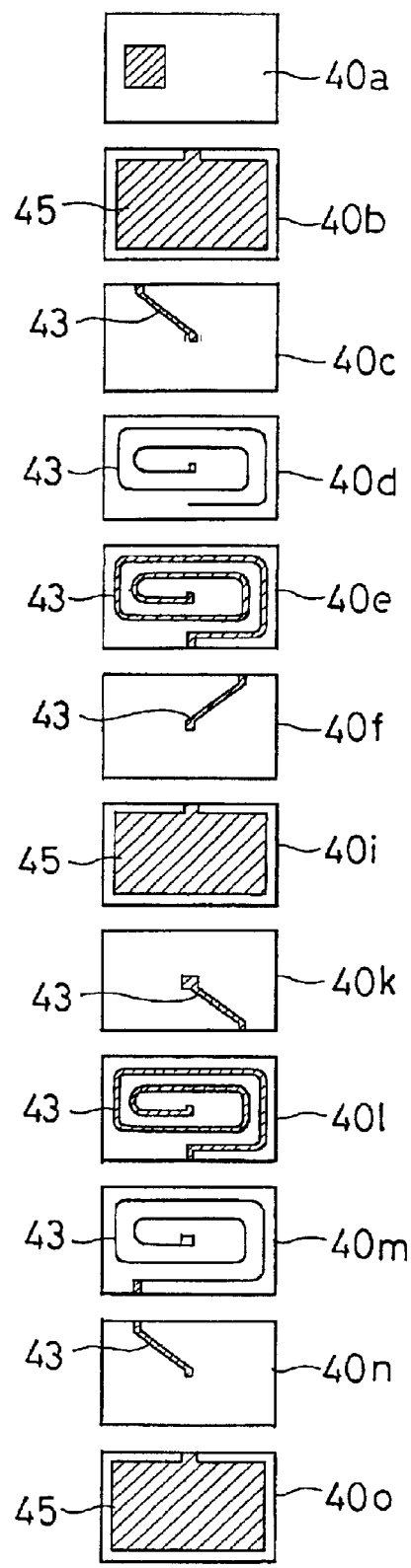
Figure 29:
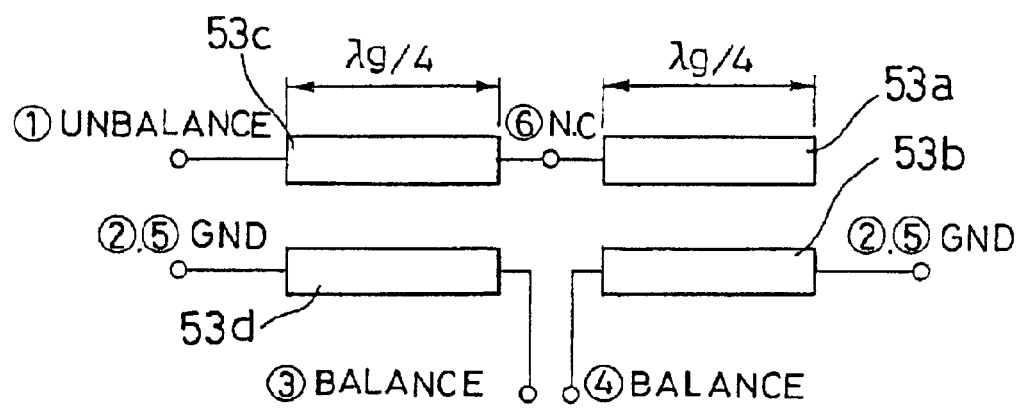
FIG. 29 is an equivalent circuit diagram of the balun transformer.

FIGS. 26 to 29 illustrate a balun transformer according to a further embodiment of the invention. FIG. 26 is a see-through perspective view, FIG. 27 is a cross-sectional view, FIG. 28 is an exploded plan view of respective constituent layers, and FIG. 29 is an equivalent circuit diagram.

In FIGS. 26 to 28, the balun transformer 40 includes a stack of constituent layers 40a to 40o, internal GND conductors 45 disposed above, below and intermediate the stack, and internal conductors 43 formed between the internal GND conductors 45. The internal conductors 43 are spiral conductor sections 43 having a length of $\lambda g/4$ which are connected by via holes 44 so as to construct coupling lines 53a to 53d as shown in the equivalent circuit of FIG. 29.

The constituent layers 40a to 40o of the balun transformer 40 are constructed by the composite dielectric material in which generally spherical metal particles of at least one type consisting essentially of single crystal grains and having a mean particle size of 0.1 to 10 μm which are coated on the surface with a dielectric layer are mixed and dispersed in a resin. The electrode forming method, layer forming method, via forming method and terminal forming method in Example 3-8 are the same as in Example 3-1.

In the design of a balun transformer, the dielectric constant is set as high as possible when a size reduction is desired. Using the composite dielectric material of the invention in the constituent layers 40a to 40o ensures the fabrication of a balun transformer of small size and high performance.

In constructing such a balun transformer to operate in a frequency band of up to several hundreds of megahertz, the composite magnetic material of the invention may be used as the constituent layers 40a to 40o (substrates). In the range where a magnetic material can be used, a magnetic material can increase an inductance value and coupling greater than a dielectric material. Therefore, in the frequency band of up to several hundreds of megahertz, the use of a composite magnetic material as the substrate enables the fabrication of a balun transformer of small size and high performance.

Example 3-9

Figure 30:
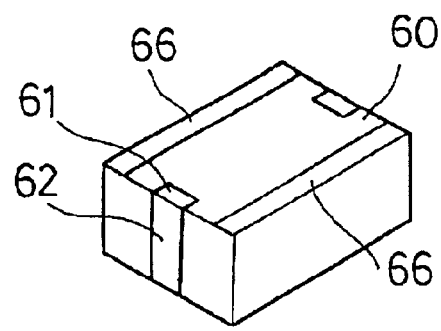
FIGS. 30 and 31 illustrate a multilayer filter as one exemplary multilayer electronic part of the invention.
Figure 31:
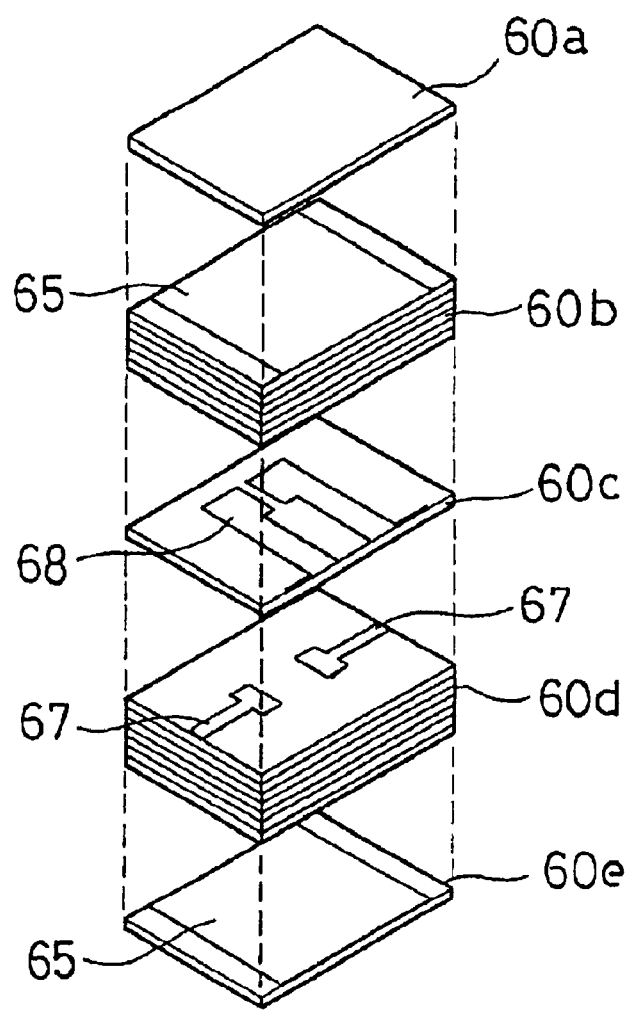
Figure 32:
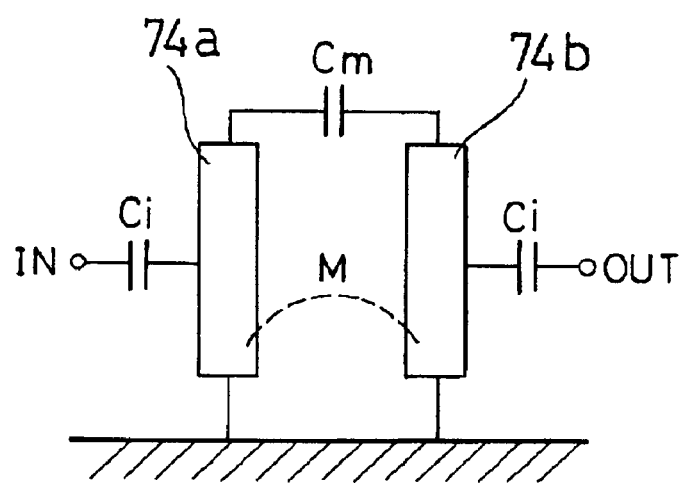
FIG. 32 is an equivalent circuit diagram of the multilayer filter.

FIGS. 30 to 32 illustrate a multilayer filter according to a further embodiment of the invention. FIG. 30 is a perspective view, FIG. 31 is an exploded perspective view, and FIG. 32 is an equivalent circuit diagram. The multilayer filter is constructed as having two poles.

In FIGS. 30 to 32, the multilayer filter 60 includes a stack of constituent layers 60a to 60e, a pair of strip lines 68 and a pair of capacitor conductors 67 both disposed approximately at the center of the stack. The capacitor conductors 67 are formed on a lower constituent layer group 60d, and the strip lines 68 are formed on a constituent layer 60c thereon. GND conductors 65 are formed on upper and lower end surfaces of the constituent layers 60a to 60e so that the strip lines 68 and capacitor conductors 67 are interleaved therebetween. The strip lines 68, capacitor conductors 67 and GND conductors 65 are connected to end electrodes (external terminals) 62 formed on end sides and land patterns 61 formed slightly above or below the end electrodes 62. GND patterns 66 which are formed on opposite sides and slightly above or below therefrom are connected to GND conductors 65.

The strip lines 68 are strip lines 74a, 74b having a length of $\lambda g/4$ or shorter as shown in the equivalent circuit of FIG. 32. Each capacitor conductor 67 constitutes an input or output coupling capacitance Ci. The strip lines 74a and 74b are coupled by a coupling capacitance Cm and a coupling coefficient M.

The constituent layers 60a to 60e of the multilayer filter 60 are constructed by the composite dielectric material in which generally spherical metal particles coated with a dielectric layer are mixed and dispersed in a resin.

In the design of a multilayer filter, the dielectric constant is set as high as possible when a size reduction is desired. Since the composite dielectric material of the invention leading to a high dielectric constant is used in the constituent layers, a multilayer filter of small size and high performance can be provided.

Example 3-10

Figure 33:
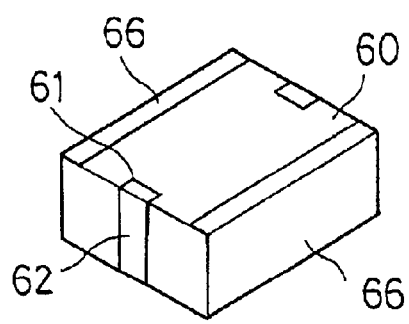
FIGS. 33 and 34 illustrate a multilayer filter as another exemplary multilayer electronic part of the invention.
Figure 34:
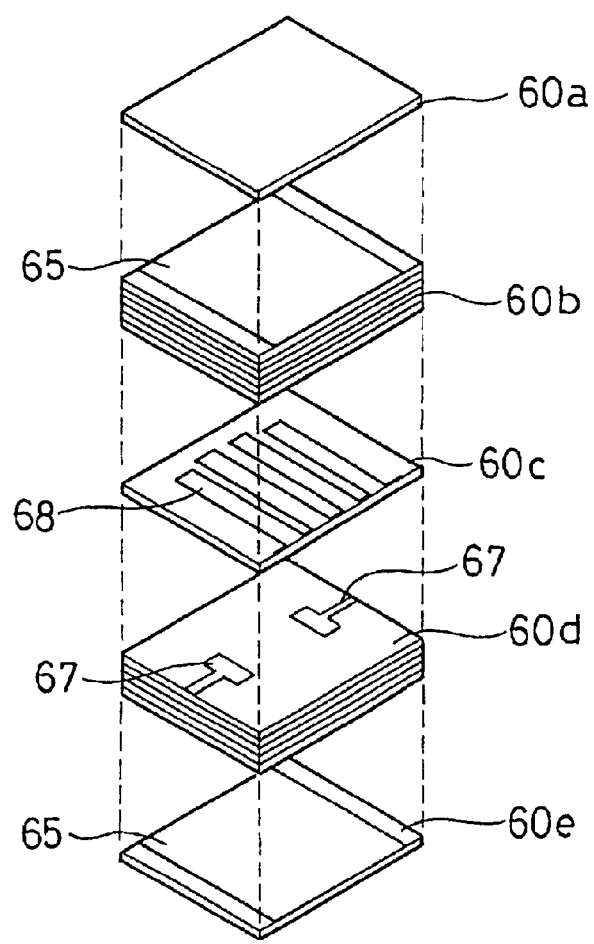
Figure 35:
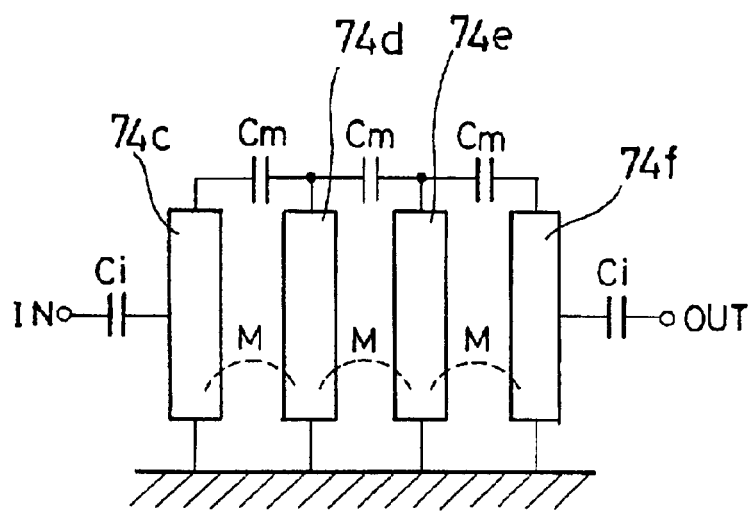
FIG. 35 is an equivalent circuit diagram of the multilayer filter.

FIGS. 33 to 35 illustrate a multilayer filter according to a further embodiment of the invention. FIG. 33 is a perspective view, FIG. 34 is an exploded perspective view, and FIG. 35 is an equivalent circuit diagram. The multilayer filter is constructed as having four poles.

In FIGS. 33 to 35, the multilayer filter 60 includes a stack of constituent layers 60a to 60e, four strip lines 68 and a pair of capacitor conductors 67 both disposed approximately at the center of the stack. The remaining components are the same as in Example 3-9. The same components are designated by like numerals and their description is omitted.

Example 3-11

Figure 36:
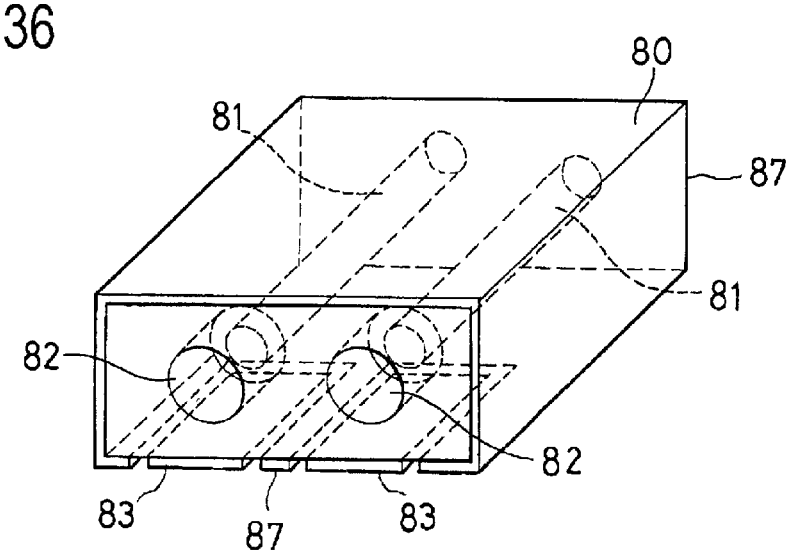
FIGS. 36 to 39 illustrate a block filter as another exemplary multilayer electronic part of the invention.
Figure 37:
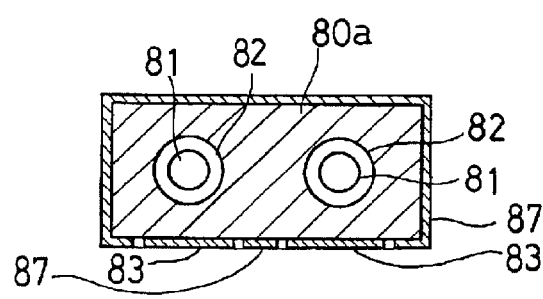
Figure 38:
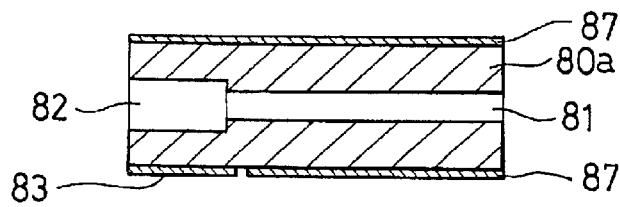
Figure 39:
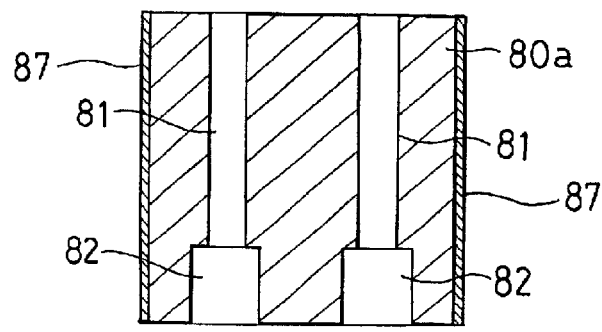
Figure 40:
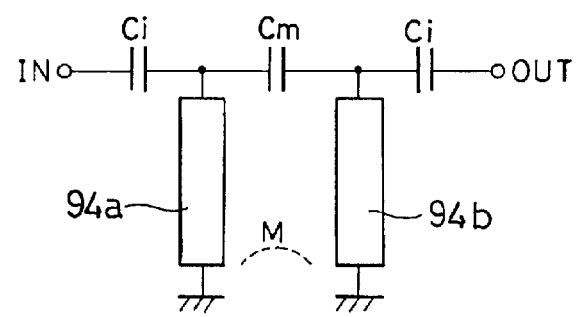
FIG. 40 is an equivalent circuit diagram of the block filter.
Figure 41:
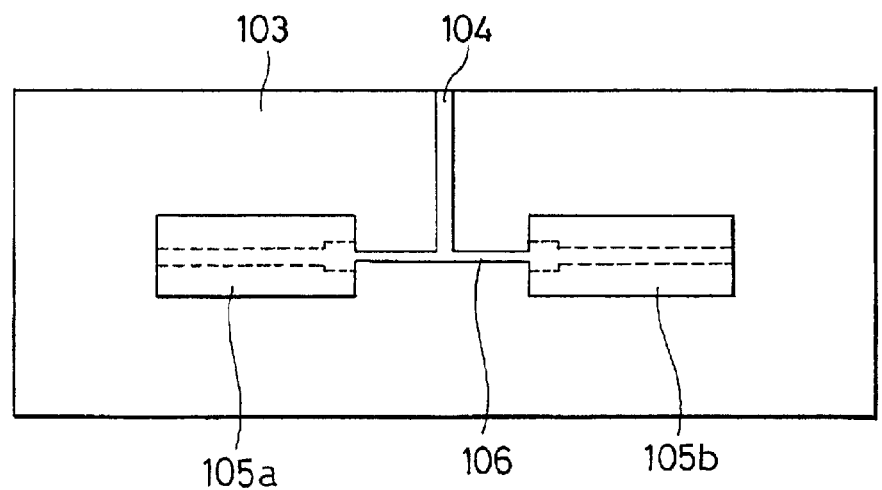
FIG. 41 is a schematic view of a mold for forming the block filter.

FIGS. 36 to 41 illustrate a block filter according to a further embodiment of the invention. FIG. 36 is a see-through perspective view, FIG. 37 is a front elevational view, FIG. 38 is a cross-sectional side view, FIG. 39 is a cross-sectional plan view, FIG. 40 is an equivalent circuit diagram of the block filter, and FIG. 41 is a see-through side view of a mold. The block filter is constructed as having two poles.

In FIGS. 36 to 41, the block filter 80 includes a constituent block 80a, a pair of coaxial conductors 81 and a pair of capacitor coaxial conductors 82 formed in the block 80a. The coaxial conductors 81 and capacitor coaxial conductors 82 are constructed by hollow conductors extending through the constituent block 80a. A surface GND conductor 87 is formed around the constituent block 80a so as to cover the block 80a. Capacitor conductors 83 are formed on the areas corresponding to the capacitor conductors 82. The capacitor conductors 83 and surface GND conductor 87 also serve as input/output terminals and part attachment terminals. It is to be noted that the coaxial conductors 81 and capacitor coaxial conductors 82 are formed by drilling bores through the constituent block 80a and applying a conductive material to the inside surface of the bores by electroless plating or evaporation.

The coaxial conductors 81 are coaxial lines 94a and 94b having a length of $\lambda g/4$ or shorter as shown in the equivalent circuit diagram of FIG. 40. The GND conductor 87 is formed so as to surround the coaxial conductors 81. The capacitor coaxial conductor 82 forms an input or output coupling capacitance Ci with the capacitor conductor 83. The coaxial conductors 81 are coupled with each other through a coupling capacitance Cm and a coupling coefficient M. This construction leads to an equivalent circuit as shown in FIG. 40, realizing a block filter having transfer characteristics of the two pole type.

FIG. 41 is a schematic cross section showing one exemplary mold for forming the constituent block 80a of the block filter 80. In the figure, the mold include a metal base 103 of iron or the like which is formed with a resin inlet sprue 104 and a runner 106 as well as part-forming cavities 105a and 105b in fluid communication therewith. The composite dielectric material of which the constituent block 80a is formed is admitted in liquid state through the inlet sprue 104 and runner 106 to the part-forming cavities 105a and 105b. With the mold internally filled with the composite dielectric material (in which generally spherical metal particles consisting essentially of single crystal grains and coated with a dielectric layer are mixed and dispersed in a resin), cooling or heating treatment is carried out. After the composite dielectric material is solidified, it is taken out of the mold. Unnecessary portions which have cured in the runner and the like are cut off. In this way, the constituent block 80a as shown in FIGS. 36 to 40 is formed.

On the thus formed constituent block 80a, the surface GND conductor 87, coaxial conductors 81 and capacitor coaxial conductors 82 are formed from copper, gold, palladium, platinum or aluminum by carrying out suitable treatments such as plating, etching, printing, sputtering and evaporation.

Like the multilayer filter, the dielectric constant of the block filter is set as high as possible when a size reduction is desired. Using the composite dielectric material of the invention (in which generally spherical metal particles consisting essentially of single crystal grains and coated with a dielectric layer are mixed and dispersed in a resin) as the dielectric enables the fabrication of a block filter of small size and high performance.

Example 3-12

Figure 42:
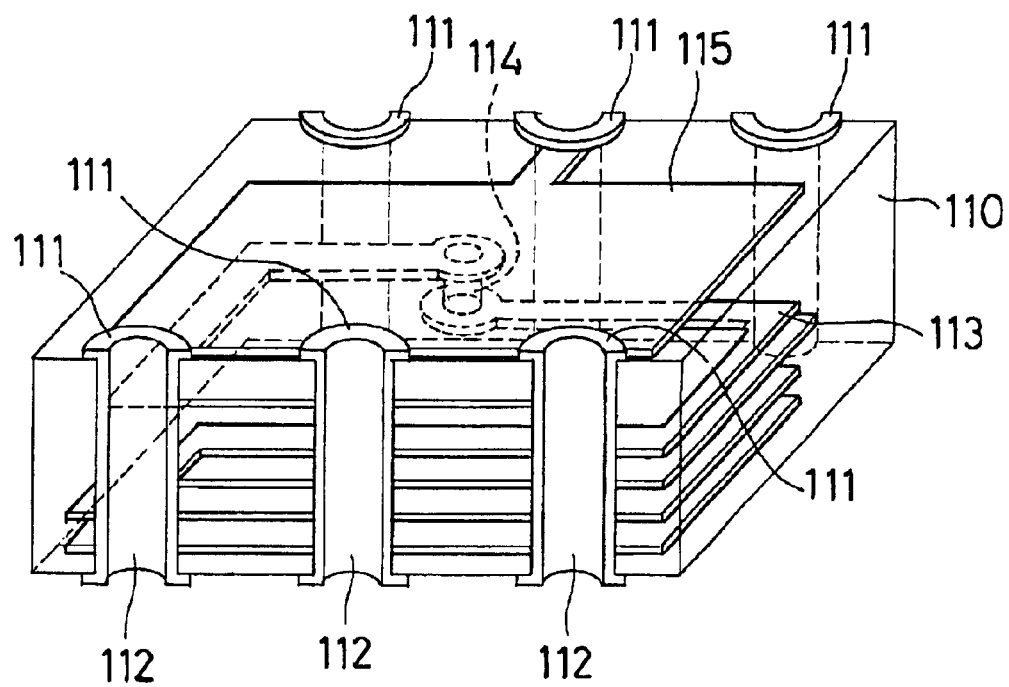
FIGS. 42 to 44 illustrate a coupler as one exemplary multilayer electronic part of the invention.
Figure 43:
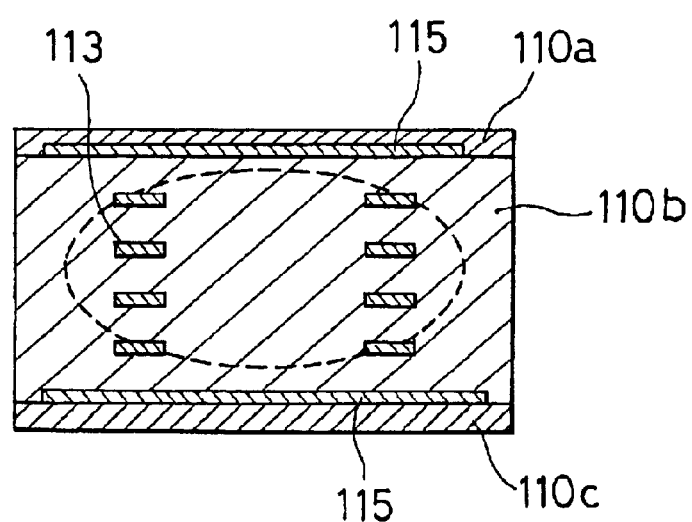
Figure 44:
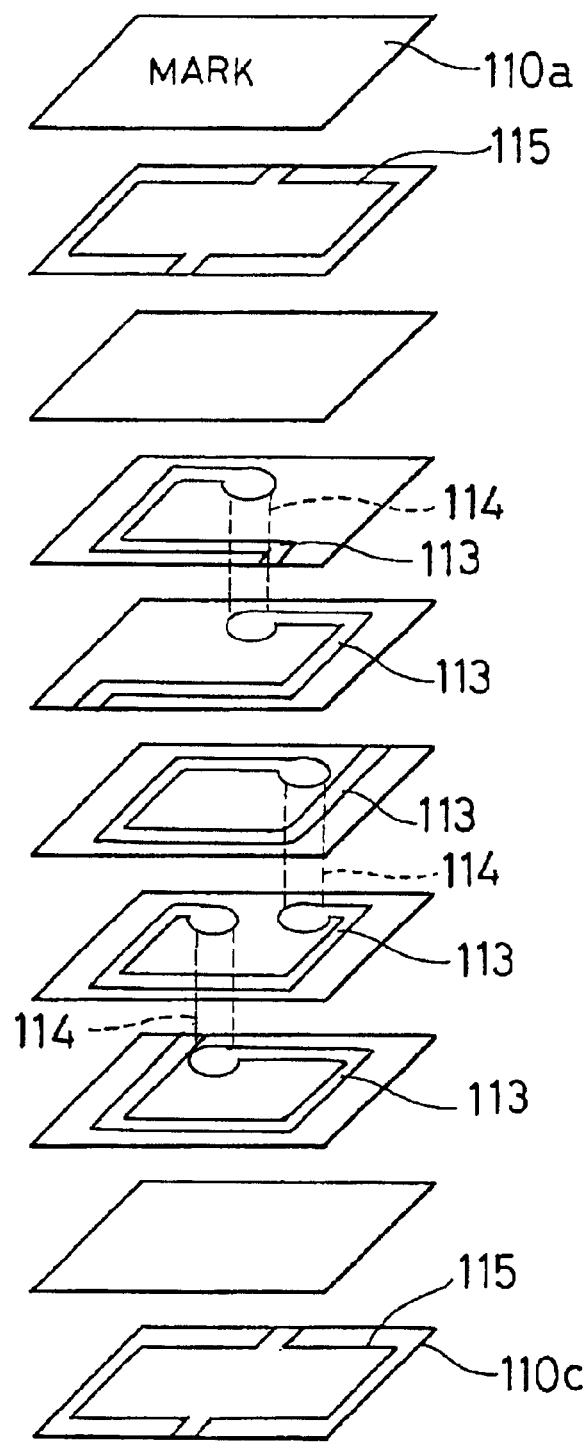
Figure 45:
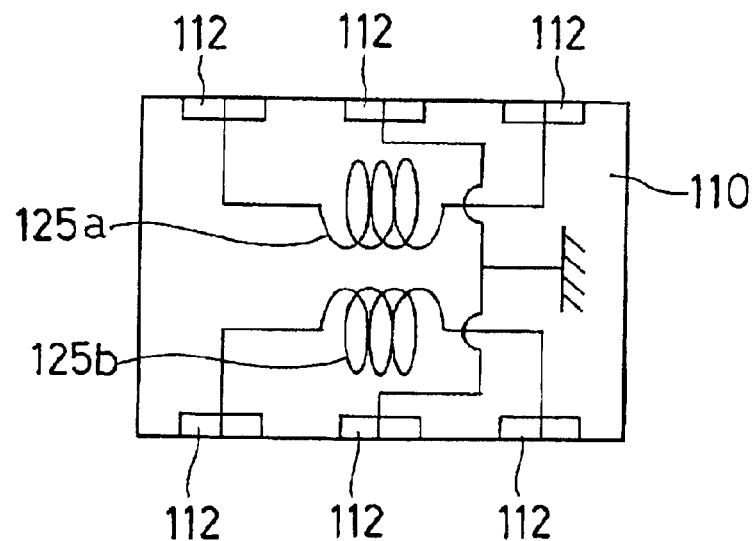
FIG. 45 illustrates the internal connections of the coupler.
Figure 46:
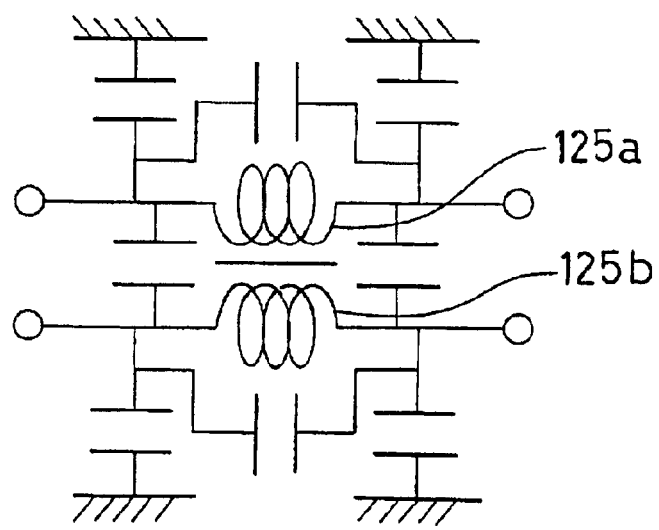
FIG. 46 is an equivalent circuit diagram of the coupler.

FIGS. 42 to 46 illustrate a coupler according to a further embodiment of the invention. FIG. 42 is a see-through perspective view, FIG. 43 is a cross-sectional view, FIG. 44 is an exploded perspective view of respective constituent layers, FIG. 45 is a diagram of internal connection, and FIG. 46 is an equivalent circuit diagram.

In FIGS. 42 to 46, the coupler 110 includes a stack of constituent layers 110a to 110c of the composite dielectric material, internal GND conductors 115 formed and disposed on the top and bottom of the stack, and internal conductors 113 formed between the internal GND conductors 115. The internal conductors 113 are connected by via holes 114 in a spiral fashion so that two coils construct a transformer. Ends of the thus formed coils and internal GND conductors 115 are connected to through-vias 112 formed on end sides and land patterns 111 formed slightly above or below the through-vias 112 as shown in FIG. 42. With the above construction, a coupler 110 having two coils 125a and 125b coupled is obtained as shown in the equivalent circuit diagram of FIG. 46. The electrode forming method, layer forming method, via forming method and terminal forming method in Example 3-12 are the same as in Example 3-1.

Where a wide band is to be realized, the constituent layers 110a to 110c of the coupler 110 should preferably have a minimized dielectric constant as in the case of balun transformers and filters. For size reduction, on the other hand, a higher dielectric constant is desirable. Using the composite dielectric material of the invention (in which generally spherical metal particles consisting essentially of single crystal grains and coated with a dielectric layer are mixed and dispersed in a resin) as the constituent layers enables the fabrication of a coupler of small size and high performance.

Example 3-13

Figure 49:
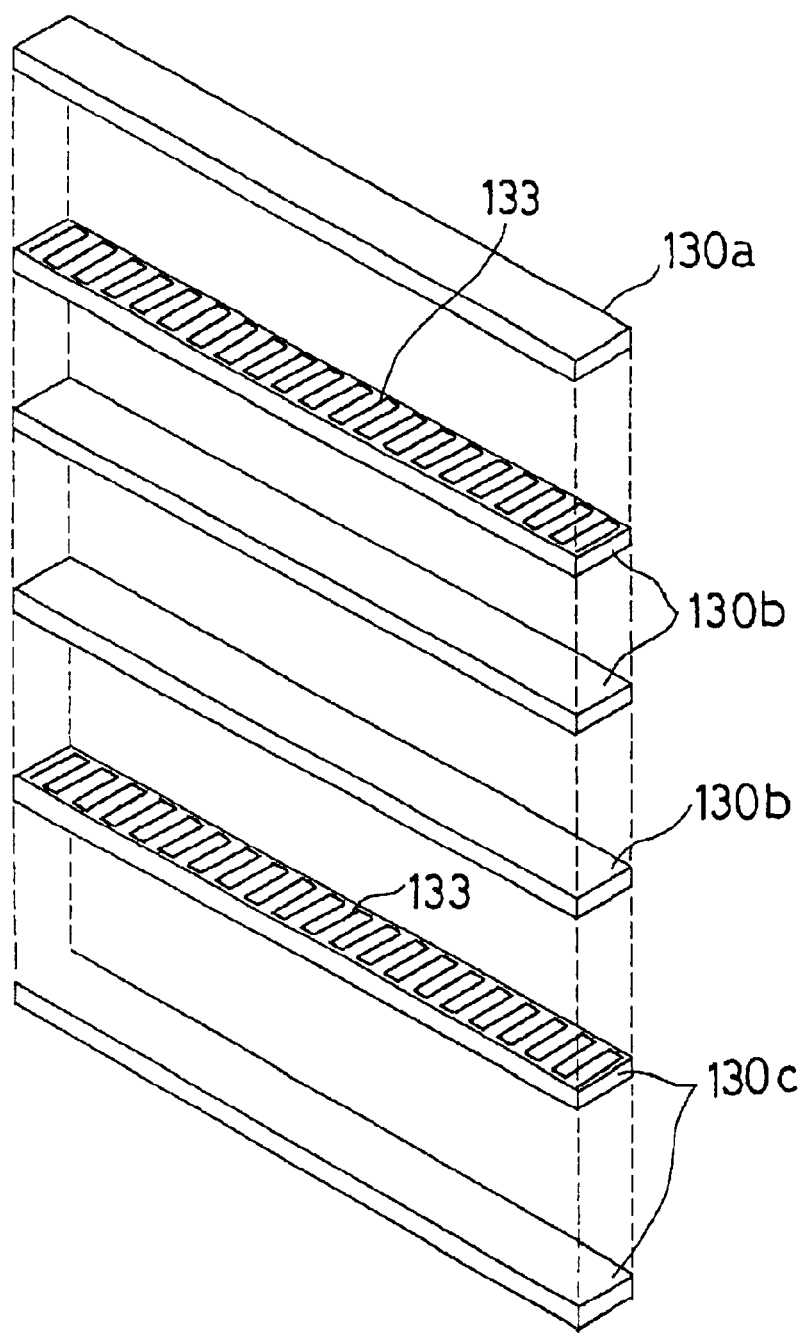

FIGS. 47 to 49 illustrate an antenna according to a further embodiment of the invention. FIG. 47 is a see-through perspective view, FIG. 48A is a plan view, FIG. 48B is a cross-sectional elevational view, FIG. 48C is a cross-sectional end view, and FIG. 49 is an exploded perspective view of respective constituent layers.

In FIGS. 47 to 49, the antenna 130 includes a stack of constituent layers 130a to 130c of the inventive composite dielectric material, and internal conductors (antenna patterns) 133 formed on the constituent layers 130b and 130c. Ends of the internal conductors 133 are connected to terminal electrodes 132 formed at end sides of the antenna and land patterns 131 formed slightly above and below the terminal electrodes 132. In this example, the internal conductor 133 is constructed as a reactance element having a length of about $\lambda g/4$ at the operating frequency and formed in a meander fashion. The electrode forming method, layer forming method, via forming method and terminal forming method in Example 3-13 are the same as in Example 3-1.

Where a wide band is to be realized, the constituent layers 130a to 130c of the antenna 130 should preferably have a minimized dielectric constant. For size reduction, on the other hand, a higher dielectric constant is desirable.

Example 3-14

Figure 50:
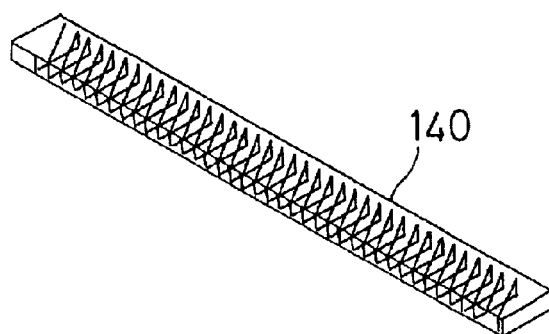
FIGS. 50 and 51 illustrate an antenna as another exemplary multilayer electronic part of the invention.
Figure 51:
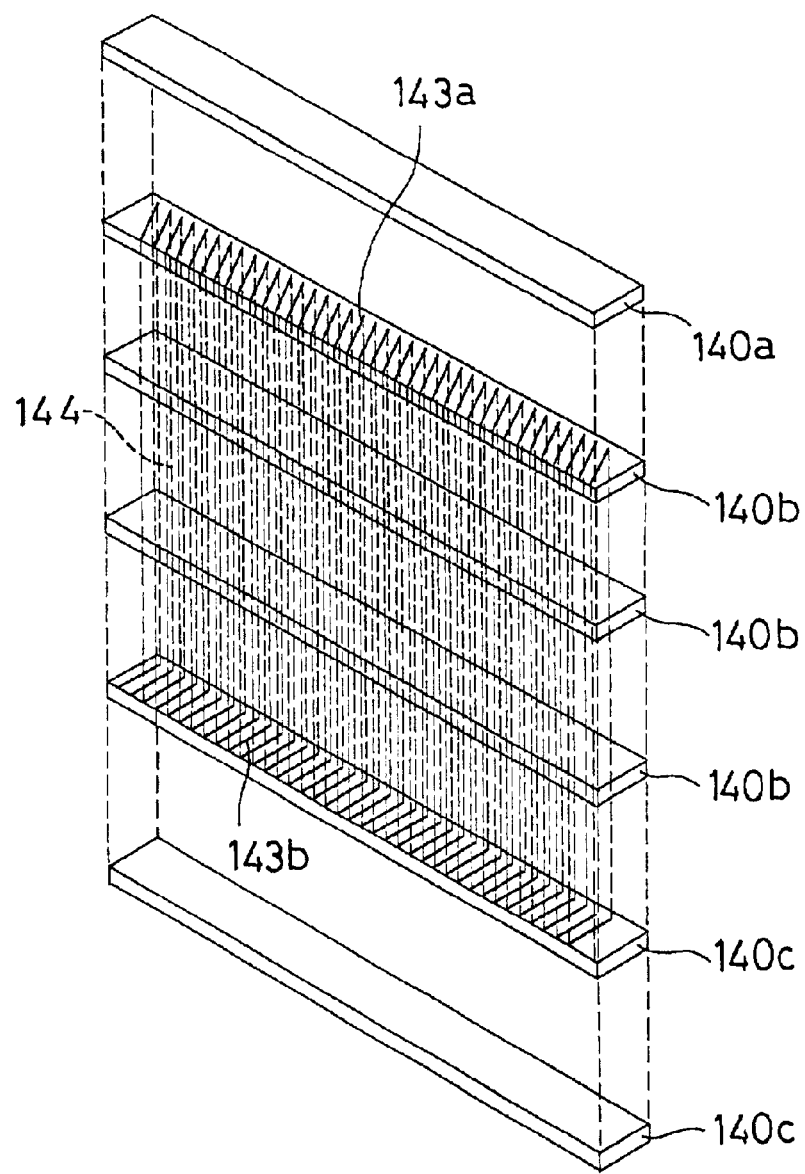

FIGS. 50 and 51 illustrate an antenna according to a further embodiment of the invention. FIG. 50 is a see-through perspective view, and FIG. 51 is an exploded perspective view of respective constituent layers. The antenna in this example is constructed as an antenna having a helical internal electrode.

In FIGS. 50 and 51, the antenna 140 includes a stack of constituent layers 140a to 140c of the inventive composite dielectric material, and internal conductors (antenna patterns) 143a and 143b formed on the constituent layers 140b and 140c, respectively. The upper and lower internal conductors 143a and 143b are connected by via holes 144 to form a helical inductance device. The remaining components are the same as in Example 3-13. The same components are designated by like numerals and their description is omitted.

Example 3-15

Figure 52:
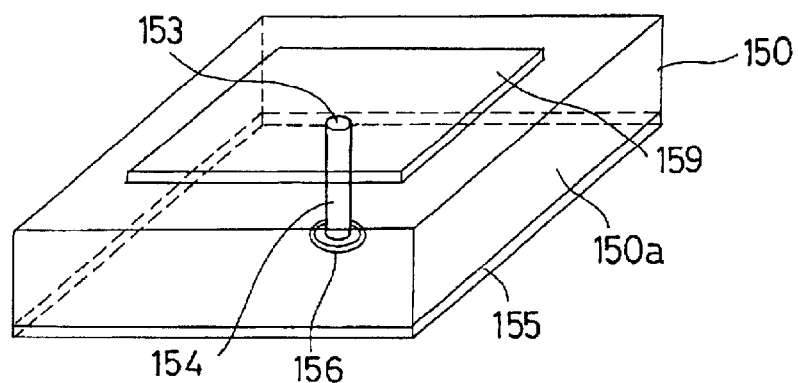
FIGS. 52 and 53 illustrate a patch antenna as one exemplary multilayer electronic part of the invention.
Figure 53:
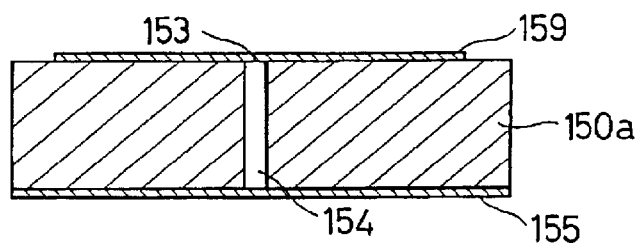

FIGS. 52 and 53 illustrate a patch antenna according to a further embodiment of the invention. FIG. 52 is a see-through perspective view, and FIG. 53 is a cross-sectional view. In FIGS. 52 and 53, the patch antenna 150 includes a constituent layer 150a of the inventive composite dielectric material, a patch conductor (antenna pattern) 159 formed on the top of constituent layer 150a, and a GND conductor 155 formed on the bottom of constituent layer 150a so as to oppose to the patch conductor 159. A power supply through conductor 154 is connected to the patch conductor 159 at a power supply site 153. An annular gap 156 is provided between the through conductor 154 and the GND conductor 155 so that the through conductor 154 may not be connected to the GND conductor 155. Then power supply is provided from below the GND conductor 155 via the through conductor 154.

Example 3-16

Figure 54:
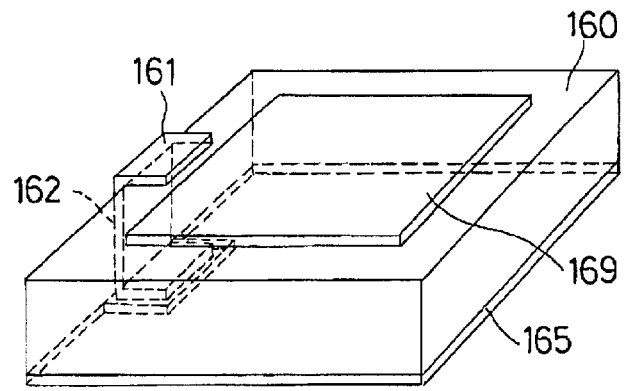
FIGS. 54 and 55 illustrate a patch antenna as another exemplary multilayer electronic part of the invention.
Figure 55:
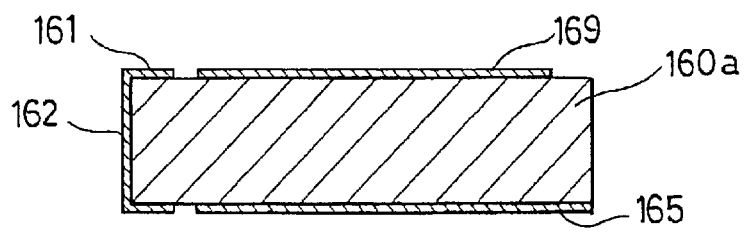

FIGS. 54 and 55 illustrate a patch antenna according to a further embodiment of the invention. FIG. 54 is a see-through perspective view, and FIG. 55 is a cross-sectional view.

In FIGS. 54 and 55, the patch antenna 160 includes a constituent layer 160a of the inventive composite dielectric material, a patch conductor (antenna pattern) 169 formed on the top of constituent layer 160a, and a GND conductor 165 formed on the bottom of constituent layer 160a so as to oppose to the patch conductor 169. A power supply conductor 161 is provided near the patch conductor 169, but spaced therefrom. Power supply is provided to the power supply conductor 161 via a power supply terminal 162. The power supply terminal 162 may be formed from copper, gold, palladium, platinum, aluminum or the like by effecting suitable treatment such as plating, termination, printing, sputtering or evaporation. The remaining components are the same as in Example 3-15. The same components are designated by like numerals and their description is omitted.

Example 3-17

Figure 56:
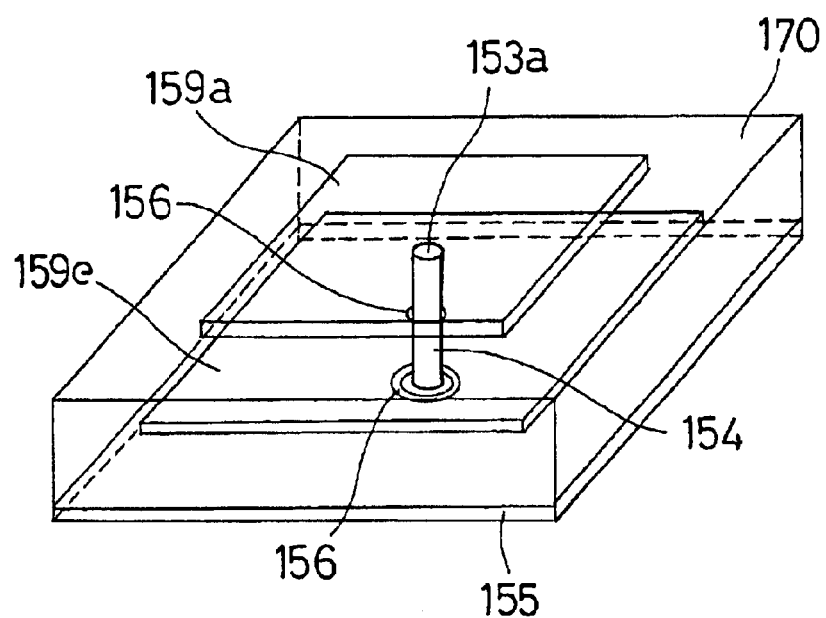
FIGS. 56 and 57 illustrate a patch antenna as a further exemplary multilayer electronic part of the invention.
Figure 57:
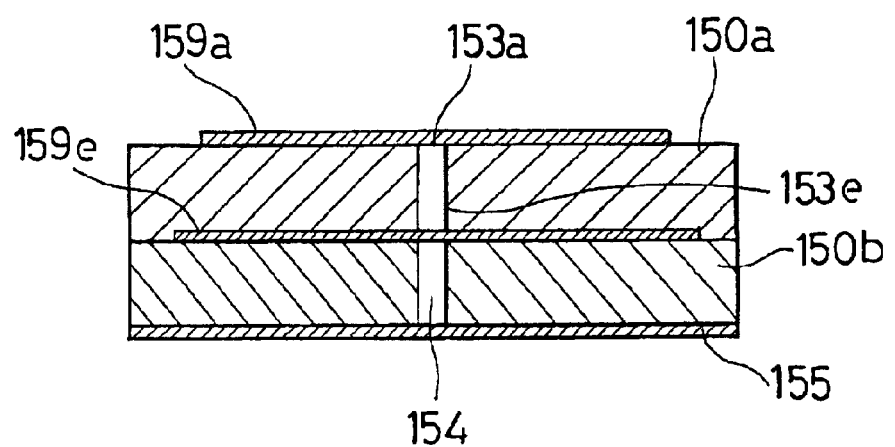

FIGS. 56 and 57 illustrate a multilayer patch antenna according to a further embodiment of the invention. FIG. 56 is a see-through perspective view, and FIG. 57 is a cross-sectional view. In FIGS. 56 and 57, the patch antenna 170 includes constituent layers 150a, 150b of the inventive composite dielectric material, patch conductors 159a, 159e formed on the constituent layers 150a, 150b, and a GND conductor 155 formed on the bottom of constituent layer 150b so as to oppose to the patch conductors 159a, 159e. A power supply through conductor 154 is connected to the patch conductor 159a at a power supply site 153a. A gap 156 is provided between the through conductor 154 and the GND conductor 155 and patch conductor 159e so that the through conductor 154 may not be connected to the GND conductor 155 and patch conductor 159e. Then power supply is provided to the patch conductor 159a from below the GND conductor 155 via the through conductor 154. At this point, power supply is provided to the patch conductor 159e by the capacitive coupling with the patch conductor 159a and the capacitance due to the gap with the through conductor 154. The remaining components are the same as in Example 3-15. The same components are designated by like numerals and their description is omitted.

Example 3-18

Figure 58:
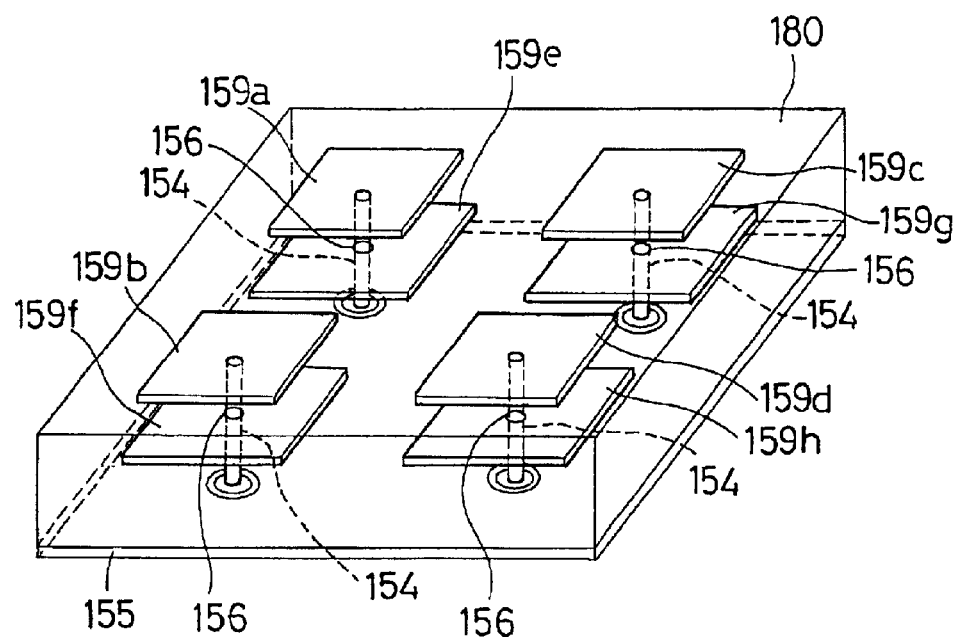
FIGS. 58 and 59 illustrate a patch antenna as a still further exemplary multilayer electronic part of the invention.
Figure 59:
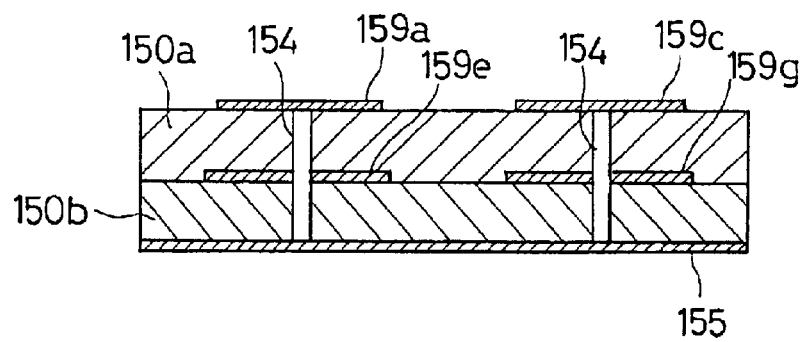

FIGS. 58 and 59 illustrate a multi-array patch antenna according to a further embodiment of the invention. FIG. 58 is a see-through perspective view, and FIG. 59 is a cross-sectional view. As opposed to Example 3-17 in which the patch antenna is constructed singly, four patch antennas are arranged in an array in this example. In FIGS. 58 and 59, the array includes constituent layers 150a, 150b of the inventive composite dielectric material, patch conductors 159a, 159b, 159c, 159d formed on the constituent layer 150a, patch conductors 159e, 159f, 159g, 159h formed on the constituent layer 150b, and a GND conductor 155 formed on the bottom of the constituent layer 150b so as to oppose to the patch conductors 159a, 159e. The remaining components are the same as in Example 3-17. The same components are designated by like numerals and their description is omitted.

The array formation enables to reduce the size of a set and the number of parts.

With respect to the antennas of Examples 3-13 to 3-18, a dielectric constant as high as possible is desirable for size reduction purposes. Using the composite dielectric material of the invention (in which generally spherical metal particles consisting essentially of single crystal grains and coated with a dielectric layer are mixed and dispersed in a resin) as the constituent layers enables the fabrication of an antenna of small size and high performance.

Example 3-19

Figure 60:
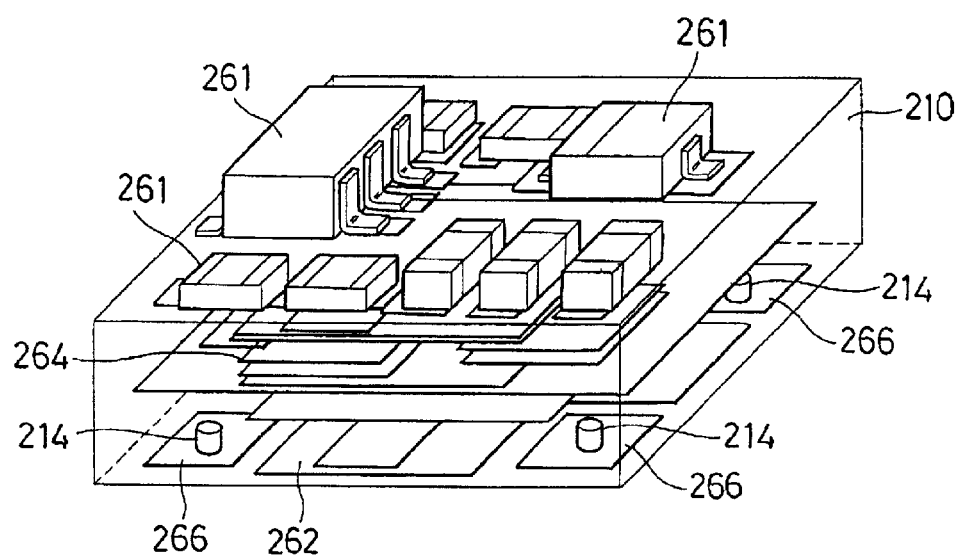
FIGS. 60 and 61 illustrate a VCO as one exemplary multilayer electronic part of the invention.
Figure 61:
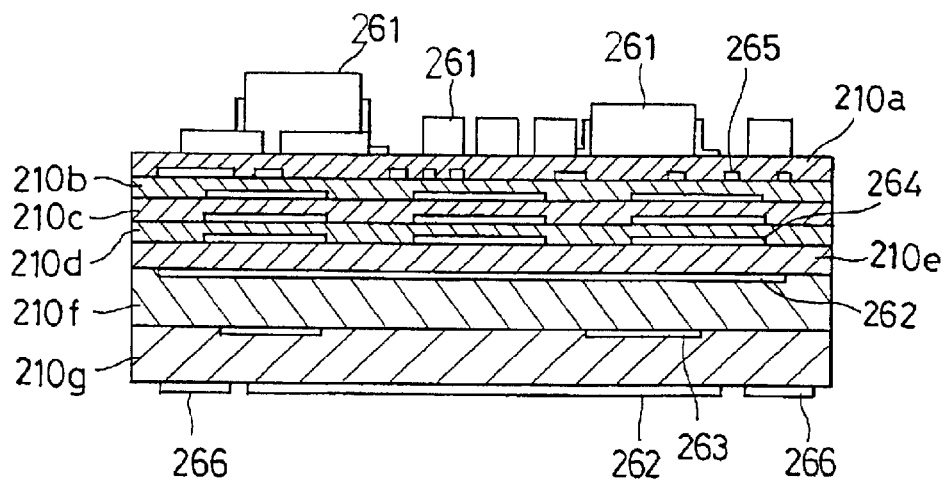
Figure 62:
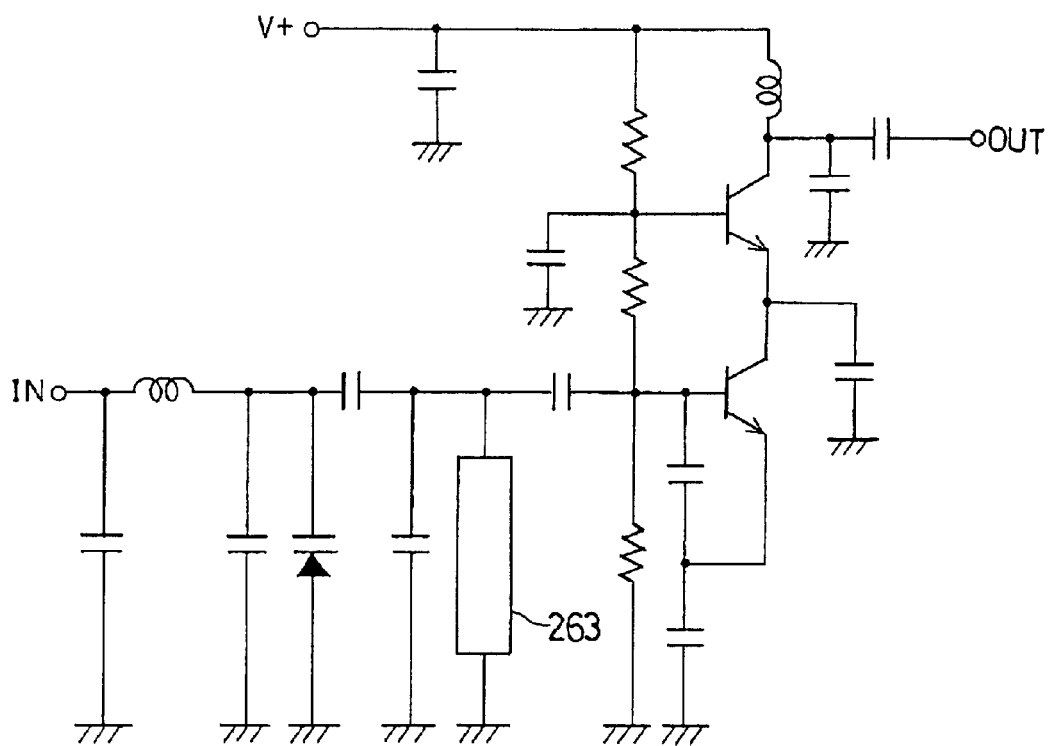
FIG. 62 is an equivalent circuit diagram of the VCO.

FIGS. 60 to 62 illustrate a voltage controlled oscillator (VCO) according to a further embodiment of the invention. FIG. 60 is a see-through perspective view, FIG. 61 is a cross-sectional view, and FIG. 62 is an equivalent circuit diagram.

In FIGS. 60 to 62, the VCO includes a stack of constituent layers 210a to 210g, electronic parts 261 disposed and formed on the stack including capacitors, inductors, semiconductors and registers, and conductor patterns 262, 263, 264 formed above, below and intermediate the constituent layers 210a to 210g. The electrode forming method, layer forming method, via forming method and terminal forming method in Example 3-19 are the same as in Example 3-1.

Since the VCO is constructed to an equivalent circuit as shown in FIG. 62, it further includes resonators, capacitors, signal lines, semiconductors and power supply lines. It is advantageous to form the respective constituent layers from materials selected appropriate for their function. The illustrated construction is exemplary and another construction is possible.

For the constituent layers 210f, 210g constructing a resonator in this example, a composite dielectric material having a dielectric constant adjusted for the resonance frequency is used. For the constituent layers 210c to 210e constructing a capacitor, a composite dielectric material having a dielectric constant of 5 to 40 is used. For the constituent layers 210a, 210b constructing wiring and an inductor, a composite dielectric material having a lower dielectric constant than the capacitor is used.

On the surface of constituent layers 210a to 210g, there are provided internal conductors including strip line 263, GND conductor 262, capacitor conductor 264, wiring inductor conductor 265 and terminal conductor 266. Upper and lower internal conductors are connected by via holes 214. Electronic parts 261 are mounted on the surface, completing a VCO corresponding to the equivalent circuit of FIG. 62.

With the above construction, each layer is formed of a material suited for a distinct function, arriving at a high performance, small size, and thin part.

Example 3-20

Figure 63:
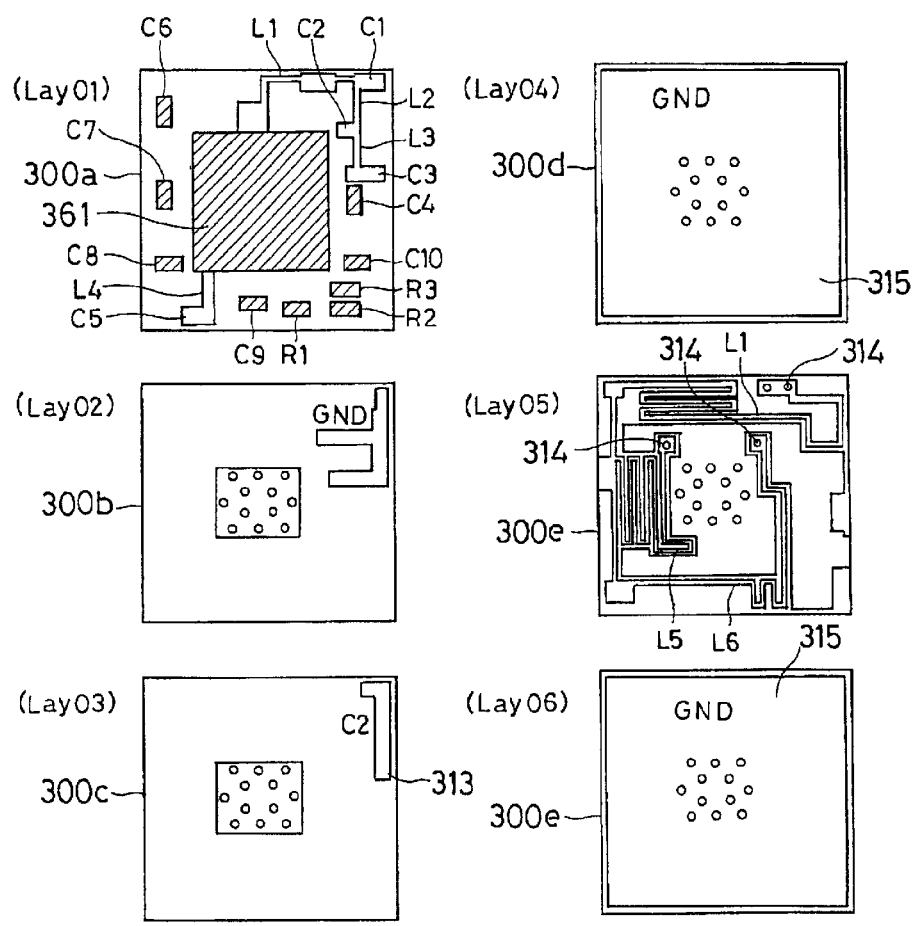
FIGS. 63 and 65 illustrate a power amplifier as one exemplary multilayer electronic part of the invention.
Figure 64:
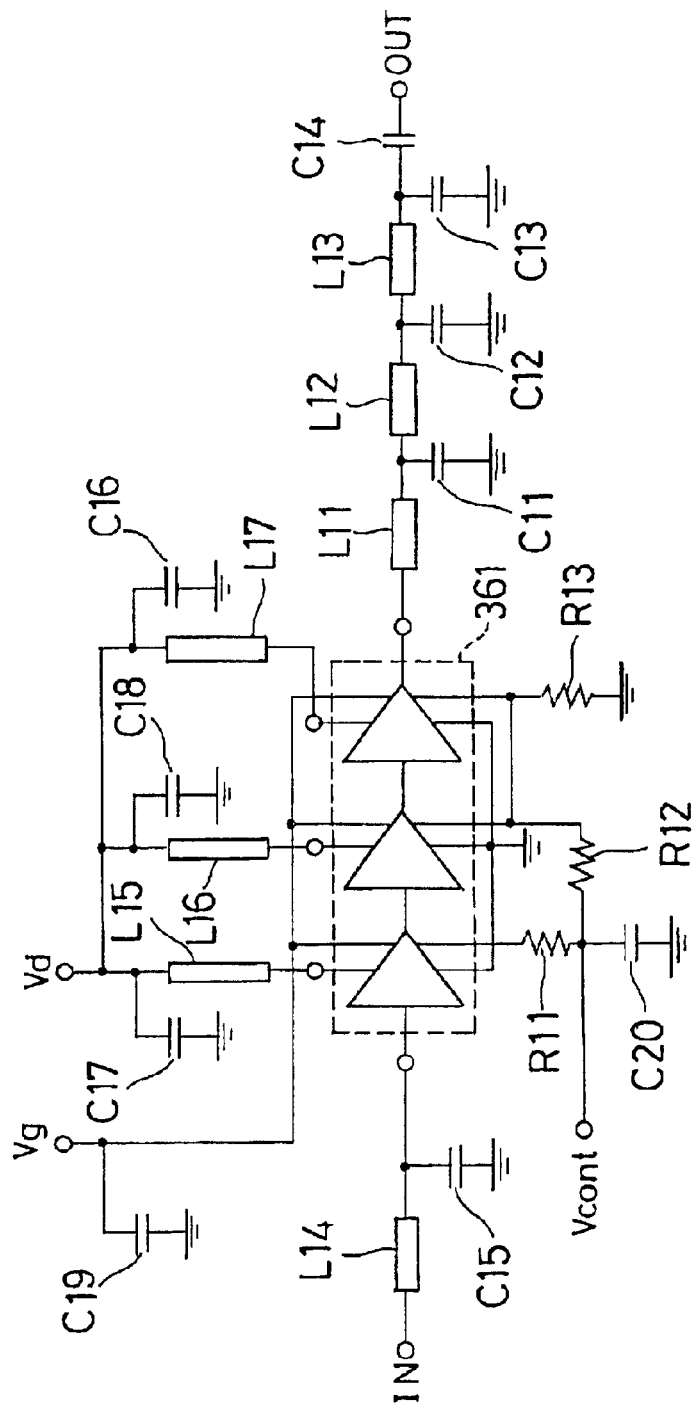
FIG. 64 is an equivalent circuit diagram of the power amplifier.
Figure 65:
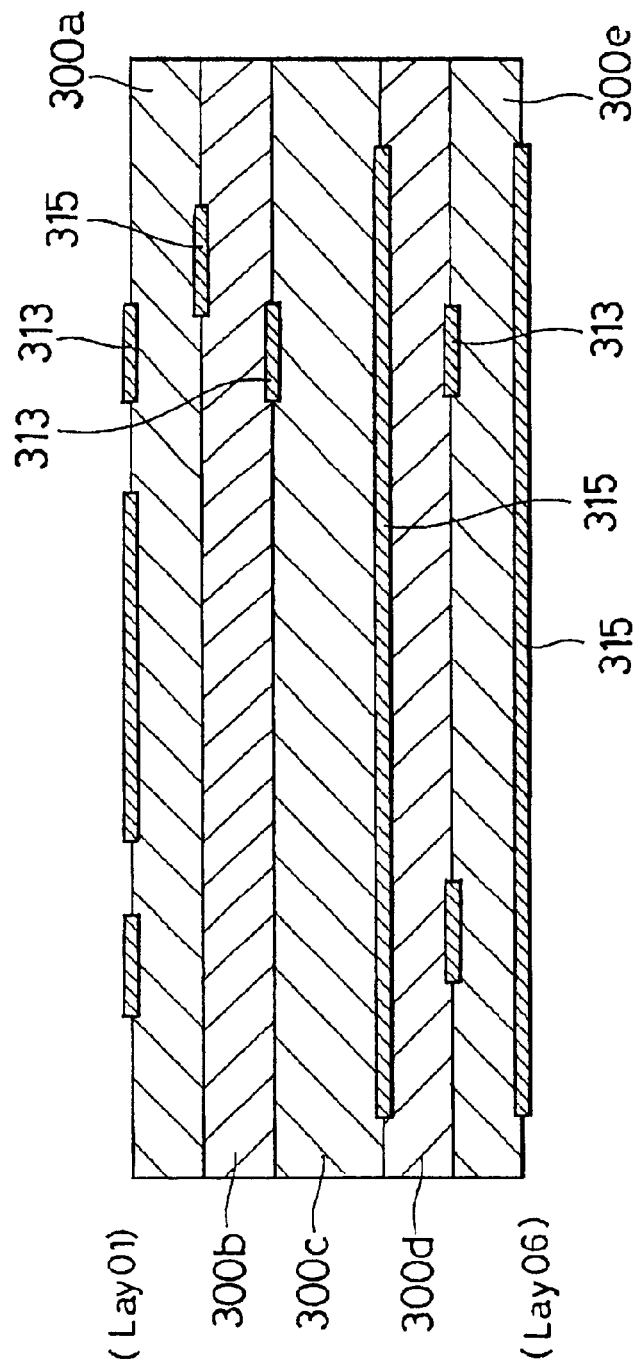

FIGS. 63 to 65 illustrate a power amplifier according to a further embodiment of the invention. FIG. 63 is an exploded plan view of respective constituent layers, FIG. 64 is an equivalent circuit diagram, and FIG. 65 is a cross-sectional view.

In FIGS. 63 to 65, the power amplifier includes a stack of constituent layers 300a to 300e, electronic parts 361 formed thereon including capacitors, inductors, semiconductors and registers, and conductor patterns 313, 315 formed above, below and intermediate the constituent layers 300a to 300e. Via holes 314 provide an interconnection between internal conductors.

Since the power amplifier is constructed to an equivalent circuit as shown in FIG. 64, it further includes strip lines L11 to L17, capacitors C11 to C20, signal lines, and power supply lines to semiconductor devices. It is advantageous to form the respective constituent layers from materials selected appropriate for their function. The illustrated construction is exemplary and another construction is possible.

For the constituent layers 300d, 300e constructing strip lines in this example, a composite dielectric material having a dielectric constant adjusted for the operating frequency is used. For the constituent layers 300a to 300c constructing a capacitor, a composite dielectric material having a dielectric constant of 5 to 40 is used.

The electrode forming method, layer forming method, via forming method and terminal forming method in Example 3-20 are the same as in Example 3-1.

With the above construction, each layer is formed of a material suited for a distinct function, arriving at a high performance, small size, and thin part.

Example 3-21

Figure 66:
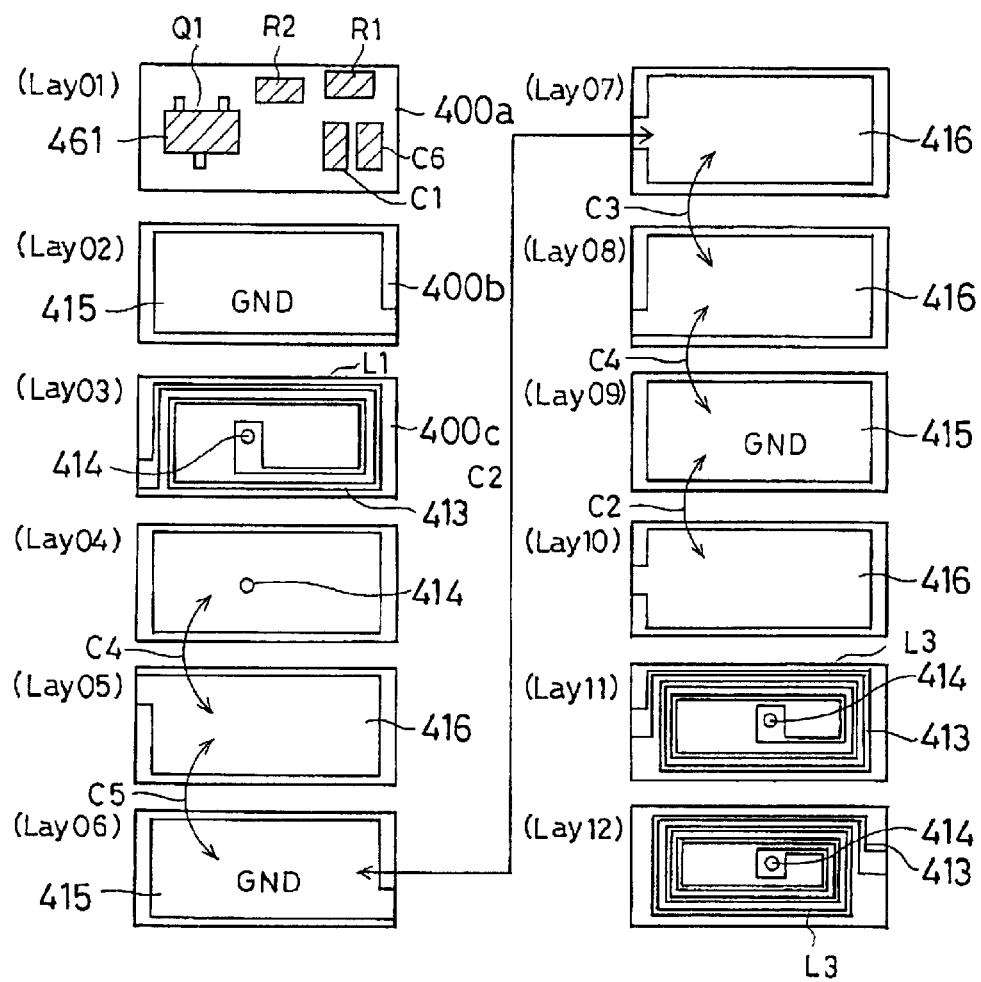
FIGS. 66 and 67 illustrate a superposed module as one exemplary multilayer electronic part of the invention.
Figure 67:
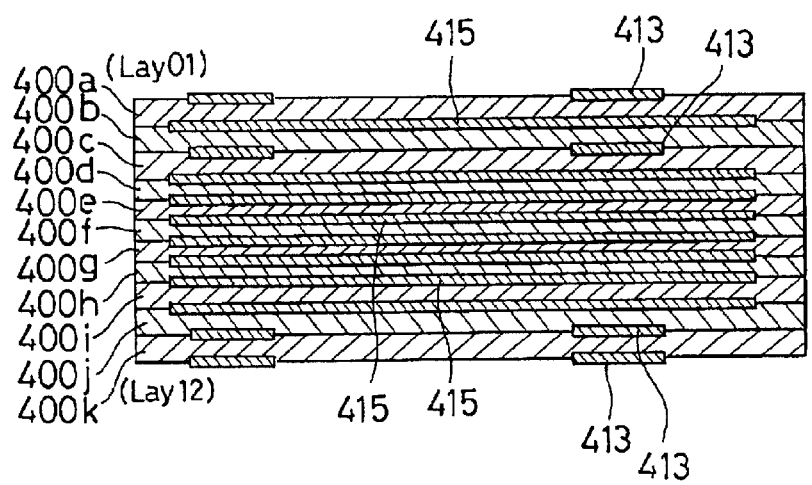
Figure 68:
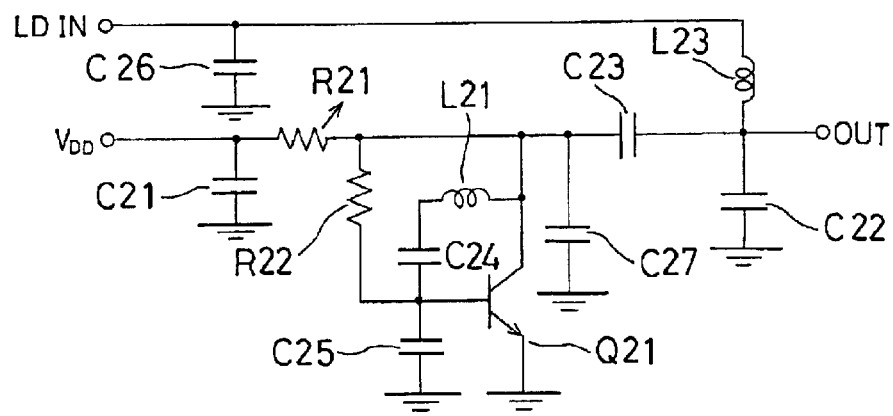
FIG. 68 is an equivalent circuit diagram of the superposed module.

FIGS. 66 to 68 illustrate a superposed module according to a further embodiment of the invention, the module finding use as an optical pickup or the like. FIG. 66 is an exploded plan view of respective constituent layers, FIG. 67 is a cross-sectional view, and FIG. 68 is an equivalent circuit diagram.

In FIGS. 66 to 68, the superposed module includes a stack of constituent layers 400a to 400k, electronic parts 461 formed thereon including capacitors, inductors, semiconductors and registers, and conductor patterns 413, 415 formed above, below and intermediate the constituent layers 400a to 400k. Since the superposed module is constructed to an equivalent circuit as shown in FIG. 59, it further includes inductors L21, L23, capacitors C21 to C27, signal lines, and power supply lines to semiconductor devices. It is advantageous to form the respective constituent layers from materials selected appropriate for their function. The illustrated construction is exemplary and another construction is possible.

For the constituent layers 400d to 400h constructing capacitors in this example, it is preferred to use a composite dielectric material adjusted so as to give a dielectric constant of 10 to 40. For the constituent layers 400a to 400c, 400j to 400k constructing inductors, it is preferred to use a material having a relatively low dielectric constant. On the surface of base layers 400a to 400k, there are provided internal conductors 413, GND conductors 415, and the like. Upper and lower internal conductors are connected by via holes 414. Electronic parts 461 are mounted on the surface, completing a superposed module corresponding to the equivalent circuit of FIG. 68. The electrode forming method, layer forming method, via forming method and terminal forming method in Example 3-21 are the same as in Example 3-1.

With the above construction, each layer is formed of a material suited for a distinct function, arriving at a high performance, small size, and thin part.

Example 3-22

Figure 69:
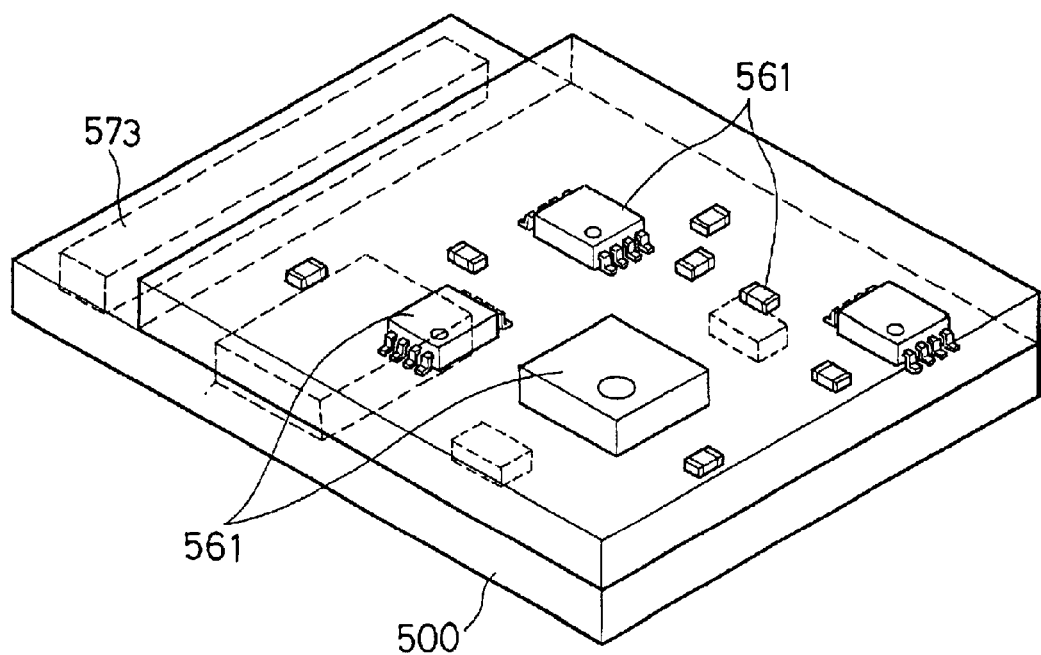
FIGS. 69 to 73 illustrate a RF unit as one exemplary multilayer electronic part of the invention.
Figure 70:
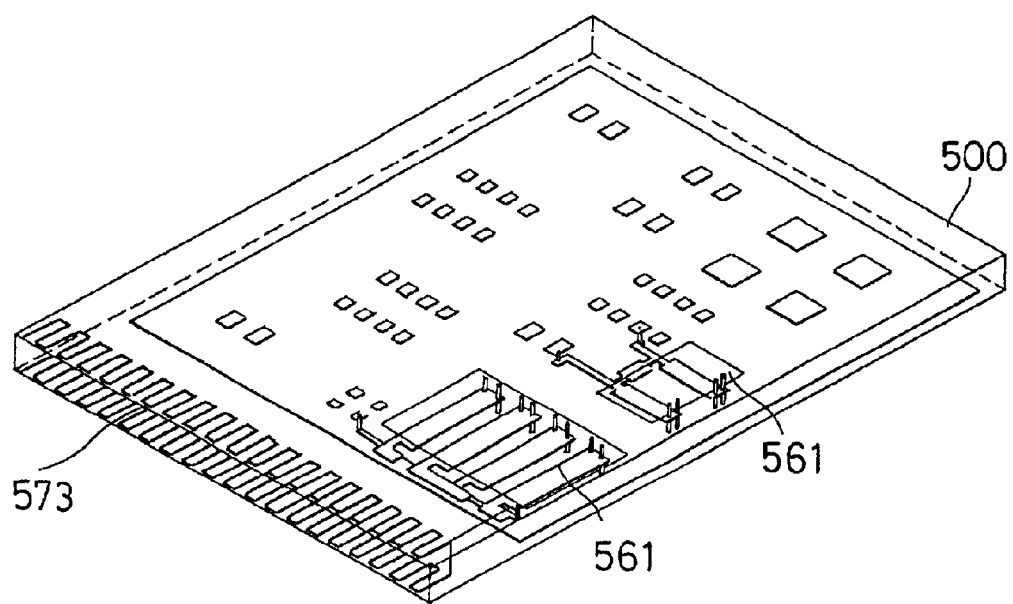
Figure 71:
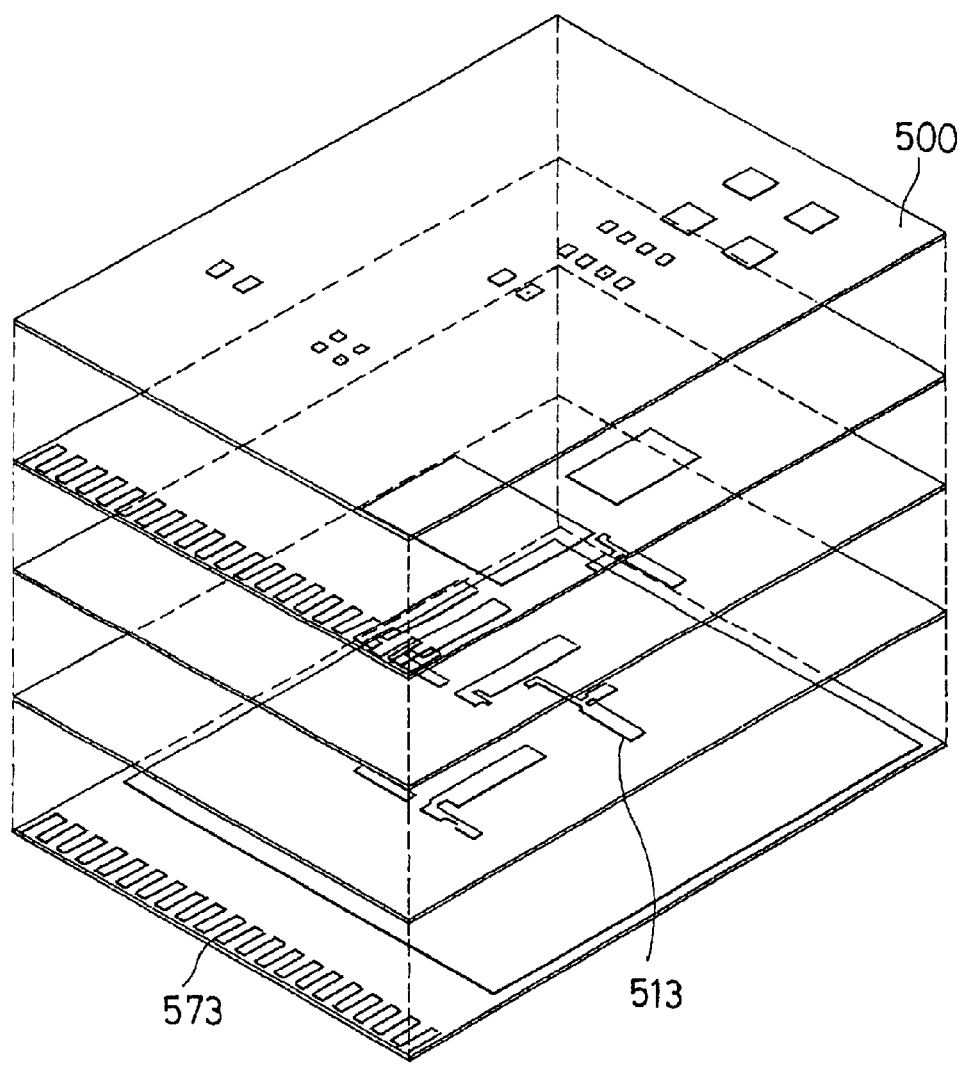
Figure 72:
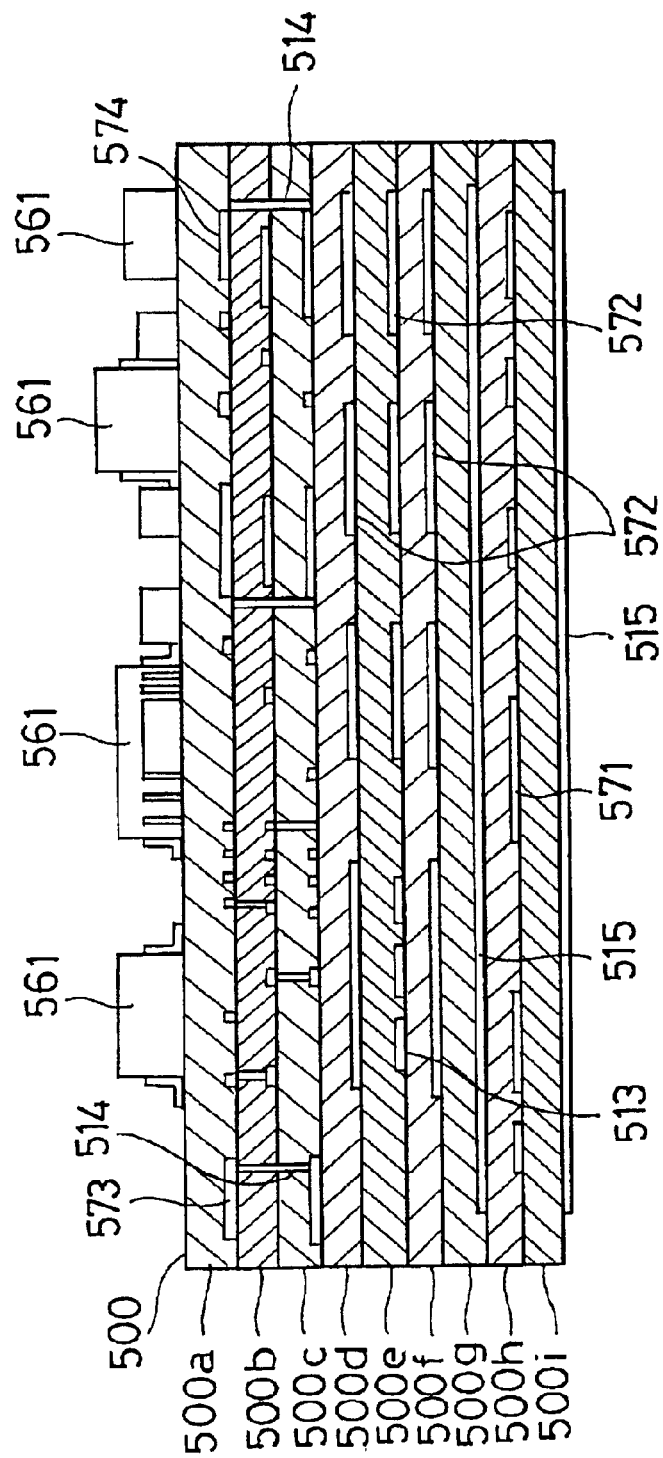
Figure 73:
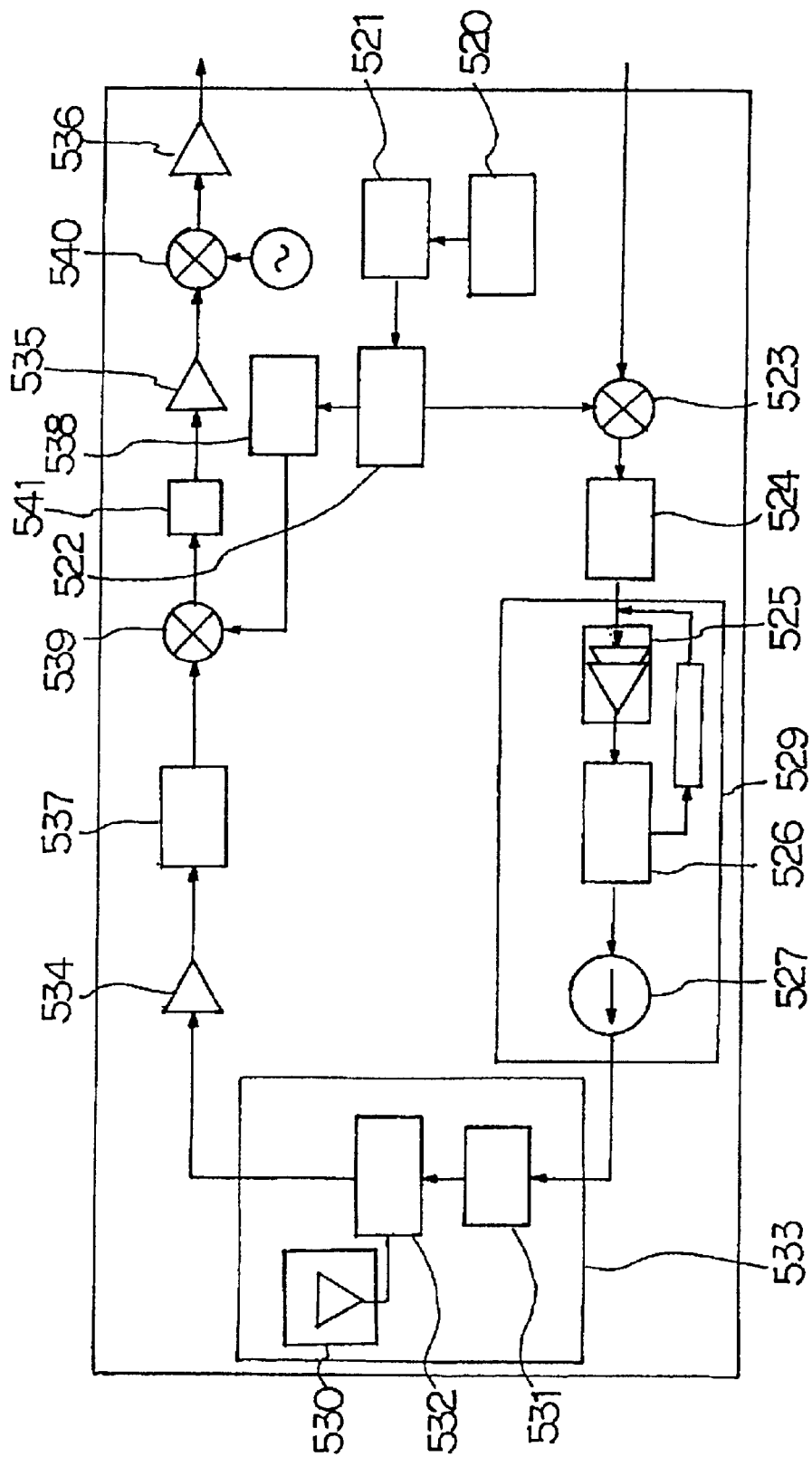

FIGS. 69 to 73 illustrate a RF unit according to a further embodiment of the invention, the RF unit being adapted for use in radio communication instruments as typified by mobile phones. FIG. 69 is a perspective view, FIG. 70 is a perspective view with an outer housing removed, FIG. 71 is an exploded perspective view of respective constituent layers, FIG. 72 is a cross-sectional view, and FIG. 73 is a block diagram. As shown in FIG. 73, the RF unit includes a PLL circuit 520, a VCO 521, a hybrid circuit 522, a mixer 523, a band pass filter 524, a power amplifier module 529 consisting of an amplifier 525, a coupler 526 and an isolator 527, an antenna 530, a front end module 533 consisting of a low pass filter 531 and a duplexer 532, amplifiers 534 to 536, band pass filters 537 and 538, mixers 539 and 540, and a surface acoustic wave filter 541.

In FIGS. 69 to 72, the RF unit includes a stack 500 of constituent layers 500a to 500i, electronic parts 561 formed and disposed thereon including capacitors, inductors, semiconductors and registers, conductor patterns 513, 515, 572 formed above, below and intermediate the constituent layers 500a to 500i, and an antenna pattern 573. As mentioned just above, the RF unit includes antennas, filters, inductors, capacitors, signal lines, and power supply lines to semiconductor devices. It is advantageous to form the respective constituent layers from materials selected appropriate for their function. The illustrated construction is exemplary and another construction is possible.

For the constituent layers 500a to 500d, 500g constructing the antenna, strip lines and wiring in this example, it is preferred to use a composite dielectric material having a dielectric constant adjusted for the operating frequency. For the constituent layers 500e to 500f constructing capacitors, it is preferred to use a composite dielectric material having a high dielectric constant of about 10 to 40. For the constituent layers 500h to 500i constructing the power supply line, it is preferred to use a composite magnetic material (in which coated magnetic metal particles are mixed and dispersed in a resin) having a magnetic permeability of about 3 to 20.

On the surface of constituent layers 500a to 500i, there are provided internal conductors 513, GND conductors 515, antenna conductors 573, and the like. Upper and lower internal conductors are connected by via holes 514. Electronic parts 561 are mounted on the surface, completing a RF unit.

With the above construction, each layer is formed of a material suited for a distinct function, arriving at a high performance, small size, and thin part.

Example 3-23

Figure 74:
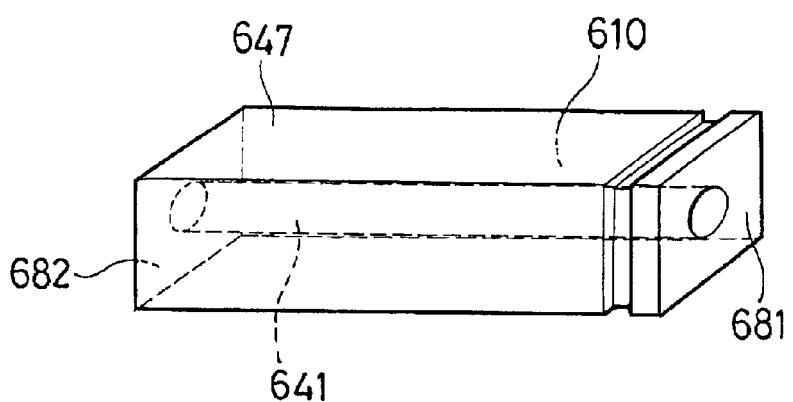
FIGS. 74 and 75 illustrate a resonator as one exemplary multilayer electronic part of the invention.
Figure 75:
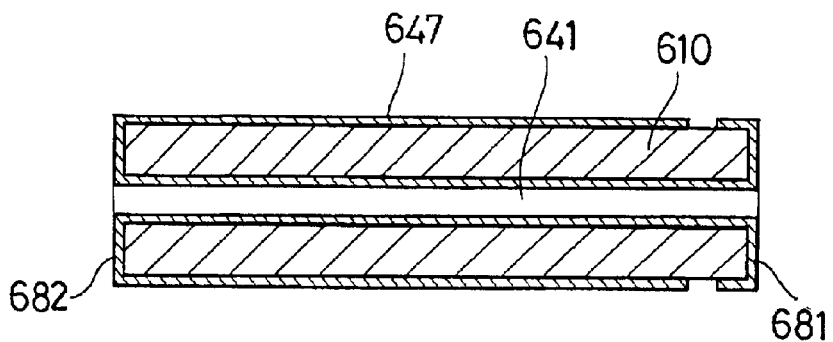

FIGS. 74 and 75 illustrate a resonator according to a further embodiment of the invention. FIG. 74 is a see-through perspective view, and FIG. 75 is a cross-sectional view. In FIGS. 74 and 75, the resonator includes a base body 610 of the inventive composite dielectric material and a coaxial conductor 641 in the form of a through hole formed in the base body. This resonator is formed by the same method as the block filter of Example 3-11. Specifically, on the base body 610 formed in a mold, a surface GND conductor 647, a coaxial conductor 641 connected to the surface GND conductor 647 through an edge electrode 682, and a resonator HOT terminal 681 connected to the coaxial conductor 641 are formed from copper, gold, palladium, platinum or aluminum by carrying out suitable treatments such as plating, etching, printing, sputtering and evaporation. The coaxial conductor 641 is a coaxial line having a specific impedance, and the surface GND conductor 647 is formed so as to surround it.

Example 3-24

Figure 76:
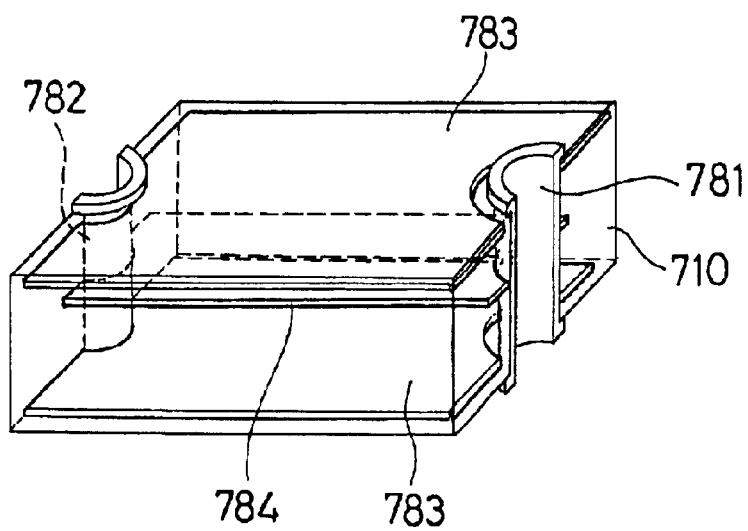
FIGS. 76 and 77 illustrate a strip resonator as another exemplary multilayer electronic part of the invention.
Figure 77:
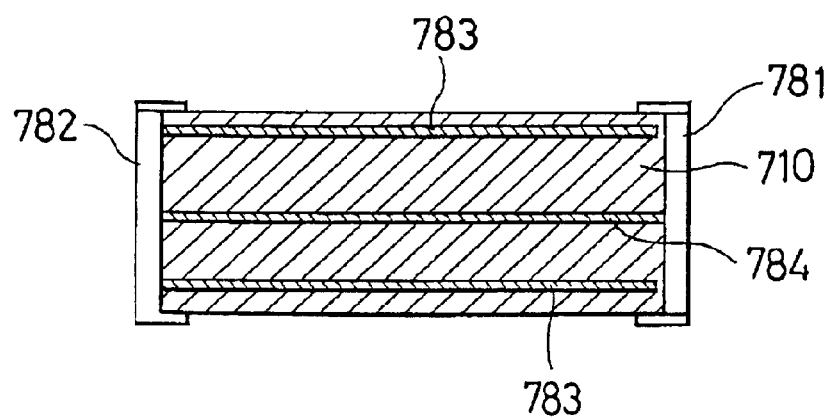

FIGS. 76 and 77 illustrate a strip resonator according to a further embodiment of the invention. FIG. 76 is a see-through perspective view, and FIG. 77 is a cross-sectional view. In FIGS. 76 and 77, the strip resonator includes an intermediate rectangular strip conductor 784, upper and lower rectangular GND conductors 783, and constituent layers (substrates) 710 of the composite dielectric material sandwiched therebetween. To the opposite ends of the strip conductor 784, a HOT terminal 781 and a GND terminal 782 for a resonator are formed and connected. The method of forming the remaining components is the same as in the inductor of Example 3-1.

Example 3-25

Figure 78:
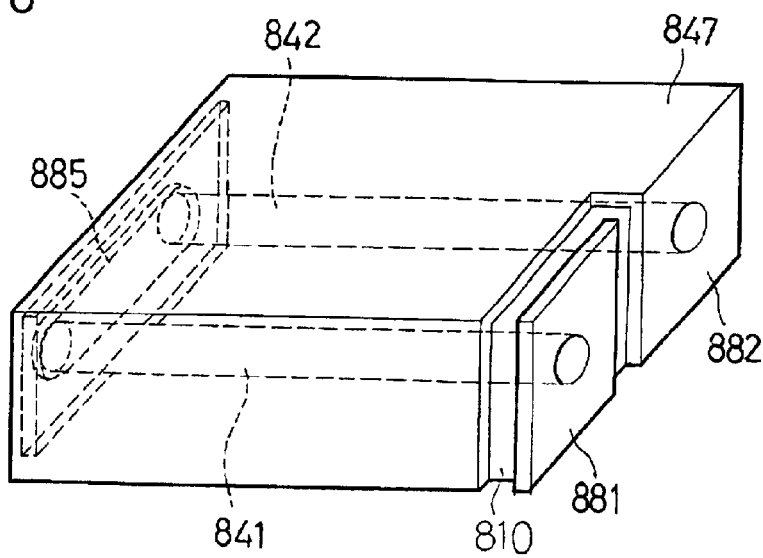
FIG. 78 is a see-through perspective view of a resonator as a further exemplary multilayer electronic part of the invention.

FIG. 78 is a see-through perspective view of a resonator according to a further embodiment of the invention. Like Example 3-23, the resonator shown in FIG. 78 includes a base body 810 and a pair of coaxial conductors 841, 842 in the form of through holes formed in the base body. Formed on the base body 810 are a surface GND conductor 847, a coaxial conductor 842 connected to the surface GND conductor 847 through an edge electrode 882, a coaxial conductor 841 connected to the coaxial conductor 842 through a connecting electrode 885, and a resonator HOT terminal 881 connected to the coaxial conductor 841. The coaxial conductors 841 and 842 each are a coaxial line having a specific impedance, and the surface GND conductor 847 is formed so as to surround them.

Example 3-26

Figure 79:
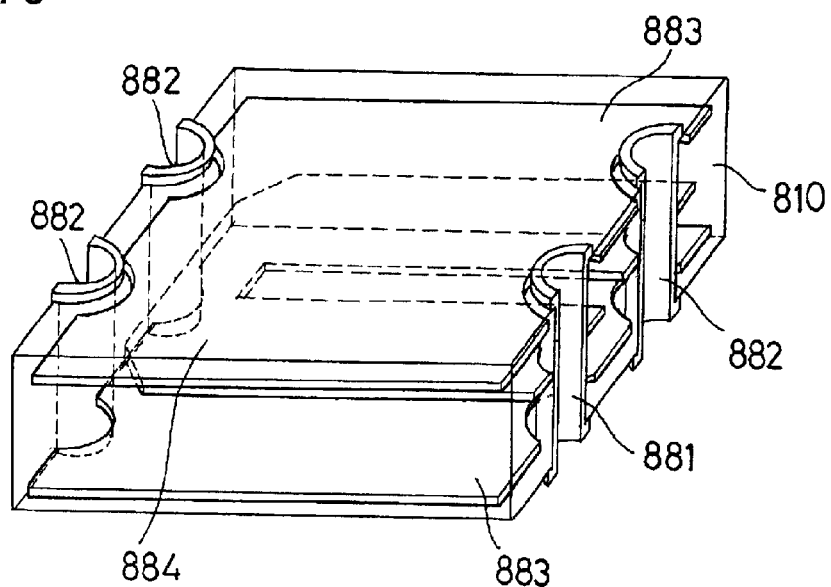
FIG. 79 is a see-through perspective view of a strip resonator as a further exemplary multilayer electronic part of the invention.
Figure 80:
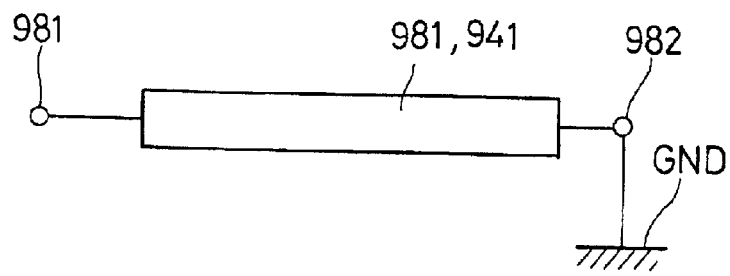
FIG. 80 is an equivalent circuit diagram of the resonator.

FIG. 79 is a see-through perspective view of a strip resonator according to a further embodiment of the invention. Like Example 3-24, the strip resonator in FIG. 79 includes a constituent layer 810 of the composite dielectric material. Example 3-26 differs from Example 3-24 in that the strip conductor 884 is folded. The strip conductor 884 is a strip line having a specific impedance as in the above example. Internal ground conductors 883 are formed so as to sandwich the strip conductor 884 therebetween. More illustratively, the strip conductor 884 is folded such that opposite ends thereof are connected to a HOT terminal 881 and a ground terminal 882 which are formed on one side of the substrate. This construction results in a resonator represented by the equivalent circuit diagram of FIG. 80. In FIG. 80, a HOT terminal 981 for the resonator is connected to one end of a resonator 984, 941 constructed by a coaxial path or strip line, and a GND terminal 982 is connected to the other end thereof. FIG. 80 is also an equivalent circuit diagram representing the resonators in the foregoing Examples 3-23 to 3-25.

With respect to the resonator, a dielectric constant as high as possible is desirable for size reduction purposes. Size reduction becomes possible by using the composite dielectric material of the invention in which generally spherical metal particles consisting essentially of single crystal grains having a mean particle size of 0.1 to 10 μm and surface coated with a dielectric layer are dispersed in a resin.

Besides, isolators and circulators can also be fabricated to a multilayer structure of small size. By combining two or more of the parts in the foregoing Examples, a higher degree of integration and a further reduced size become available. For example, such products as the front end module 533 including an antenna and the power amplifier module 529 including the isolator 527 shown in FIG. 73 can be fabricated to a higher degree of integration and a reduced size using the composite dielectric material or composite magnetic material of the invention.

In the foregoing Examples, a flame retardant may be added to the constituent layers. Exemplary flame retardants include halides such as halogenated phosphates and brominated epoxy resins, organic compounds such as phosphate amides, and inorganic substances such as antimony trioxide and aluminum hydride. Also in the foregoing Examples, the glass cloth is embedded in the constituent layers if desired. All the layers need not be made of the same material. Some or all of the layers may be made of different materials.

BENEFITS OF THE INVENTION

Since generally spherical metal particles of a small size coated with an insulating layer and having good dispersibility are dispersed in a resin, the resulting composite magnetic material is highly electrically insulating due to the particle surface coating, easy to work in its preparation, free of a corrosion problem, and has improved high-frequency characteristics and withstanding voltage. There are also provided a magnetic molding material, magnetic powder compression molding material, magnetic paint, prepreg, and magnetic substrate using the same.

Since the insulator-coated metal particles are effectively dispersible, there are provided a magnetic molding material, magnetic powder compression molding material, magnetic paint, prepreg, and magnetic substrate having a reduced eddy current loss and improved high-frequency characteristics.

Since a powder of metal particles coated with a dielectric layer is mixed and dispersed in a resin, the resulting composite dielectric material has a high dielectric constant even at a reduced content of dielectric and hence, a reduced material cost. There are also provided various materials as mentioned above and substrates using the same. Using the composite dielectric material in which particles are generally spherical and fine and hence effectively dispersible, there are obtained products having stable characteristics including a capacitance, insulation resistance and withstanding voltage.

Since the composite dielectric material is constructed by coating generally spherical metal particles having a mean particle size of 0.1 to 10 μm over a part or all of their surface with a dielectric layer or insulating layer and dispersing the coated particles of at least one type in a resin according to the invention, there are provided electronic parts featuring a small size, good processability, a low specific gravity, and flexibility. The coating of metal particle surface with the insulating layer provides a high insulation resistance and withstanding voltage.

Where a magnetic material is constructed by coating magnetic metal particles on their surface with an insulating layer, there are obtained electronic parts having improved high-frequency characteristics over magnetic materials having metal particles mixed and dispersed in a resin.

A structure of multiple layers of different materials is more flexible than ceramics and unsusceptible to crack, peel and warp problems, ensuring fabrication of a high-performance inductor.

Since firing and thick-film printing steps are eliminated, the preparation process is easy and a line design unsusceptible to failure becomes possible. The embedment of glass cloth in the substrate provides electronic parts with a high strength. The addition of a flame retardant provides electronic parts with flame retardance.

Japanese Patent Application Nos. 2000-128283, 2000-128291 and 2000-158062 are incorporated herein by reference.

What is claimed is:

1. A composite magnetic material comprising:
    a resin; and
    generally spherical magnetic metal particles of at least one type dispersed in the resin and consisting essentially of single crystal grains, the metal particles having a mean particle size of 0.1 to 10 μm and each having an insulating coating layer at least partially coated thereon.

2. The composite magnetic material of claim 1 wherein said insulating coating layer has a thickness of 0.005 to 5 μm.

3. The composite magnetic material of claim 1 wherein 30 to 98% by weight of said coated metal particles are dispersed in said resin.

4. A magnetic molding material comprising the composite magnetic material of claim 1.

5. A magnetic powder compression molding material comprising the composite magnetic material of claim 1 wherein 90 to 98% by weight of said coated metal particles are dispersed in said resin.

6. A magnetic paint comprising the composite magnetic material of claim 1.

7. A prepreg comprising the composite magnetic material of claim 1.

8. A prepreg comprising the composite magnetic material of claim 1 and a glass cloth embedded therein.

9. The prepreg of claim 7 further comprising a copper foil clad thereto.

10. A magnetic substrate comprising the composite magnetic material of claim 1 or the prepreg of claim 7.

11. The magnetic substrate of claim 10 further comprising a copper foil clad thereto.

12. A composite dielectric material comprising:
    a resin; and
    generally spherical metal particles of at least one type dispersed in the resin and having a mean particle size of 0.1 to 10 μm, the metal particles each having a dielectric coating layer at least partially coated thereon.

13. The composite dielectric material of claim 12 wherein said dielectric coating layer has a thickness of 0.005 to 5 μm.

14. The composite dielectric material of claim 12 wherein said dielectric layer is formed of an oxide dielectric material having a higher dielectric constant than said resin.

15. The composite dielectric material of claim 12 wherein said metal particles are formed of at least one metal selected from the group consisting of silver, gold, platinum, palladium, copper, nickel, iron, aluminum, molybdenum, tungsten, and alloys and mixtures thereof.

16. The composite dielectric material of claim 12 wherein said dielectric coating layer is formed of an oxide dielectric material having a higher dielectric constant than said resin.

17. A molding material comprising the composite dielectric material of claim 12.

18. A powder compression molding material comprising the composite dielectric material of claim 12 wherein 90 to 98% by weight of said coated metal particles are dispersed in said resin.

19. A paint comprising the composite dielectric material of claim 12.

20. A prepreg comprising the composite dielectric material of claim 12.

21. A prepreg comprising the composite dielectric material of claim 12 and a glass cloth embedded therein.

22. The prepreg of claim 20 further comprising a copper foil clad thereto.

23. A substrate comprising the material of claim 12.

24. The substrate of claim 23 further comprising a copper foil clad thereto.

25. An electronic part comprising a composite dielectric material comprising a resin and generally spherical metal particles of at least one type dispersed in the resin and having a mean particle size of 0.1 to 10 μm, the metal particle each having a dielectric coating layer at least partially coated thereon.

26. The electronic part of claim 25 wherein said dielectric coating layer has a thickness of 0.005 to 2 μm.

27. An electronic part comprising a composite material comprising a resin and generally spherical metal particles of at least one type dispersed in the resin and consisting essentially of single crystal grains, the metal particles having a mean particle size of 0.1 to 10 μm and each having an insulating coating layer at least partially coated thereon.

28. An electronic part comprising a composite material comprising a resin and generally spherical magnetic metal particles of at least one type dispersed in the resin and consisting essentially of single crystal grains, the metal particles having a mean particle size of 0.1 to 10 μm and each having an insulating coating layer at least partially coated thereon.

29. The electronic part of claim 27 wherein said insulating coating layer has a thickness of 0.005 to 2 μm.

30. The electronic part of claim 25 comprising said composite dielectric material, said composite material or a combination of said composite dielectric material with said composite material.

31. The electronic part of claim 25 wherein said composite dielectric material or said composite material includes at least one layer having a glass cloth embedded in a resin.

* * * * *